United States Patent
Fujishima et al.

(10) Patent No.: US 8,435,867 B2
(45) Date of Patent: May 7, 2013

(54) METHOD OF MANUFACTURING SEMICONDUCTOR DEVICE AND METHOD OF MANUFACTURING ELECTRONIC DEVICE

(75) Inventors: Atsushi Fujishima, Kanagawa (JP); Haruhiko Harada, Nanae (JP)

(73) Assignee: Renesas Electronics Corporation, Kanagawa (JP)

( * ) Notice: Subject to any disclaimer, the term of this patent is extended or adjusted under 35 U.S.C. 154(b) by 80 days.

(21) Appl. No.: 12/888,538

(22) Filed: Sep. 23, 2010

(65) Prior Publication Data

US 2011/0097854 A1 Apr. 28, 2011

(30) Foreign Application Priority Data

Oct. 22, 2009 (JP) ................... 2009-243258

(51) Int. Cl.
*H01L 21/00* (2006.01)
(52) U.S. Cl.
USPC ........... 438/461; 438/111; 438/112; 438/123; 438/124; 257/E21.599
(58) Field of Classification Search .................. 438/111, 438/112, 123, 124, 461; 257/E21.599
See application file for complete search history.

(56) References Cited

U.S. PATENT DOCUMENTS

| | | | | |
|---|---|---|---|---|
| 5,274,914 A | * | 1/1994 | Kitamura et al. | 29/841 |
| 5,939,774 A | * | 8/1999 | Yamada | 257/666 |
| 5,989,474 A | * | 11/1999 | Suzuki | 264/400 |
| 7,176,557 B2 | * | 2/2007 | Shimanuki et al. | 257/670 |
| 2001/0012681 A1 | * | 8/2001 | Wensel | 438/584 |
| 2002/0088845 A1 | * | 7/2002 | Tanaka et al. | 228/254 |
| 2008/0087996 A1 | * | 4/2008 | Miyaki et al. | 257/677 |
| 2008/0105959 A1 | * | 5/2008 | Tanaka | 257/676 |
| 2010/0308448 A1 | * | 12/2010 | Murakami | 257/676 |
| 2011/0198739 A1 | * | 8/2011 | Amanai et al. | 257/667 |

FOREIGN PATENT DOCUMENTS

| | | | | |
|---|---|---|---|---|
| JP | 02143552 A | * | 6/1990 | |
| JP | 4-157761 A | | 5/1992 | |
| JP | 04157761 A | * | 5/1992 | |
| JP | 7-142664 A | | 6/1995 | |
| JP | 08046127 A | * | 2/1996 | |
| JP | 08195460 A | * | 7/1996 | |
| JP | 09314371 A | * | 12/1997 | |
| JP | 2001-103510 A | | 4/2001 | |

* cited by examiner

*Primary Examiner* — Jarrett Stark
(74) *Attorney, Agent, or Firm* — Mattingly & Malur, PC

(57) ABSTRACT

Foreign matter formed over (or adhered to) a surface of a lead is reliably removed. A laser beam is applied to a residual resin (sealing body) which is formed in (or adhered to) a region surrounded by a sealing body (a first sealing body), a lead exposed (projected) from the sealing body, and a dam bar. The foreign matter formed over (or adhered to) the surface of the lead can be reliably removed by washing the surface of the lead after the removal of the residual resin. Thus, in a subsequent plating step, the reliability (wettability, adhesion with the lead) of a plating film to be formed over the surface of the lead can be improved.

20 Claims, 44 Drawing Sheets

METHOD OF MANUFACTURING SEMICONDUCTOR DEVICE AND METHOD OF MANUFACTURING ELECTRONIC DEVICE

CROSS-REFERENCE TO RELATED APPLICATIONS

The disclosure of Japanese Patent Application No. 2009-243258 filed on Oct. 22, 2009 including the specification, drawings and abstract is incorporated herein by reference in its entirety.

BACKGROUND OF THE INVENTION

The present invention relates to a technique which is effectively applicable to a resin removing technique in a method of manufacturing a semiconductor device (or a semiconductor integrated circuit device).

Japanese Unexamined Patent Publication No. Hei 4 (1992)-157761 (Patent Document 1) discloses a conventional tie bar cutting method in which, with use of a punch set inside a press metal mold and a die precisely fitted therein, there is achieved simultaneous piercing of leads of a lead frame 2 exposed from the mold resin, a resin dam part produced between the leads, and a tie bar part. Moreover, Japanese Unexamined Patent Publication No. Hei 4 (1992)-157761 discloses a method in which the resin dam part is irradiated with a laser beam, the resin of the dam part is melted with the heat caused thereby to be removed and, then, the tie bar part is cut and removed with use of the punch.

Japanese Unexamined Patent Publication No. Hei 7 (1995)-142664 (Patent Document 2) discloses, as one example of a conventional method for manufacturing a resin-sealed semiconductor device, a technique as follows. That is, according to the above technique, a lead frame which has a tie bar is used. A dam resin, which is formed between external leads arranged from the resin seal part to the tie bar and which is almost as thick as the external lead is cut and removed by a metal mold. Moreover, the dam resin is cut and removed by independent use of a honing method of spraying the powder of resin or glass together with high-pressure air and high-pressure water and a method of spraying high-pressure water after electrolytic degreasing, etc. Still further, the dam resin 4 is cut and removed by combining the above methods with the removal using a metal mold. Still further, Japanese Unexamined Patent Publication No. Hei 7 (1995)-142664 discloses a technique in which, after the dam resin is cut and removed, an external lead (a lead exposed from a sealing body) is cut and formed into a predetermined shape.

[Patent Document 1] Japanese Unexamined Patent Publication No. Hei 4 (1992)-157761
[Patent Document 2] Japanese Unexamined Patent Publication No. Hei 7 (1995)-142664

SUMMARY OF THE INVENTION

According to a manufacturing method of a semiconductor device (or a semiconductor integrated circuit device) using a lead frame, in a step where a sealing body with which a mounted semiconductor chip is sealed (mold process), in order to keep a supplied resin from leaking to the outside of a device region of the lead frame, as shown in Patent Documents 1 and 2, the lead frame in which a dam bar (tie bar, dam part) is formed is often used.

Therefore, after the mold step, as shown in FIGS. 1(*a*) and 3(*a*) of Patent Document 1 (or FIGS. 1(*a*) and 2(*a*) of Patent Document 2), there is not only formed a sealing body (resin for sealing chips) for sealing a semiconductor chip but also a sealing body (resin in the dam, resin between the leads) in a region located around the sealing body and surrounded by leads exposed (projected) from a side surface of the sealing body and a dam bar.

When the resin in the dam is formed, in a subsequent plating step, a plating film (plating layer) which is for sheath plating is not formed over part of the lead exposed from the sealing body (portion to which the resin in the dam has adhered).

Having made studies on the method to remove the resin in the dam, the present inventors found out that the following problems are caused by the methods of Patent Documents 1 and 2.

To be specific, first, when the resin in the dam is cut by a cutter (punch) alone, in order that the cutter may not come in contact with leads exposed from the sealing body, a cutter whose width is smaller than a width (spacing) between the leads is used.

Therefore, as shown in FIG. 3(*c*) of Patent Document 1, part of the resin in the dam (residual resin, residue) remains over a side surface of the lead exposed (projected) from the sealing body.

Accordingly, in order to remove the residual resin, the present inventors applied a washing step as in Patent Document 2 (the honing method, a method of spraying high-pressure water after electrolytic degreasing, etc.).

However, the residual resin is in contact with the lead exposed from the sealing body and part of the tie bar which has been cut. Therefore, its adhesive power with the lead is strong, and it cannot be easily removed. In addition, if the pressure in the washing step is raised, the lead may be deformed due to water pressure. Therefore, it was found out that it was difficult to remove the residual resin by combination with the washing step alone.

Accordingly, as shown in embodiments of Patent Documents and 2, the present inventors studied about removing the resin in the dam (or residual resin) using a laser beam.

As a result, it became possible to remove the resin in the dam (or residual resin) without deforming the lead. However, the following problems newly occurred.

That is, it was found out that when the resin in the dam was removed using the laser (laser beam), the resin became foreign matter, dispersed around, and adhered to the surface of the lead exposed from the sealing body. In addition, the foreign matter is a minute object like soot. Therefore, even if the laser beam, which is used for removing the resin in the dam, is irradiated to the surface of the lead, it is difficult to remove the foreign matter. Also, there is a possibility that it may get burned over the surface of the lead.

As a result, in a subsequent plating step, there is a possibility that the reliability (wettability, adhesion to the lead) of the plating film formed over the surface of the lead may fall. Therefore, it is required to reliably remove the foreign matter formed over (or adhered to) the surface of the lead.

Therefore, an object of the present invention is to provide a technique which can reduce the amount (scattering amount) of the foreign matter (soot) generated in the laser irradiation step.

Another object of the present invention is to provide a technique which can reliably remove the foreign matter formed over (or adhered to) the surface of the lead.

Still another object of the present invention is to provide a technique which can improve the reliability of a semiconductor device.

The above-described and other objects, and novel features of the present invention will be apparent from the description herein and the accompanying drawings.

Typical aspects of the invention disclosed in the present application will be outlined briefly.

That is, according to the manufacturing method of a semiconductor device of the present invention, part of the dam bar and part of the sealing body are removed in the dam bar cutting step. Then, a laser beam is irradiated to the other part of the sealing body.

Advantageous effects of the typical aspect of the invention disclosed in the present application will be briefly described in the following:

That is, according to one aspect of the present invention, the amount (scattering amount) of the foreign matter (soot) generated in a laser irradiation step can be reduced.

Figure 1:
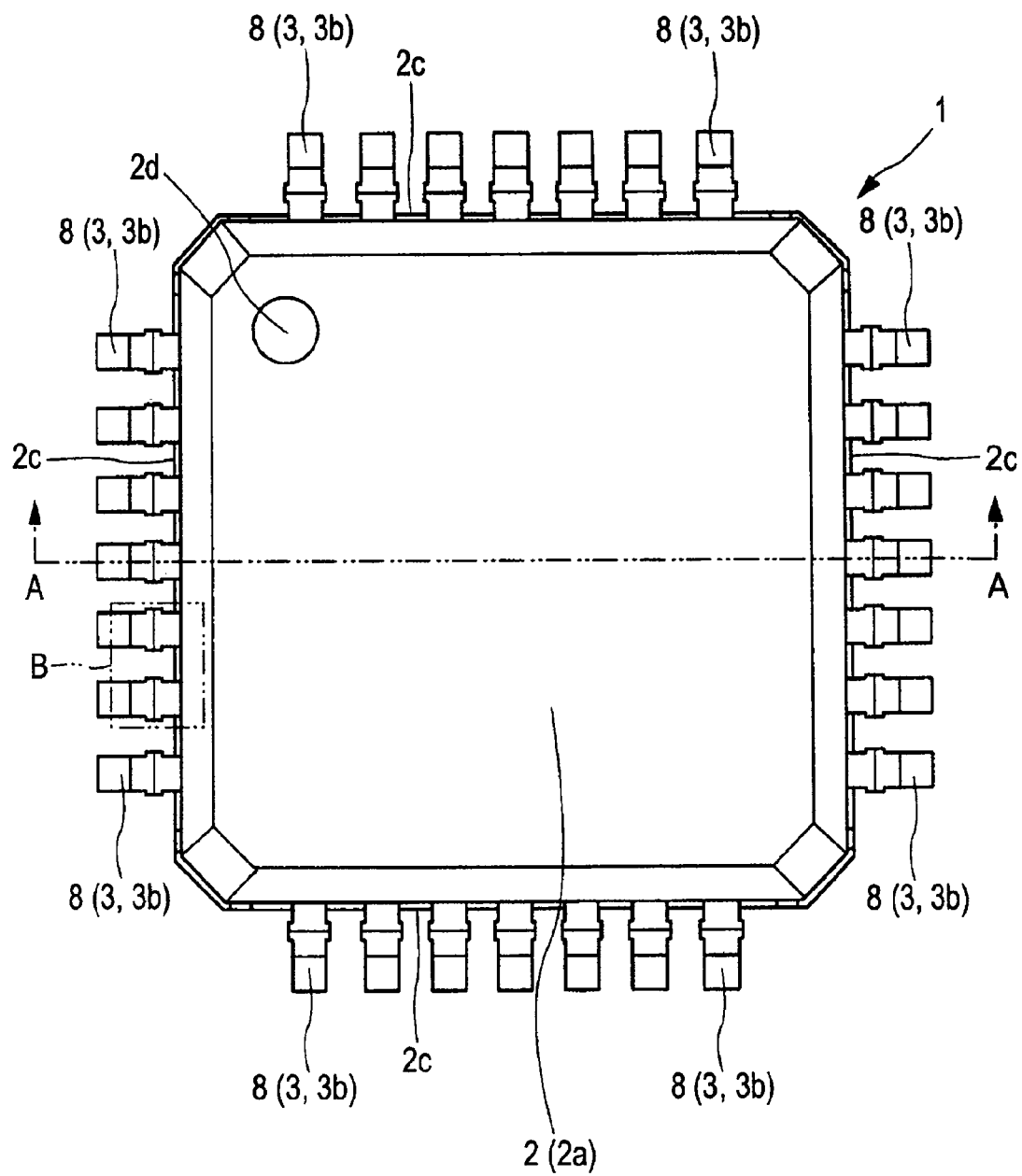
FIG. 1 is a top view of a semiconductor device according to the present embodiment.

DESCRIPTION OF THE PREFERRED EMBODIMENTS (Explanation of the Description Manner, Basic Terms, and Format in the Present Application)

1. In the present application, for the sake of convenience, any embodiment may be divided into plural sections as the case may be, so as to be described in accordance with the sections. However, these are not independent of each other; thus, these may be individual sections of a single example, or one thereof may be details of a part of the other(s) or may be a modification of a part or the whole of the other(s) except any case where it is evidently stated that such a matter is not applicable to the case. In principle, about the same members or portions, repeated description is omitted. Each of the elements in any embodiment is not essential except in any case where it is evidently stated that this matter is not applicable to the case, any case to which this matter is theoretically not applicable, and any case to which this matter is clearly interpreted not to be applicable from the context.

In the present application, the term "semiconductor device" mainly means various kinds of transistors (active elements), and those prepared by integrating resistors, capacitors, etc. over a semiconductor chip, etc. (for example, a single crystal silicon substrate). As a typical example of various transistors, a MISFET (Metal Insulator Semiconductor Field Effect Transistor) represented by a MOSFET (Metal Oxide Semiconductor Field Effect Transistor) can be given. In this regard, as a typical example of an integrated circuit configuration, a CMIS (Complementary Metal Insulator Semiconductor) type integrated circuit represented by a CMOS (Complementary Metal Oxide Semiconductor) type integrated circuit made by combining an N-channel type MISFET and a P-channel type MISFET can be given.

Today, a wafer process of a semiconductor device, i.e., LSI (Large Scale Integration) is roughly divided into an FEOL (Front End of Line) process and a BEOL (Back End of Line) process. The FEOL process is generally the one from carrying in a silicon wafer as a raw material to around a pre-metal process (a process comprising: formation of an interlayer insulation film, etc. between a lower end of an M1 wiring layer and a gate electrode configuration; formation of a contact hole; and embedding a tungsten plug, etc.). The BEOL process is the one starting from forming the M1 wiring layer to around forming a pad aperture in a final passivation film over an aluminum pad electrode (in a wafer level package process, such a process is included).

In addition, the term "semiconductor device" used herein also means those devices including single electronic devices such as a power transistor.

2. Similarly, in connection with any material, any composition or the like in the description of embodiments and others, in the case of using the wording "X including A" or the like, a matter that an element other than A is contained as a principal element is not excluded except any case where it is evidently stated that this matter is not applicable to the case and any case to which this matter is clearly interpreted not to be applicable from the context in the same manner as described above. For example, the wording "X including A" means that "X contains A as a principal component." It is needless to say that, for example, the wording "silicon member" is not limited to a member comprised of pure silicon, and includes, in the category thereof, a member containing SiGe alloy or some other multicomponent alloy containing silicon as a principal component, and a member containing other additives.

3. In the same manner, about some figures, positions, attributes, and others, preferred examples will be described. However, it is needless to say that the figures and so on are not strictly limited to the preferred examples except in any case where it is evidently stated that this matter is not applicable to the case, and any case to which this matter is clearly interpreted not to be applicable from the context.

4. Similarly, for convenience, a plurality of inventions will be described below in a series of embodiments, and it is apparent that each step is not indispensable for all the inventions except for the particular cases.

5. When a specific numeric value or quantity is referred to, numerical values or quantities over or below the numerical value or quantity are allowable except in any case where it is evidently stated that this matter is not applicable to the case and any case to which this matter is clearly interpreted not to be applicable from the context.

The embodiments of the present invention will be described more specifically. In all of the drawings, members having like functions will be identified by like reference characters or numerals, and overlapping descriptions thereof will be basically omitted.

Moreover, in the accompanying drawings, when becoming rather complicated or when distinction with a spacing is clear, even in a cross-sectional view, hatching, etc. may be omitted. In this connection, the outline of a background may be omitted even in a case of a closed hole in a plane when being clear from an explanation, etc. Furthermore, even not in the case of a cross-sectional view, hatching may be used to indicate that a particular portion is not a space.

The present embodiment is applied to a QFP (Quad Flat Package) type semiconductor device. FIG. 1 is a top view of the QFP, FIG. 2 is a cross-sectional view taken along line A-A in FIG. 1, and FIG. 3 is an enlarged plan view of a B portion in FIG. 1.

<Semiconductor Device> First, with Reference to FIGS. 1 to 3, a configuration of a semiconductor device 1 of the present embodiment will be explained.

A plane shape of a sealing body (sealing resin) 2 is rectangular. According to the present embodiment, as shown in FIG. 1, it is substantially quadrangular. To be specific, each corner is chamfered and, thereby, the sealing member is prevented from being notched. Moreover, as shown in FIG. 2, the sealing member 2 has an upper surface (surface) 2a, a lower surface (rear surface, mounting surface) 2b opposed to the upper surface 2a, and a side surface 2c located between the upper surface 2a and the lower surface 2b.

Figure 2:
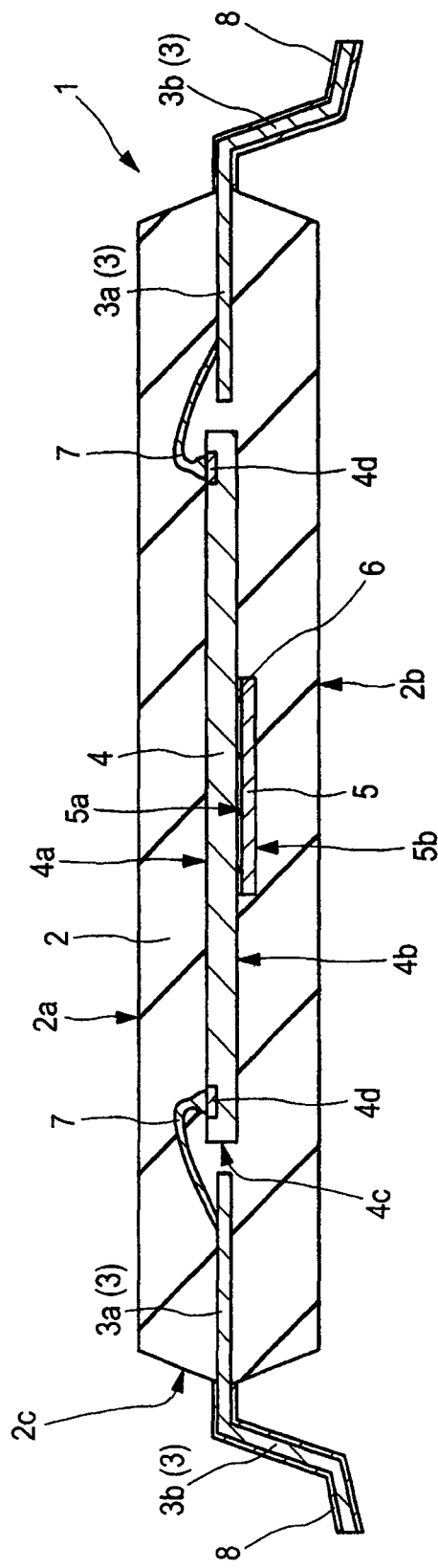
FIG. 2 is a cross-sectional view taken along line A-A in FIG. 1.
Figure 3:
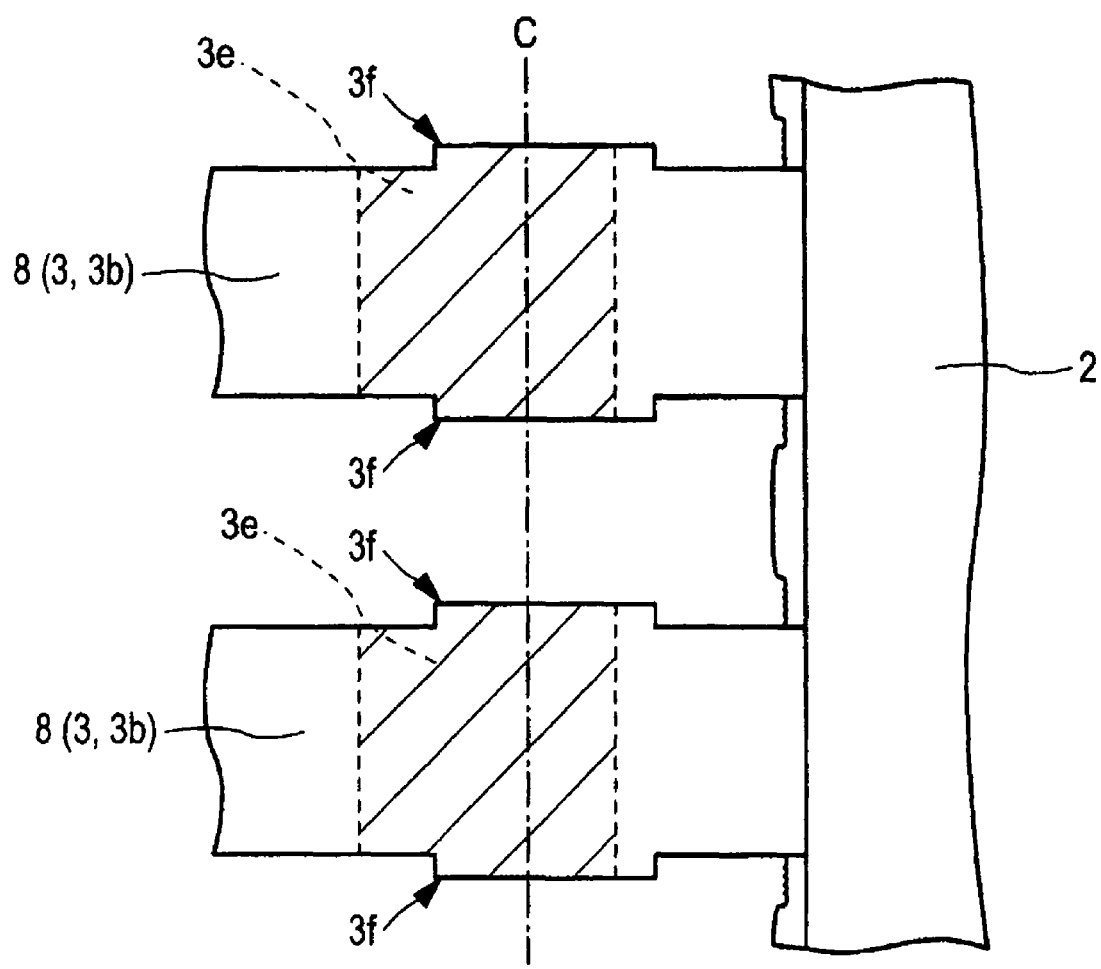
FIG. 3 is an enlarged plan view of a B portion in FIG. 1.

As shown in FIGS. 1 and 2, as external terminals, a plurality of leads 3 are exposed from side surfaces 2c (sides in FIG. 1) of the sealing body 2. To be specific, part (outer lead 3b) of each of the leads 3 formed along each side of the sealing body 2 is, as shown in FIGS. 1 and 2, projected toward the outside from the side surface 2c (side) of the sealing body 2. Further, on the outside of the sealing body 2, it is bent from the side of the upper surface 2a of the sealing body 2 toward the side of the lower surface 2b.

Moreover, as shown in FIG. 1, over the upper surface 2a of the sealing body 2, in order to identify a first lead 3 of the leads 3, a mark (alignment mark, position identifying mark) 2d is formed.

Moreover, as shown in FIG. 2, a semiconductor chip 4 is arranged inside the sealing body 2. The semiconductor chip 4 is mounted, via a die bond material (bonding material) 6, over an upper surface (main surface, surface) 5a of a chip mounting part (die pad, tab) 5 similarly arranged inside the sealing body 2.

Further, a plurality of electrode pads (bonding pads) 4d formed over the main surface (surface) 4a of the semiconductor chip 4 are each electrically coupled, through a plurality of conductive members 7, with a plurality of leads 3 (the other parts of the leads, inner leads 3a) located inside the sealing body 2, respectively. In addition, the conductive member 7 of the present embodiment is a wire containing gold (Au). Moreover, since the conductive members 7 are also sealed with the sealing body 2, the fall in the reliability of the semiconductor device can be suppressed. Furthermore, as shown in FIG. 2, a plating film 8 is formed over the surface of the lead 3 exposed from the sealing body 2.

Moreover, as shown in FIG. 3, each of the leads 3 located outside the sealing body 2 has a projection 3f formed over a side surface (long side of the lead 3 in FIG. 3) of the lead 3. Since the projection 3f is a residual dam bar formed by cutting the dam bar (tie bar, dam part) formed in the lead frame, the projection (residual dam bar) 3f formed over each of the leads 3 is formed so that it may oppose the projection 3f formed over an adjacent lead 3. In other words, the projections 3f are formed over a virtual line C along the direction (lead arrangement line) in which a plurality of leads 3 are arranged.

Moreover, as described above, each of the leads 3 is bent on the outside of the sealing body 2 (to be specific, inside the region 3e where a bent portion is formed to which hatching is applied in FIG. 3). However, according to the present embodiment, as shown in FIG. 3, it is bent with the projection 3f as a bending point. In this regard, in the bending step, stress (bending stress) is concentrated on a portion serving as the bending point. However, according to the present embodiment, concerning the lead 3 exposed from the sealing body 2, the lead 3 is bent with the projection 3f being the portion with the largest width as a bending point. Therefore, the shape of the lead 3 to be formed can be stabilized (made even) easily.

<Semiconductor chip> Next, with reference to FIGS. 4 to 6, a semiconductor chip 4 to be mounted inside the semiconductor device 1 will be explained.

A plane shape of the semiconductor chip 4 is rectangular. According to the present embodiment, as shown in FIG. 4, it is quadrangular. Moreover, as shown in FIG. 5, the semiconductor chip 4 comprises: a main surface (surface) 4a; a rear surface 4b on the other side of the main surface 4a; and a side surface 4c located between the main surface 4a and the rear surface 4b.

Figure 4:
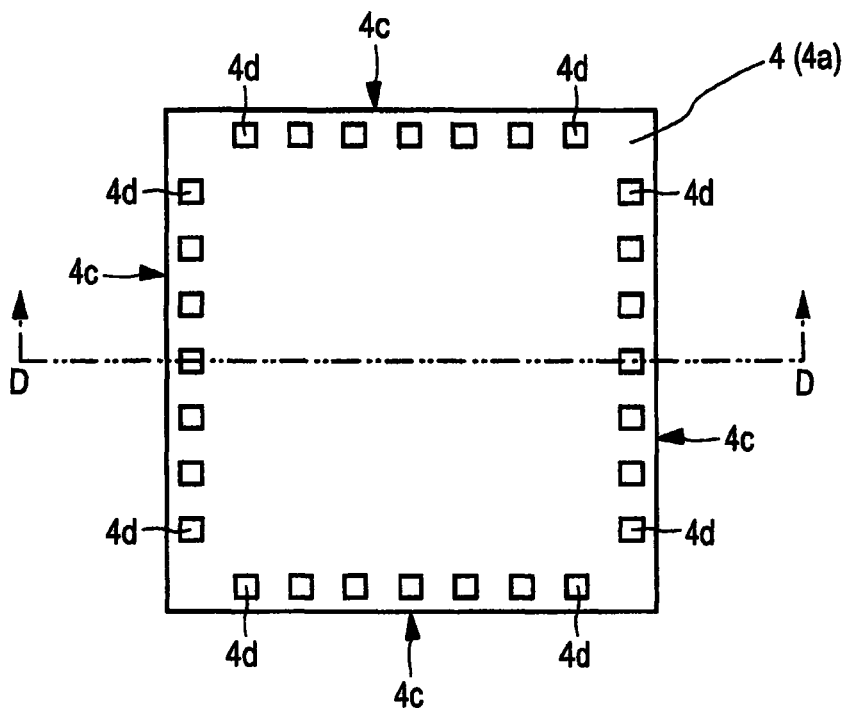
FIG. 4 is a main view of a semiconductor chip according to the present embodiment.
Figure 5:
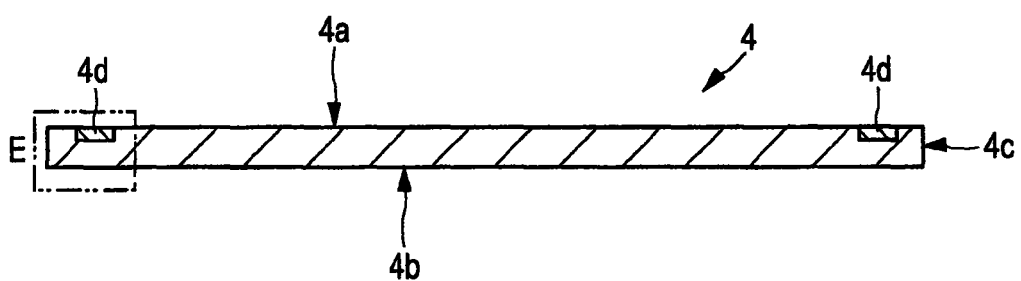
FIG. 5 is a cross-sectional view taken along line D-D in FIG. 4.

As shown in FIGS. 4 and 5, a plurality of electrode pads (bonding pads) 4d are formed over the main surface 4a of the semiconductor chip 4. According to the present embodiment, the electrode pads 4d are formed along each side of the main surface 4a.

Figure 6:
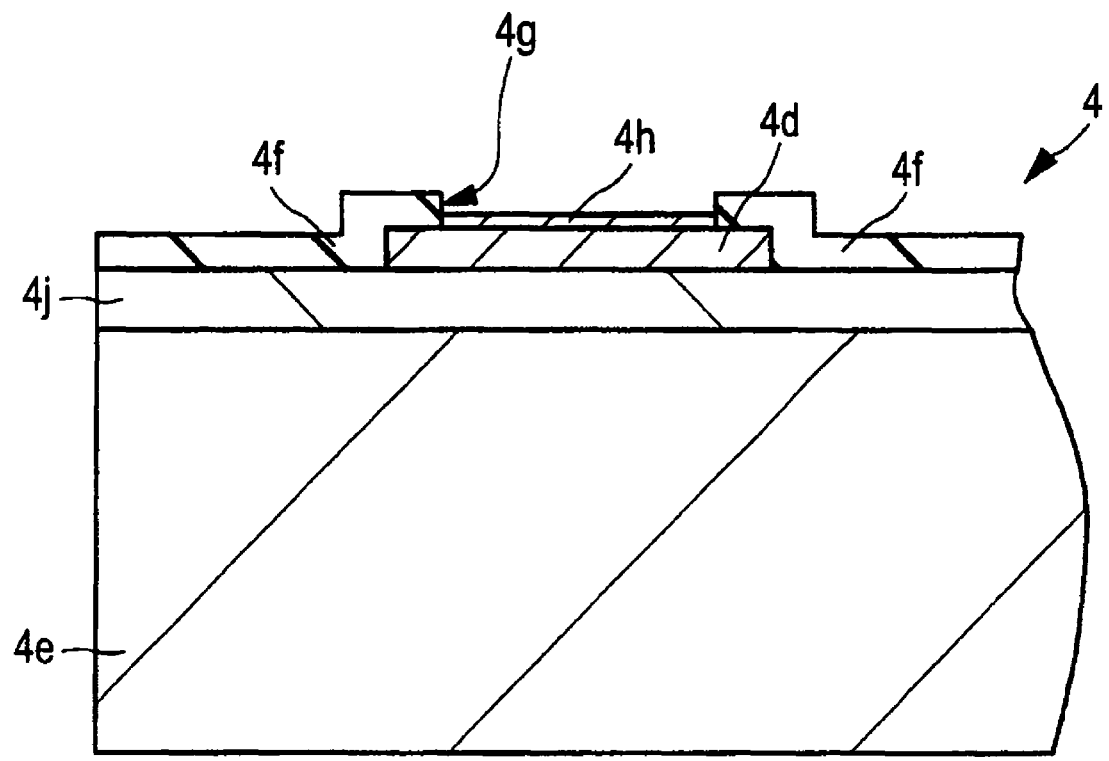
FIG. 6 is an enlarged plan view of an E portion in FIG. 5.

Moreover, though not shown, a semiconductor element (circuit element) is formed over the main surface 4a of the semiconductor chip 4 (to be specific, the main surface 4a of the substrate layer 4e shown in FIG. 6). The electrode pads 4d are electrically coupled with the semiconductor element through a wiring (not shown) formed in a wiring layer 4j arranged inside the semiconductor chip 4 (to be specific, over the main surface of the substrate layer 4e shown in FIG. 6).

Further, the substrate layer 4e of the semiconductor chip 4 comprises silicon (Si), for example. Also, as shown in FIG. 6, an insulation film 4f is formed over the main surface 4a. Each surface of the electrode pads 4d is exposed from an opening 4g formed in the insulation film 4f.

Moreover, the electrode pad 4d contains metal. According to the present embodiment, it contains aluminum (Al), for example. As shown in FIG. 6, a plating film 4h is formed over a surface of the electrode pad 4d. According to the present embodiment, it has, for example, a multilayer configuration in which a gold (Au) film is formed over a nickel (Ni) film.

In addition, since the nickel film is formed over the surface of the electrode pad 4d, corrosion (contamination) of the electrode pad 4d can be suppressed. Moreover, in the present embodiment, a thickness of the semiconductor chip 4 (spacing between the main surface 4a and the rear surface of the semiconductor chip 4) is 280 μm. As a method for forming the plating film 4h in the present embodiment, an electrolytic plating method is used. A chemical plating method may also be used. However, considering the quality of the film, it is preferable that the plating film 4h is formed by using the electrolytic plating method.

Figure 7:
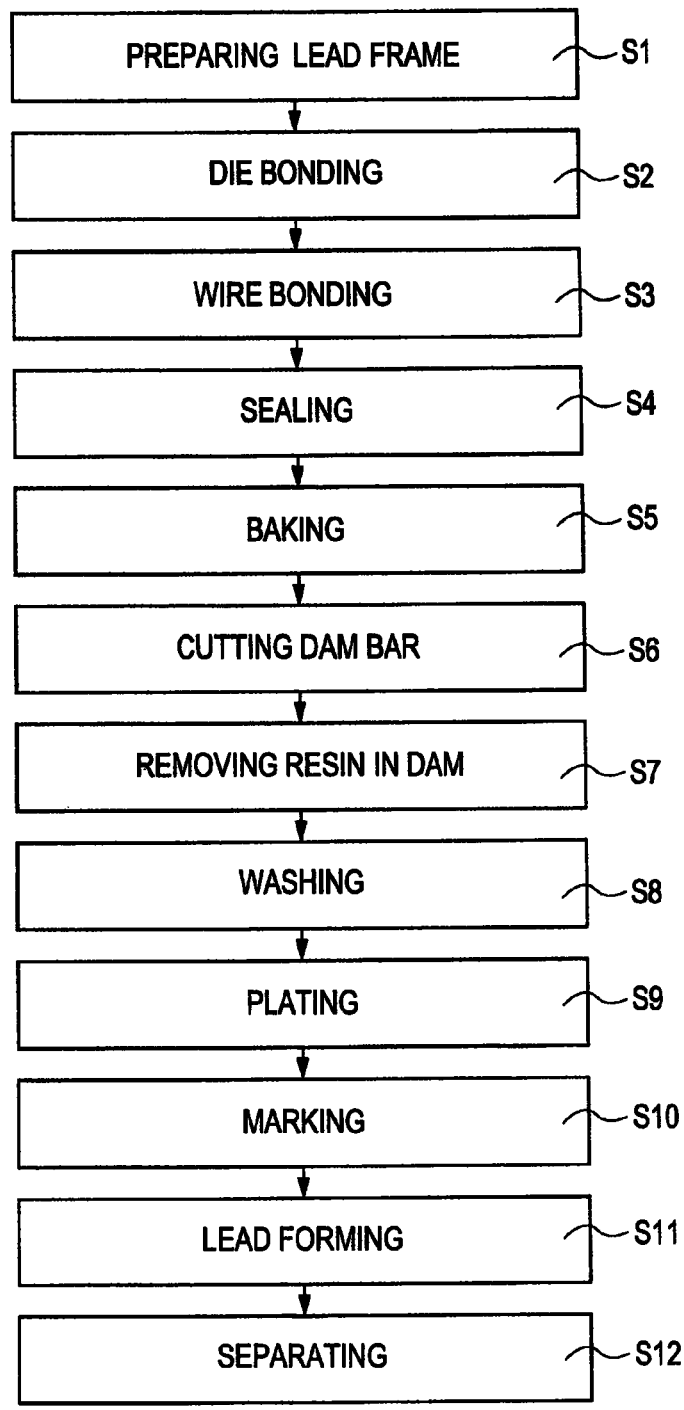
FIG. 7 is an explanatory view showing a flow in assembling of the semiconductor device according to the present embodiment.

<Manufacturing steps of semiconductor device> Next, according to the present embodiment, the manufacturing steps of a semiconductor device 1 will be explained. The semiconductor device 1 of the present embodiment is manufactured according to an assembly flow shown in FIG. 7. With reference to FIGS. 8 to 37, details of each step will be explained below.

Figure 8:
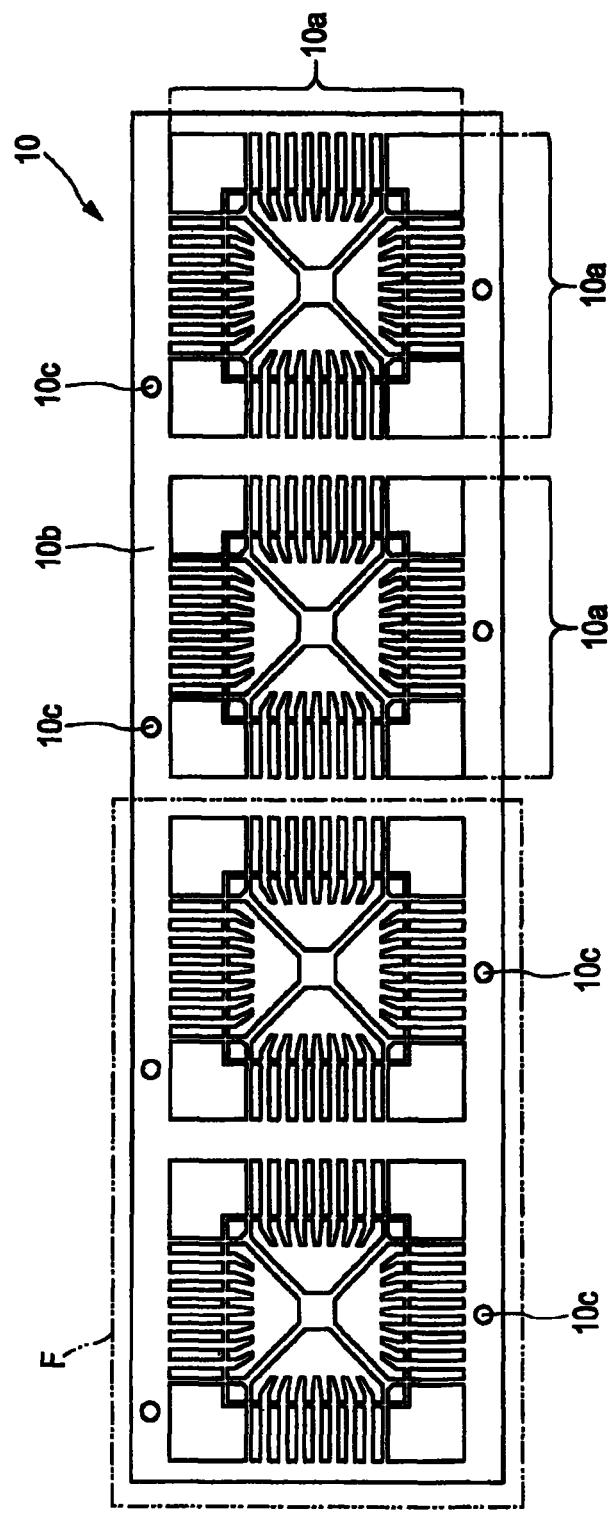
FIG. 8 is a plan view showing a lead frame of the present embodiment.

1. Step for preparing lead frame. First, as a lead frame preparation step S1 shown in FIG. 7, a lead frame 10 shown in FIG. 8 is prepared. In the lead frame 10 to be used in the present embodiment, there are formed, inside the frame body (frame part) 10b, a plurality of device regions 10a. According to the present embodiment, there are provided four device regions 10a. In addition, in the frame body 10b, there are formed feeding holes (sprocket holes) 10c for delivering the lead frame 10.

Figure 9:
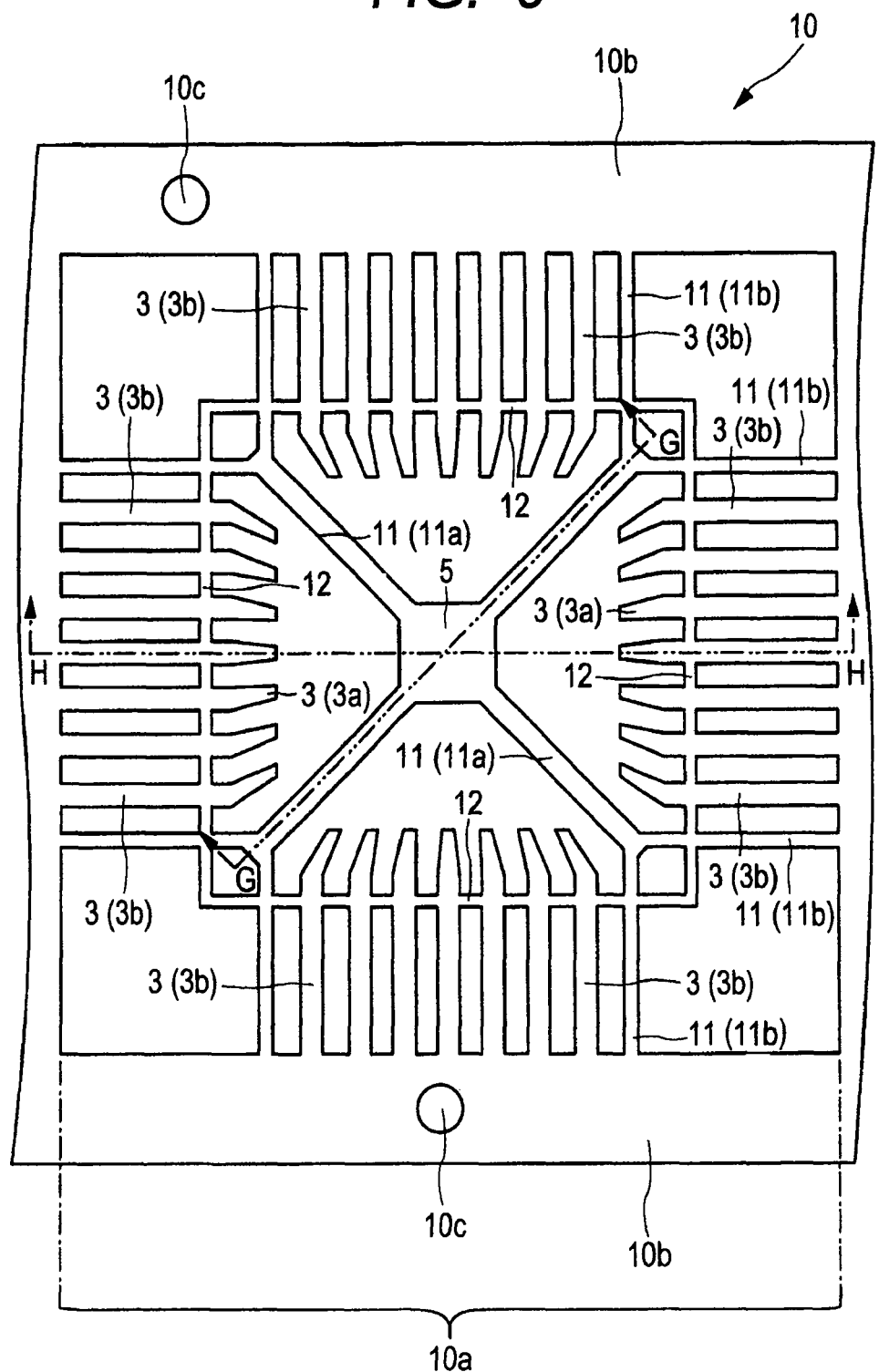
FIG. 9 is a partially enlarged plan view of an F portion in FIG. 8.

Moreover, as shown in FIG. 9 which is a partially enlarged view of FIG. 8, each device region 10a has a chip mounting part (die pad, tab) 5 formed substantially in a central part of the device region 10a and a plurality of suspending leads 11 formed integrally with the chip mounting part 5. Moreover, each device region 10a has: a plurality of leads 3 arranged between the suspending leads 11 and also arranged around the chip mounting part 5; and a dam bar (tie bar, dam part) 12 formed integrally with each of the leads 3.

Moreover, each of the leads 3 comprises an inner lead 3a and an outer lead 3b. The inner lead 3a is covered with a sealing body 2 (see FIGS. 1 and 2) formed in a subsequent sealing step and is located closer to the side of the chip mounting part 5 than the dam bar 12. The outer lead 3b is formed integrally with the inner lead 3a through the dam bar 12. Also, the outer lead 3b is formed at a position farther from the inner lead 3a than the dam bar 12.

Moreover, as shown in FIG. 9, each of the suspending leads 11 has an inner part (inner suspending lead) 11a and an outer part (outer suspending lead) 11b. The inner part 11a is located closer to the side of the chip mounting part 5 than the dam bar 12. The outer part 11b is formed integrally with the inner part 11a through the dam bar 12 and is located outside the dam bar 12.

The outer part 11b is located outside the outer leads 3b. In other words, in the device region 10a, whose plane shape is quadrangular, the outer part 11b of the suspending lead 11 is arranged closer to the corner portion than the outer lead 3b. Moreover, the inner part 11a is branched into two near the dam bar 12 and coupled to respective outer parts 11b through the dam bar 12.

The outer lead 3b is also coupled (formed integrally) with the frame body 10b. In addition, the lead frame 10 to be used in the present embodiment is formed by a press processing using a metal mold. Therefore, the flatness of the side surface of the lead 3 (face located between an upper surface 3c and a lower surface 3d of the lead 3 of FIG. 11) is substantially the same as that of the upper surface 3c (or the lower surface 3d) of the lead 3.

Figure 10:
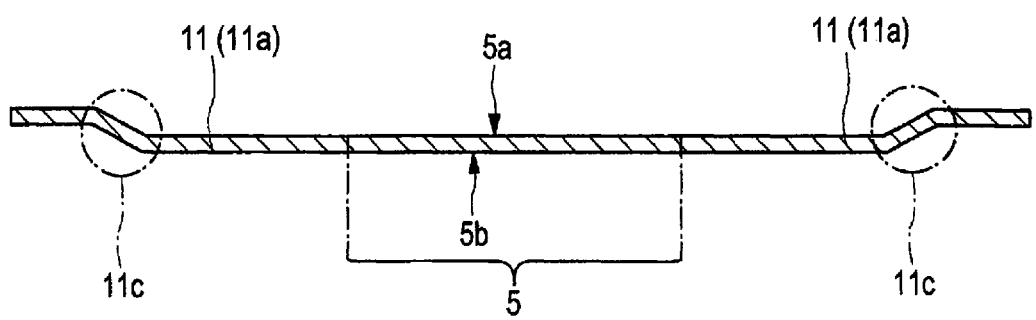
FIG. 10 is a cross-sectional view taken along line G-G in FIG. 9.
Figure 11:
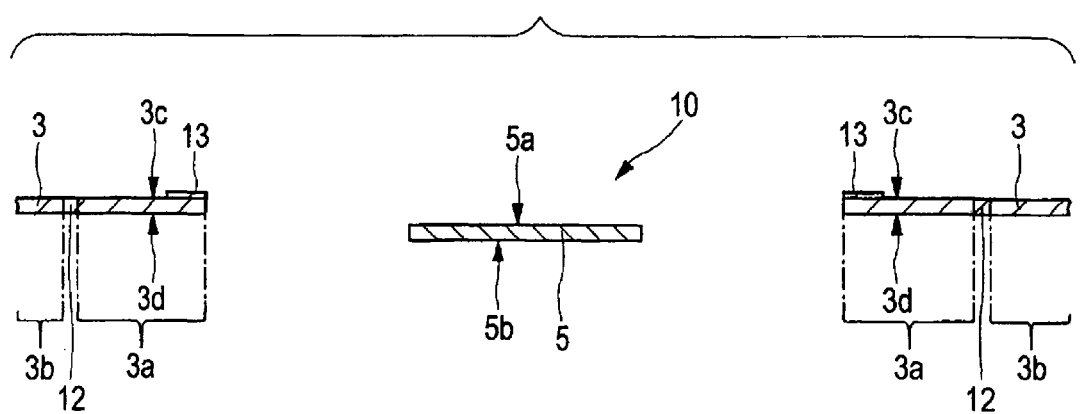
FIG. 11 is a cross-sectional view taken along line H-H in FIG. 9.

Moreover, as shown in FIG. 10, which is a cross section taken along line G-G of FIG. 9, the suspending lead 11 has a portion to be bent (bend portion, offset portion) 11c. As shown in FIG. 11 which is a cross-sectional view taken along line H-H corresponding to FIGS. 2 and 9, the suspending lead 11 has the portion 11c to be bent such that the chip mounting part 5 is positioned closer to the side of the lower surface (rear surface, mounting surface) 2b of the sealing body 2 than the upper surface (surface, main surface) 3c of the lead 3. Thereby, in a subsequent sealing step, even if the semiconductor chip 4 (see FIG. 2) is mounted over the upper surface (surface, main surface) 5a of the chip mounting part 5, the mobility of the resin (mobility of the resin which flows on the side of the main surface 4a of the semiconductor chip 4 and on the side of the lower surface 5b of the chip mounting part 5) can be stabilized.

As shown in FIGS. 8 and 9, the plane shape of the device region 10a is quadrangular. Further, each of the suspending leads 11 is formed from the central part of the device region 10a toward the corner portion of the device region 10a.

Moreover, the lead frame 10 contains metal. According to the present embodiment, for example, it contains copper (Cu), or an alloy of iron (Fe) and nickel (Ni). Also, the thickness (spacing between the upper surface 3c and the lower surface 3d of the lead 3) of the lead frame 10 of the present embodiment is 125 µm.

Furthermore, as shown in FIG. 11, in part of the inner lead 3a (region to which a wire is coupled in a subsequent wire bonding step), a plating film 13 containing silver (Ag) is formed. The electrolytic plating method is used as a method for forming the plating film 13 of the present embodiment. A chemical plating method may also be employed. However, when considering the quality of the film, it is preferable to form the plating film 13 by using the electrolytic plating method.

2. Die Bonding Step: Next, a die bonding step S2 shown in FIG. 7 will be explained. With regard to a drawing used in the explanation below, the drawing from which an F portion in FIG. 8 is extracted is used. Moreover, in a cross section corresponding to the F portion in FIG. 8, the aspect ratio of the drawing is changed for easy viewing. Also, thicknesses of members are shown thicker as compared to those in FIG. 2.

First, not only the above lead frame 10 but also the above semiconductor chip 4 is prepared.

Figure 12:
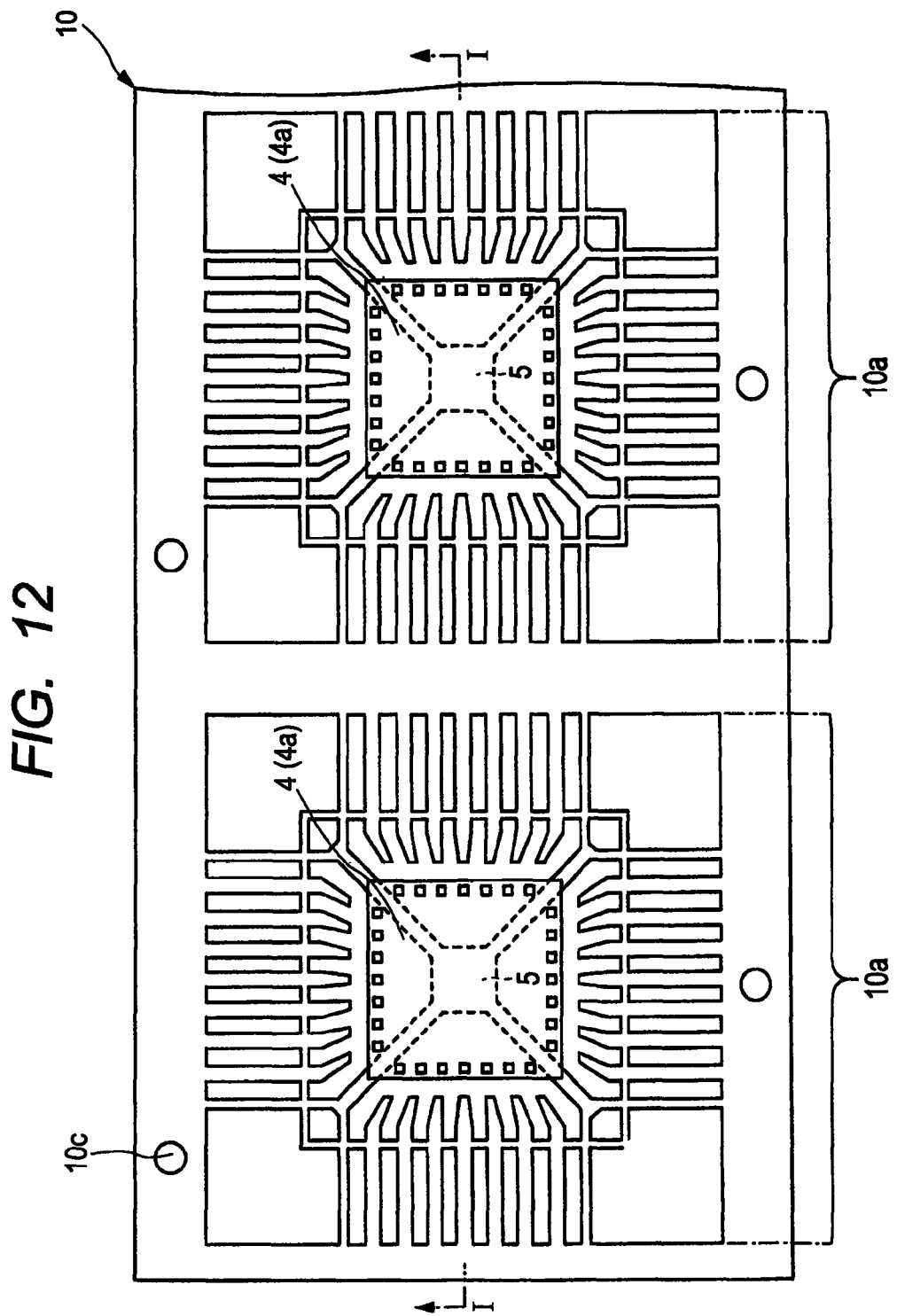
FIG. 12 is a plan view showing a state after step S2 in FIG. 7.
Figure 13:
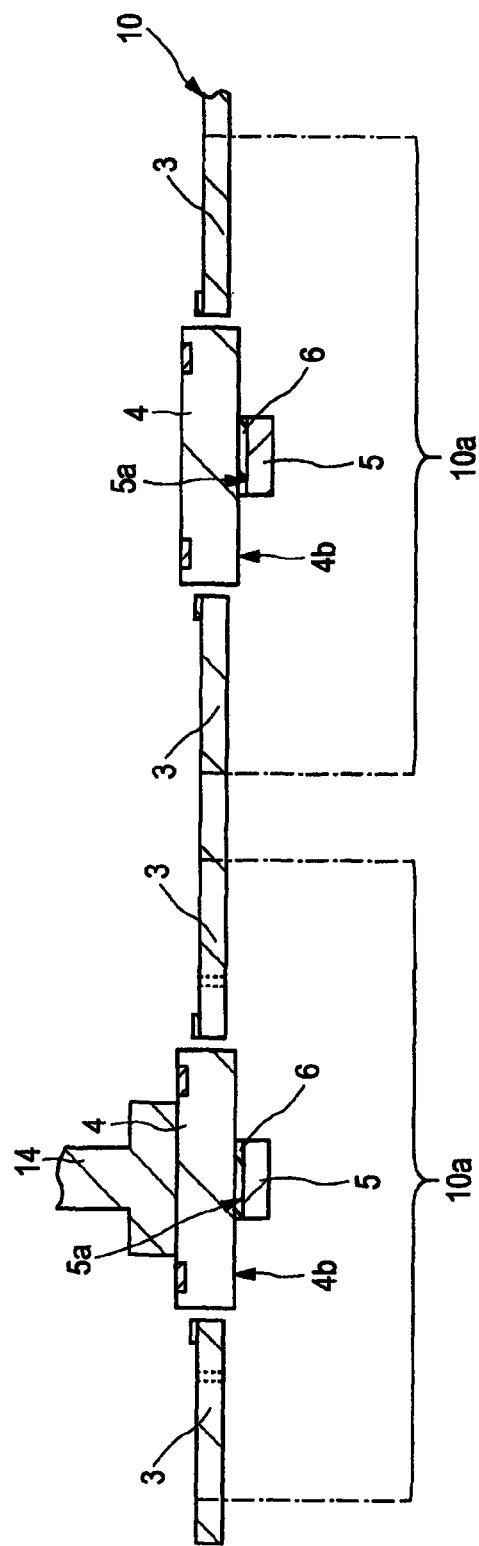
FIG. 13 is a cross-sectional view taken along line I-I in FIG. 12.

As shown in FIG. 13, after holding the semiconductor chip 4 using a pickup jig 14, as shown in FIGS. 12 and 13, through a die bonding material (an adhesive) 6, the semiconductor chips 4 are mounted over the device regions 10a (chip mounting parts 5), respectively.

At this time, the semiconductor chip 4 is mounted over the chip mounting part 5 such that the rear surface 4b of the semiconductor chip 4 is opposed to the upper surface 5a of the chip mounting part 5 (Face Up Packaging).

In this regard, a size of an outline of the chip mounting part 5 to be used in the present embodiment is smaller than that of the semiconductor chip 4. That is, it is what is called a small tab configuration. Therefore, part of the rear surface of the semiconductor chip 4 mounted over the chip mounting part 5 is exposed from the chip mounting part 5. Moreover, the die bonding material 6 used in the present embodiment is a paste-like adhesive. For example, the semiconductor chip 4 is mounted after applying the adhesive, through a nozzle (not shown), onto the upper surface (surface, main surface) 5a of the chip mounting part 5.

3. Wire Bonding Step: Next, a wire bonding step S3 shown in FIG. 7 will be explained.

Figure 14:
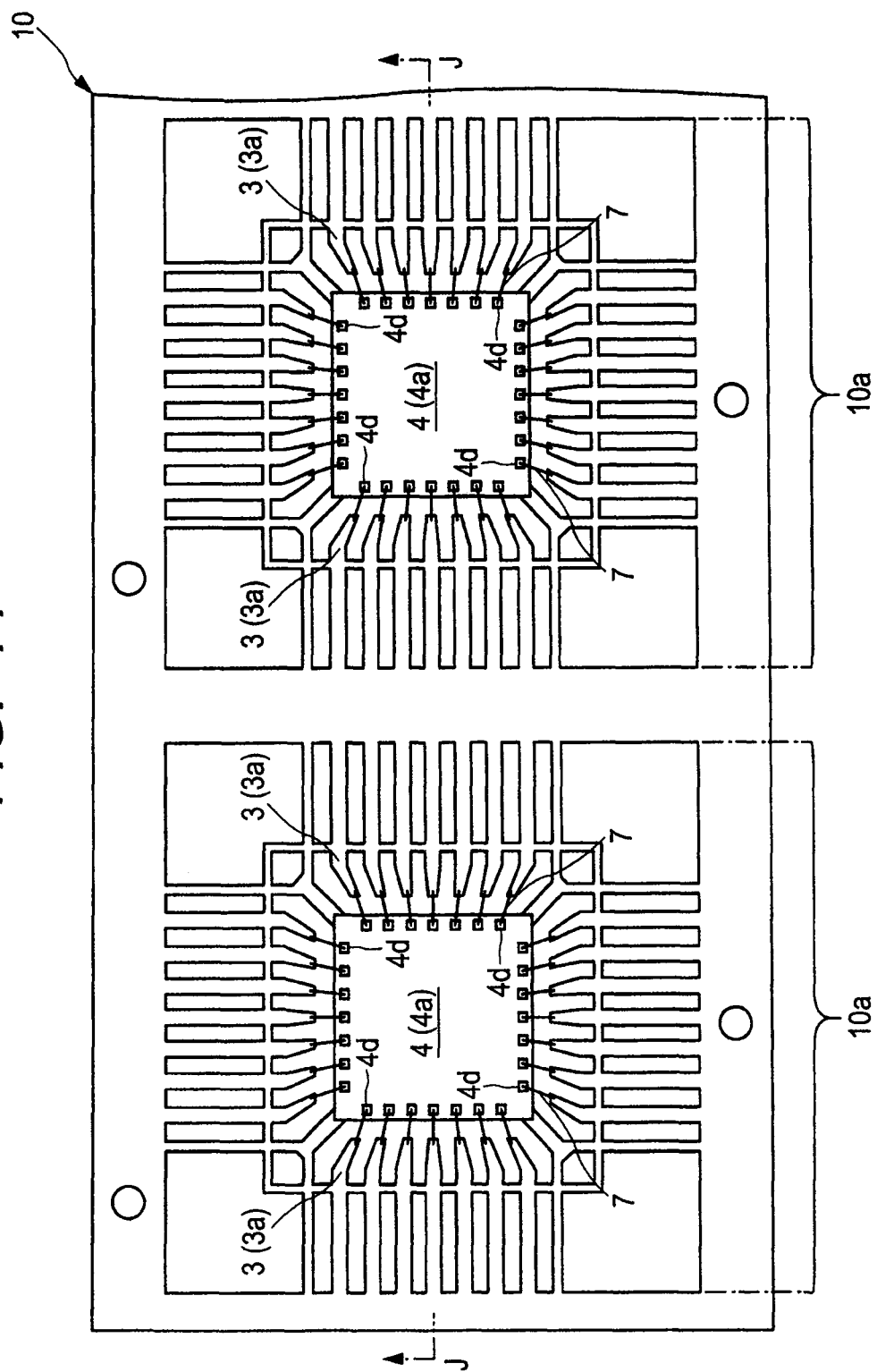
FIG. 14 is a plan view showing a state after step S3 in FIG. 7.
Figure 15:
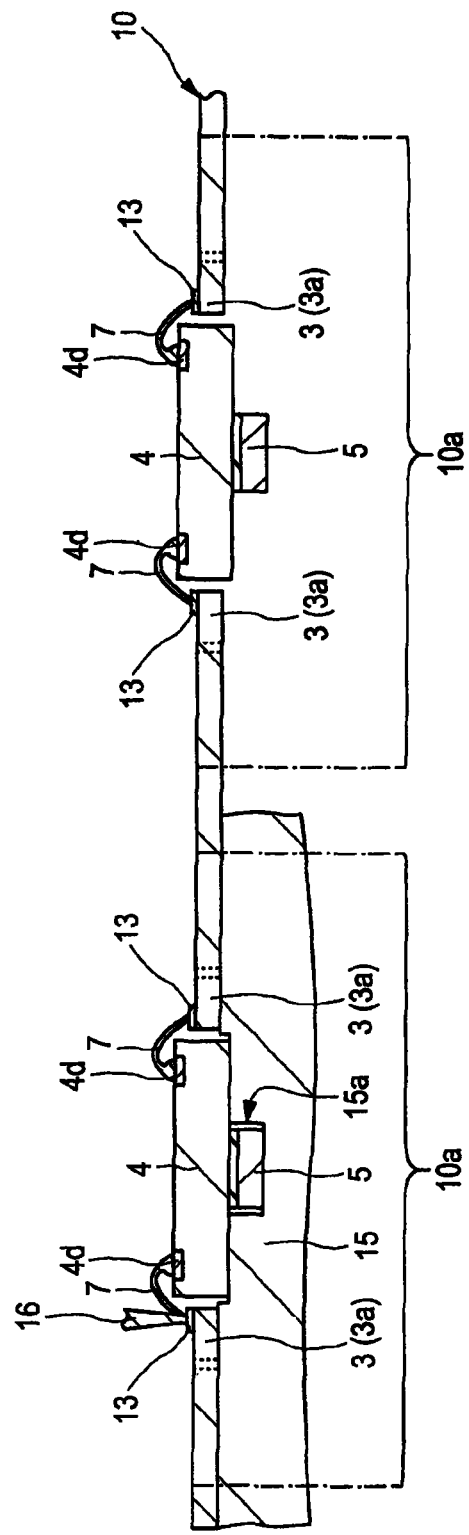
FIG. 15 is a cross-sectional view taken along line J-J in FIG. 14.

First, as shown in FIGS. 14 and 15, a heat stage 15 in which a cavity 15a is formed is prepared. Then, the lead frame 10 on which the semiconductor chip 4 is mounted is arranged over the heat stage 15 so that the chip mounting part 5 may be located in the cavity 15a.

Then, an electrode pad 4d of the semiconductor chip 4 and a lead 3 are electrically coupled through a conductive member 7. In this regard, according to the present embodiment, a wire is coupled by using what is called a nail-head bending method. In this method, the wire is supplied through a capillary 16, and ultrasonic waves and thermocompression (thermosetting) bonding are used together.

In addition, the temperature used for the present embodiment is somewhere between 170 to 230° C. Moreover, as described above, the plating film 13 is formed in part of the lead 3. Part of the wire is electrically coupled with the lead 3 through the plating film 13.

Also, the wire contains metal. According to the present embodiment, it contains gold (Au), for example. Therefore, as described above, by forming gold (Au) over a surface of the electrode pad 4d of the semiconductor chip 4, adhesion between the wire and the electrode pad 4d can be improved.

Moreover, according to the present embodiment, the wire is coupled by using, so called, a positive bonding method. According to the above bonding method, part of the wire is coupled to the electrode pad 4d of the semiconductor chip 4. Then, the other portion of the wire is coupled to a wire coupling region (a portion in which the plating film 13 is formed over the upper surface of lead 3) in the lead 3 (inner lead 3a).

4. Mold Step: Next, a sealing step S4 shown in FIG. 7 will be explained.

Figure 16:
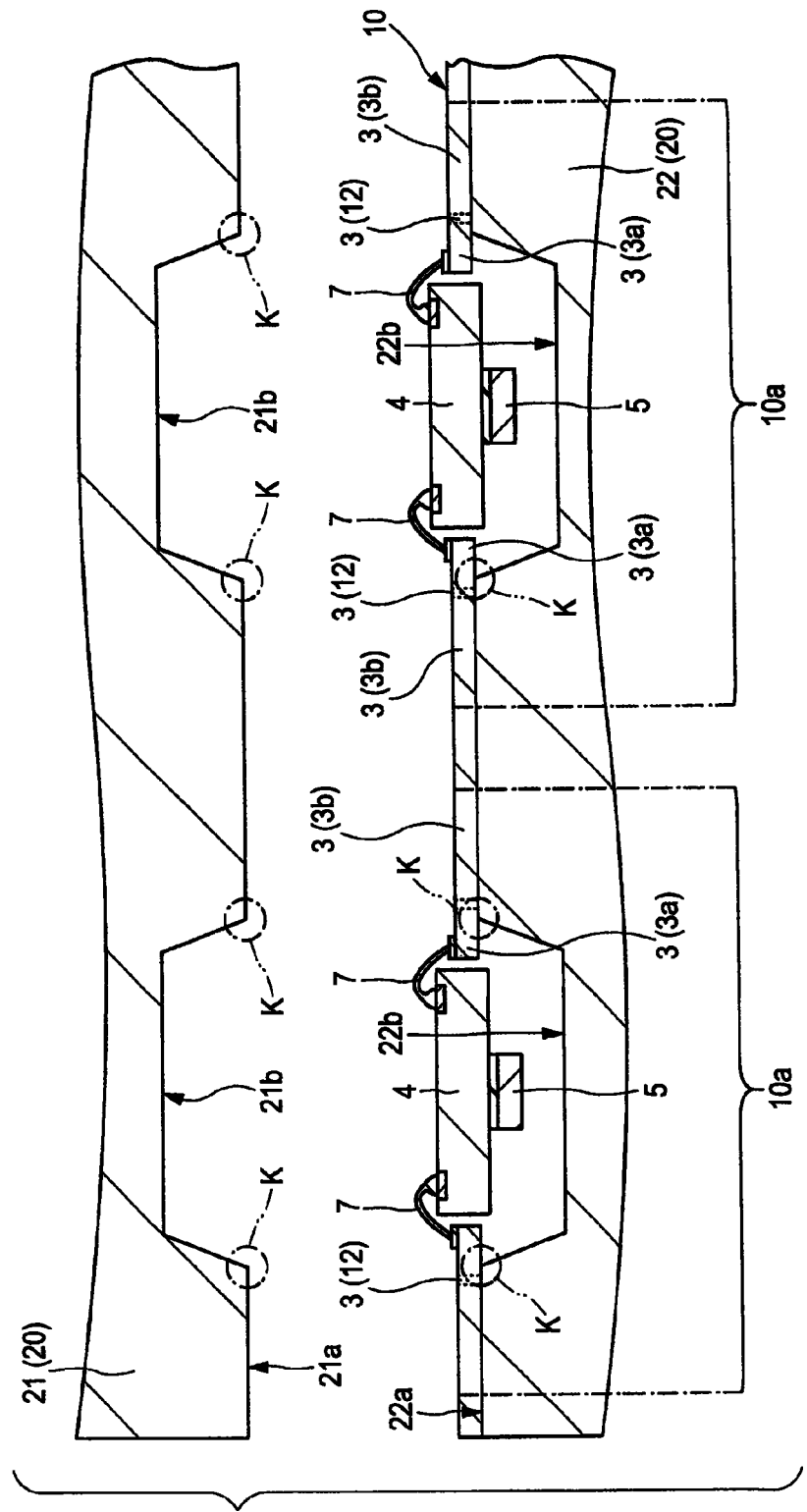
FIG. 16 is a cross-sectional view illustrating a state where the lead frame is placed inside a metal mold after step S3 in FIG. 7.

First, as shown in FIG. 16, a metal mold 20 comprising an upper mold (a first metal mold) 21 and a lower mold (a second metal mold) 22 is prepared. The upper mold (the first metal mold) 21 has a metal mold surface (a first metal mold surface) 21a and a cavity 21b formed in the metal mold surface 21a. The lower mold (the second metal mold) 22 has a metal surface (a second metal mold surface) 22a opposed to a metal mold surface 21a of the upper mold 21 and a cavity 22b formed in the metal mold surface 22a.

As shown in FIG. 16, the lead frame 10 to which the wire bonding step is applied is arranged inside (between the upper mold 21 and the lower mold 22) of the metal mold 20 such that the semiconductor chip 4 is positioned in the cavity 21b of the upper mold 21 and the chip mounting part 5 is positioned in the cavity 22b of the lower mold 22, respectively.

Figure 17:
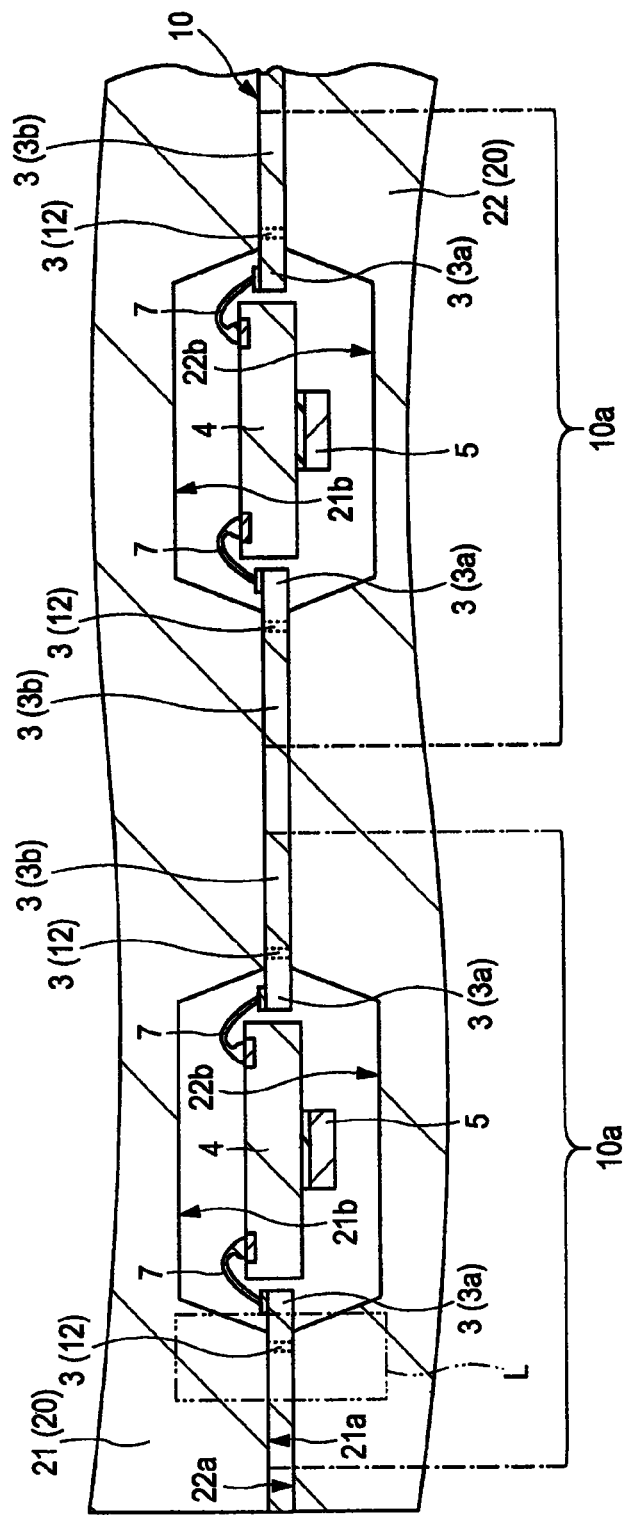
FIG. 17 is a cross-sectional view illustrating a state where the lead frame is clamped by the metal mold after step S3 in FIG. 7.
Figure 18:
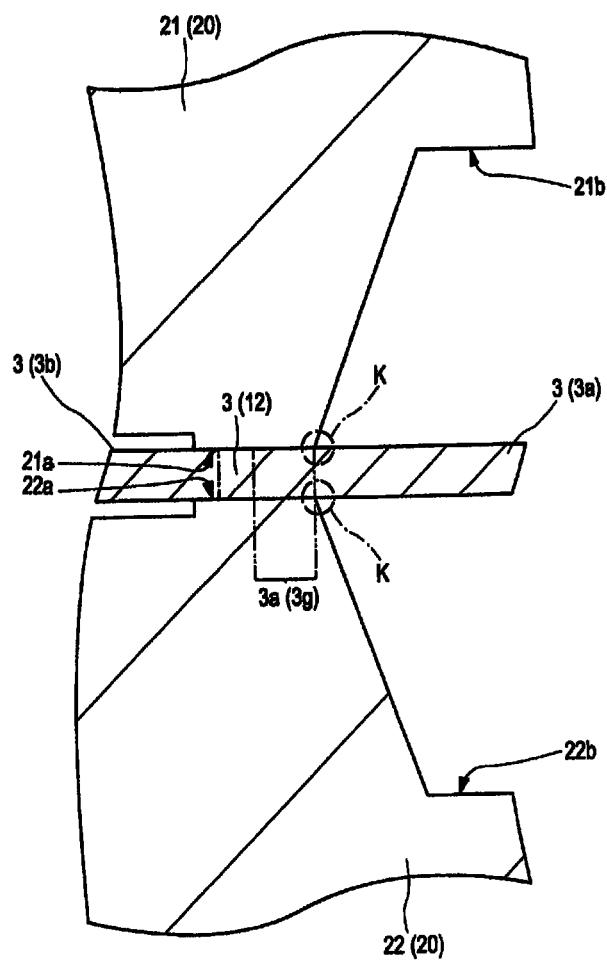
FIG. 18 is an enlarged cross-sectional view of an L portion in FIG. 17.

Next, as shown in FIG. 17, the lead frame 10 is clamped between the upper mold 21 and the lower mold 22. In this regard, when clamping the lead frame 10, at least the dam bar (tie bar, dam part) 12 formed in the lead frame 10 is clamped. To be specific, as shown in FIG. 18, the upper mold 21 and the lower mold 22 clamp each part of the inner leads 3a (a projection 3g from the cavities 21b and 22b), the dam bar 12, and each part of the outer leads 3b.

One of the reasons of this is as follows. Even if the metal mold 20 is manufactured so as to clamp the dam bar 12 for preventing the resin from flowing out, the clamping position may shift from the dam bar 12 according to the processing precision of the metal mold 20 or because of the expansion or shrinkage of the lead frame 10 under the influence of the heat. For example, when the lead frame 10 is clamped, the end portion K of the cavities 21b and 22b formed in the metal mold 20 (namely, end portions K of the metal mold surfaces 21a and 22a shown in FIG. 16) may be located on the outer side (on the side of the outer lead 3b) of the dam bar 12.

Figure 50:
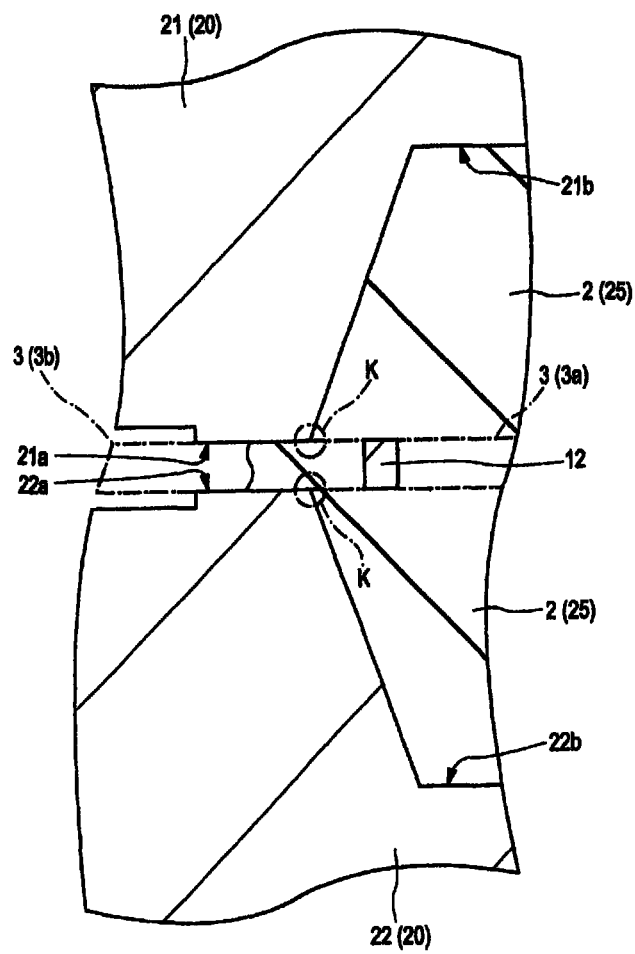
FIG. 50 is an enlarged cross-sectional view showing a first comparative example of the present embodiment.

As a result, the resin supplied to the inside of the cavity from the gate portion (not shown) arranged in the corner of the device region 10a may, as shown in FIG. 50 being a comparative example, flow in between adjacent leads 3 of the leads 3 through a gap formed between the end portions K of the cavities 21b and 22b and the dam bar 12. Then, the resin may leak from between the upper mold 21 and the lower mold 22 toward the outside of the metal mold 20.

Also, another reason is that there is a case where the lead frame 10 can be clamped such that the end portions of the cavities 21b and 22b overlap with the dam bar 12 in a plane. That is, as described above, the leads 3 are coupled through the dam bar 12. Therefore, by the time the semiconductor device is completed, one lead 3 of the leads 3 must be electrically separated from other leads 3.

Figure 51:
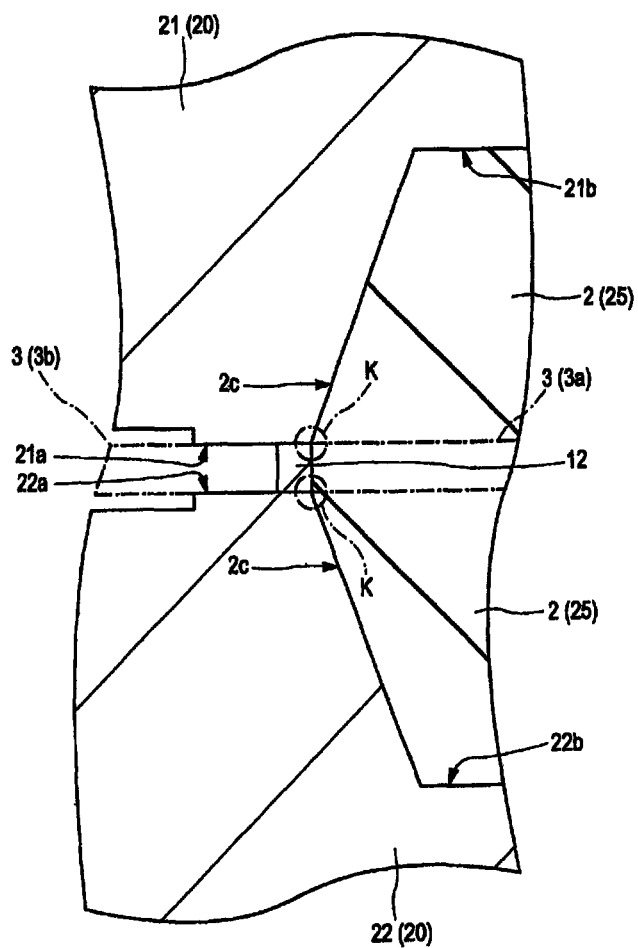
FIG. 51 is an enlarged cross-sectional view showing a second comparative example of the present embodiment.

However, when the lead frame 10 is clamped such that the end portions (end portions K) of the cavities 21b and 22b formed in the metal mold 20 overlap with the dam bar 12 in a plane (such that the end portions (end portions K) of the cavities 21b and 22b overlap with the end portions on the side of the inner lead 3a in a plane in the dam bar 12), the sealing body 2 is formed as follows. That is, as shown in FIG. 51, the sealing body 2 is formed such that the end portion (side surface) of the sealing body 2 to be formed and the end portion of the dam bar 12 (end portion on the side of the inner lead 3a) match (overlap in a plane). In order to electrically separate the adjacent leads 3, the dam bar 12 must be cut reliably. However, when the sealing body 2 is formed as shown in FIG. 51, in a subsequent step of cutting the dam bar 12, part (side surface) of the sealing body 2 may be also damaged.

Therefore, according to the present embodiment, as shown in FIG. 18, the metal mold surfaces 21a and 22a are intentionally brought into contact also with part (an upper surface 3c and a lower surface 3d as in FIG. 11) of the inner lead 3a. As a result, the resin 25 supplied into the cavities 21b and 22b is reliably prevented from leaking outside of the metal mold 20. Moreover, the end portion (the end portion on the side of the inner lead 3a) of the dam bar 12 leaves the end portion (side surface) of the sealing body 2 (see FIG. 20). Therefore, in a subsequent step where the dam bar 12 is cut, the dam bar 12 can be easily cut (removed) without damaging part of the sealing body 2 (chip sealing resin).

Figure 19:
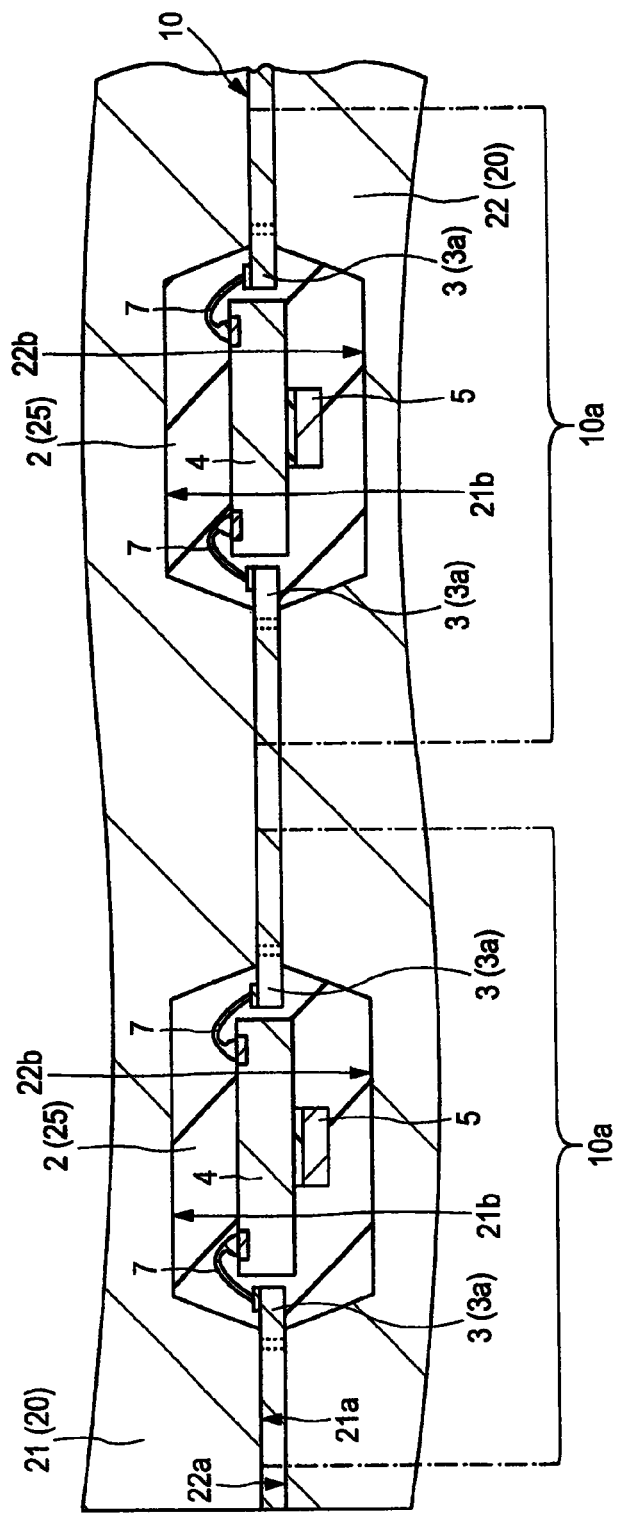
FIG. 19 is a cross-sectional view illustrating a state where resin is supplied into a metal mold of the present embodiment.

Next, as shown in FIG. 19, with the lead from 10 being clamped by the upper mold 21 and the lower mold 22, a resin 25 is supplied to the cavity 21b of the upper mold 21 and the cavity 22b of the lower mold 22, respectively. Then, with use of the resin 25, the semiconductor chip 4, a plurality of conductive members 7, a chip mounting part 5, and the leads 3 (portions other than the projections 3g of the inner leads 3a, respectively, shown in FIG. 18) are sealed.

Figure 20:
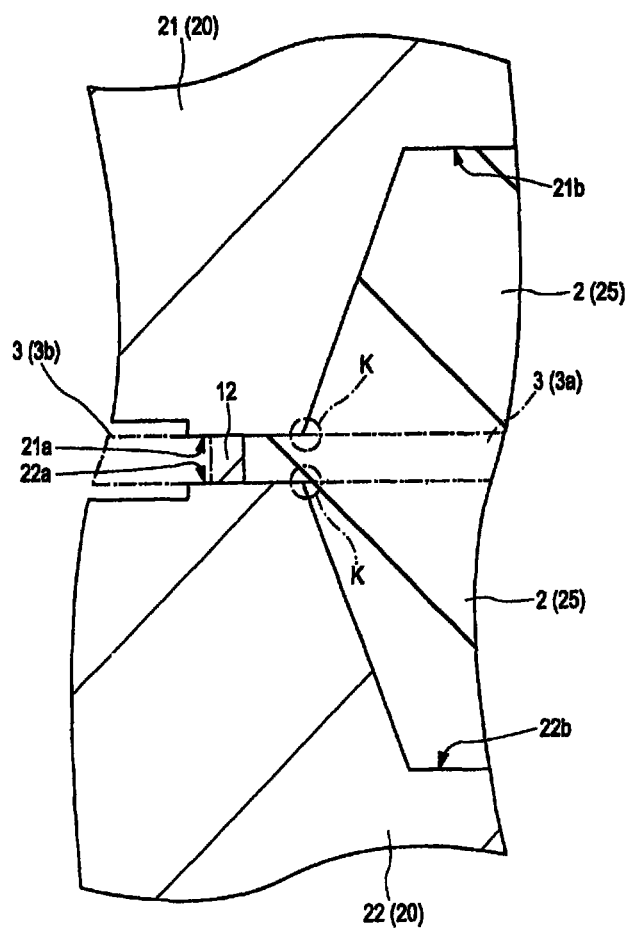
FIG. 20 is an enlarged cross-sectional view between inner leads after resin is supplied.

Then, by hardening the supplied resin 25, the sealing body (chip sealing resin) 2 is formed. In this regard, the resin 25 according to the present embodiment is a thermosetting epoxy resin, and contains a plurality of fillers (silica). Moreover, the temperature of the metal mold 20 of the present embodiment is about 180° C. Moreover, as shown in FIG. 20, the resin 25 is also supplied between the adjacent inner leads 3a (part of the inner leads 3a) of the inner leads 3a.

Figure 21:
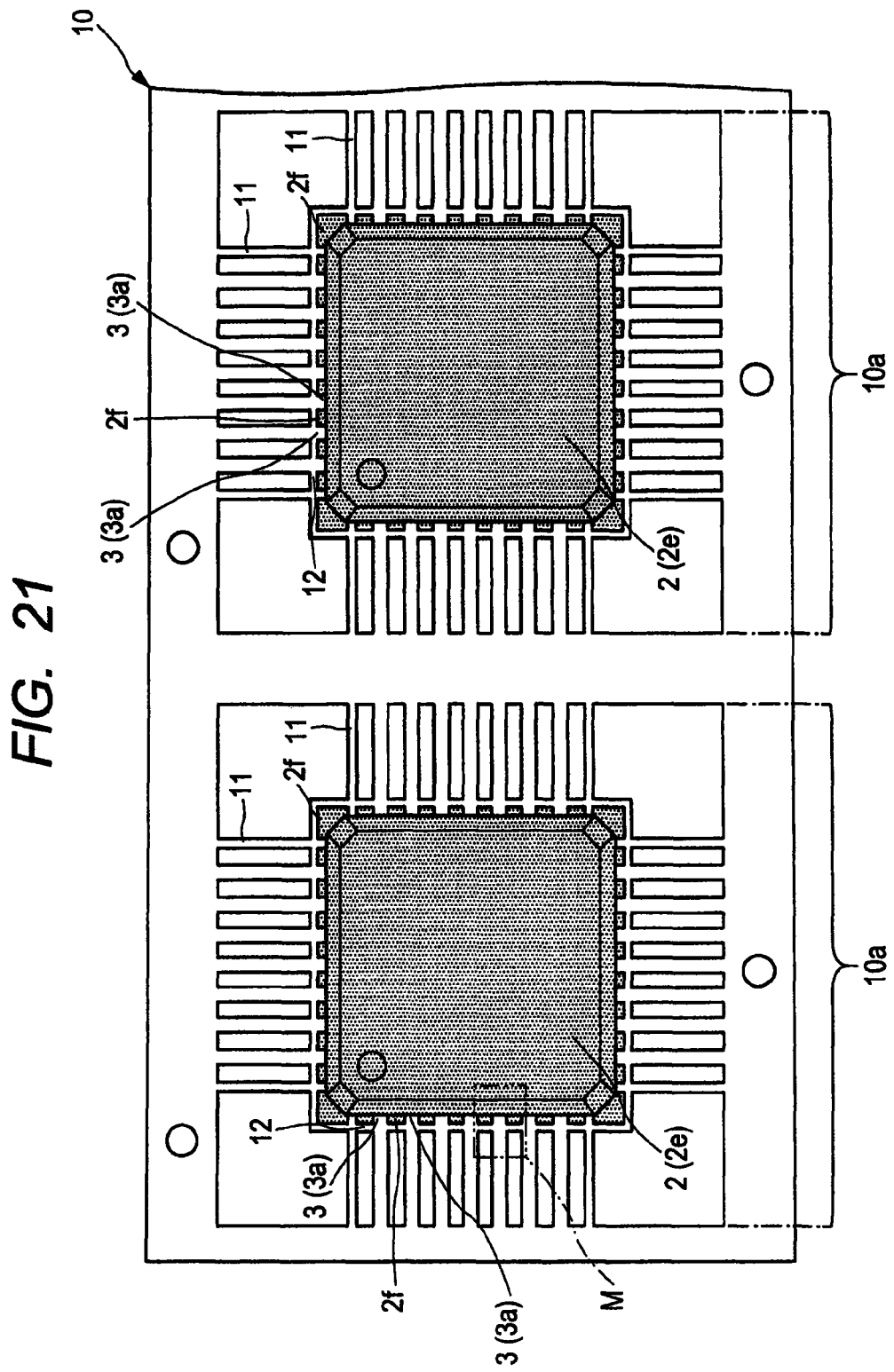
FIG. 21 is a plan view of the lead frame taken out from the metal mold.

Then, after the thermosetting step, by taking out the lead frame 10 from the metal mold, the lead frame 10 where the sealing body 2 is formed in each device region 10a is obtained as shown in FIG. 21.

Figure 22:
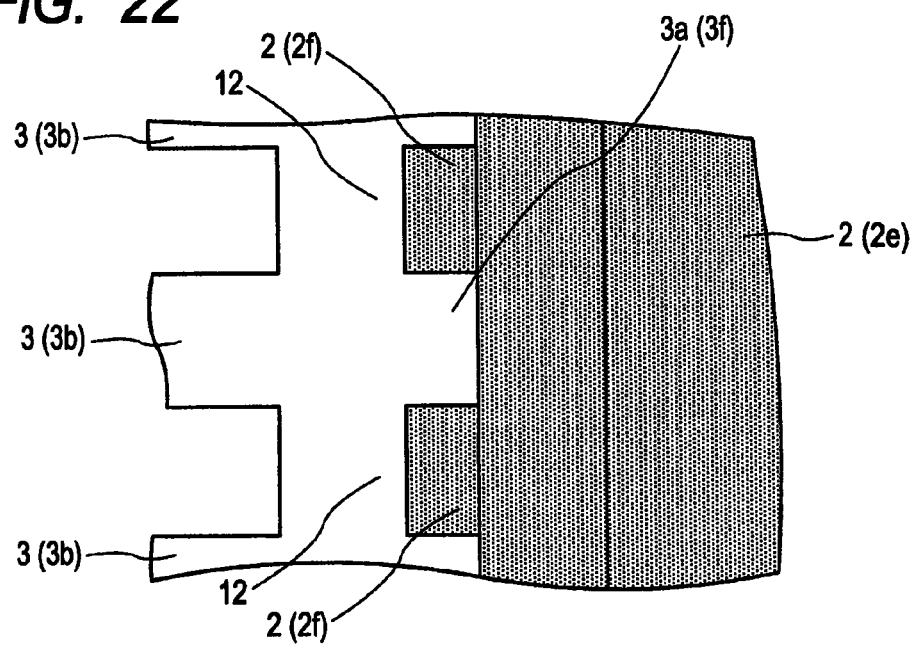
FIG. 22 is an enlarged plan view of an M portion in FIG. 21.

In this regard, according to the present embodiment, as described above, the lead frame 10 is clamped such that the metal mold surfaces 21a and 21b are in contact with part of the inner lead 3a. With such a state, the resin is supplied into the cavities 21b and 22b. Therefore, as shown in FIGS. 21 and 22, the sealing body (resin in a dam, resin between the leads) 2f is formed not only between the adjacent inner leads 3a of the inner leads 3a but also in a region (resin accumulation region) surrounded by the sealing body (chip sealing resin) 2e for sealing the semiconductor chip 4, part (portion to be clamped by the metal molds) of each of the inner leads 3a, and the dam bar 12.

5. Baking Step: Next, a baking step S5 shown in FIG. 7 will be explained.

First, the lead frame 10 taken out from the metal mold 20 is conveyed to a bake furnace (not shown), and the lead frame is heat-treated again. The reason is that, in a thermosetting step during the above sealing step, though the resin supplied into the cavity is being hardened, the resin is not completely hardened. This is for immediately sealing the next lead frame 10 to be delivered to the metal mold 20. Therefore, according to the present embodiment, the hardening step of the resin 25 is divided into two. Then, in the baking step S5, the resin 25 forming the sealing body 2 produced by the sealing step is completely hardened. Thus, the sealing step is completed. Further, according to the present bake step, the lead frame 10 in which the sealing body 2 is formed is placed in a heated atmosphere of 150° C., and the heat is applied for about 3 to 3.5 hours.

6. Dam Bar Cutting Step: Next, a dam bar cutting step S6 shown in FIG. 7 will be explained.

In this step, of the leads 3, the dam bar 12 formed between the adjacent leads 3 is removed. Thereby, it becomes possible to electrically separate, of the leads 3, one lead 3 (a middle lead shown in FIG. 23) from the other lead 3 (lead 3 next to the middle lead 3 in FIG. 23). Further, according to the present embodiment, part of the dam bar 12 is cut off by using a cutter (metal mold, punch) 26.

In the lead frame 10 conveyed to the dam bar cutting step, as shown in FIG. 22, in the previous step (sealing step), there are formed a sealing body (chip sealing resin) 2e for sealing the semiconductor chip 4 and a sealing body (resin in the dam) 2f. The sealing body (resin in the dam) 2f is formed in a region (resin accumulation region) surrounded by the sealing body 2, the leads 3 (part of the inner lead 3a (region to be clamped)), and the dam bar 12. Therefore, even if the position of the cutter 26 to be inserted in the dam bar shifts, there is no possibility of damaging the sealing body 2 (chip sealing resin) for sealing the semiconductor chip 4.

Figure 23:
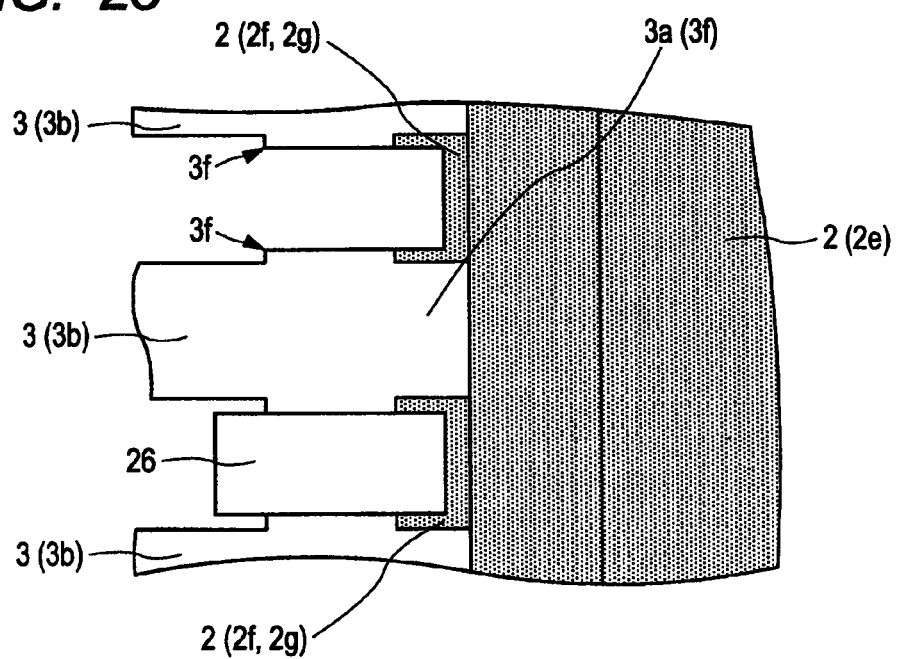
FIG. 23 is an enlarged plan view illustrating a dam bar cutting step S6 according to the present embodiment.

According to the invention of the present application, as shown in FIG. 23 (particularly, in a lower portion of the drawing), the cutter 26 is brought into contact with the dam bar 12 to cut the dam bar 12 such that part of the cutter 26 comes into contact with the sealing body (resin in the dam) 2f (to remove part of the resin in the dam). As a result, as shown in FIG. 23 (particularly, in an upper portion of the drawing), the dam bar 12 (at least part of the dam bar 12; see FIG. 22) can be completely removed such that there exits no portion for coupling (joining) the adjacent leads 3.

The cutter 26 used according to the present embodiment has a width smaller than a distance (spacing) between the adjacent leads 3. According to the present embodiment, the distance between the adjacent leads 3 is 0.45 mm, and the cutter 26 having a width of 0.39 mm is used. This is a result of having considered the positional shift of the cutter 26 with respect to the lead frame 10. Accordingly, even if the position of the cutter 26 is shifted, part of the cutter 26 is prevented from coming into contact with the lead 3.

Thus, as shown in FIGS. 3 and 23, a projection (residual dam bar) 3f being a residue of the dam bar 12 is formed over a side surface of the lead 3 to which the dam bar cutting step S6 is applied. Moreover, according to the present embodiment, a spacing is provided between the sealing body (chip sealing resin) 2e and the cutter 26 so that the cutter 26 may not come into contact with the sealing body (chip sealing resin) 2e. According to the present embodiment, the distance from the dam bar 12 to the sealing body (chip sealing resin) 2e is 0.3 mm, and the spacing between the sealing body 2 (chip sealing resin) and the cutter 26 is about 0.1 mm.

Moreover, the following problems can also be solved by applying the cutting method as shown in FIG. 23. That is, if the cutter 26 can be registered precisely, the dam bar 12 alone may be allowed to be in contact with the cutter 26, and the dam bar 12 may be removed. However, with such a cutting method, all the sealing body (resin in the dam) 2f remains inside the resin accumulation region. Therefore, in a subsequent resin removing step S7 in a dam, the amount (volume) of the sealing body (resin in the dam) 2f to be removed using a laser beam 31 becomes maximum.

In this regard, when the resin is removed with use of the laser beam 31, the resin to which the laser beam 31 is irradiated is destroyed. However, the destroyed resin becomes foreign matter and is dispersed in the vicinity (in particular, near the portion to which the laser beam 31 is irradiated). Then, it becomes soot and adheres to the surface of the lead 3. At this time, the temperature of the portion to which the laser 31 is irradiated becomes very high. Further, the vicinity of the portion to which the laser 31 is irradiated becomes heated to some extent. Therefore, the vicinity of the resin in the dam in the lead 3 is heated, and the foreign matter (soot) adhered to the surface of the lead 3 sticks there. Moreover, if there is a great amount (volume) of the resin to be removed by the laser beam 31, the amount of the foreign matter (soot) deposited over the surface of the lead 3 also increases. As a result, the processing time required in a subsequent washing process becomes longer. In addition, as the case may be, it may not be possible to completely remove the foreign matter adhered to the surface of the lead 3 (of the deposited foreign matter, the foreign matter located on the surface side (lower layer) of the lead).

However, according to the present embodiment, in the dam bar cutting step S6, as shown in FIG. 23, part of the sealing body (resin in the dam) 2f is also removed. Therefore, it becomes possible to reduce the amount (scattering amount) of the foreign matter (soot) generated in the later resin removing step in a dam (laser irradiation step) S7. Thus, the processing time required in the washing step can be reduced. Furthermore, in the washing step, the foreign matter adhered to the surface of the lead 3 can be easily removed. Therefore, in a subsequent plating step S9, it becomes possible to improve the reliability of the plating film 8 formed over the surface of the lead 3. In addition, in the dam bar cutting step S6 of the present embodiment, as described above, the cutter 26 is used. Therefore, part of the resin in the dam to be removed is eliminated as one piece. That is, differing from the case of removal by the laser beam 31, the foreign matter generated in the removal may not be in a minute form such as soot. Therefore, it does not adhere to (remain over) the surface of the lead 3 easily.

7. Resin Removing Step in Dam (laser irradiation step): Next, a resin removing step S7 in a dam (laser irradiation step) shown in FIG. 7 will be explained.

In the present step, after the above dam bar cutting step S6 has been applied, of the lead frames 10, the sealing body (resin in the dam) 2f formed in the resin accumulation region is removed. In this regard, according to the present embodiment, in the previous step S6, part of the sealing body (resin in the dam) 2f is removed. Therefore, when it is delivered to the present step, the other part (residual resin 2g, residue) of the sealing body (resin in the dam) 2f remains inside the resin accumulation region. To be specific, as shown in FIGS. 23 (in particular, in an upper portion of the drawing) and 24, the other part of the sealing body (resin in the dam) 2f is adhered to the side surface of the lead 3 (inner lead 3a).

Figure 24:
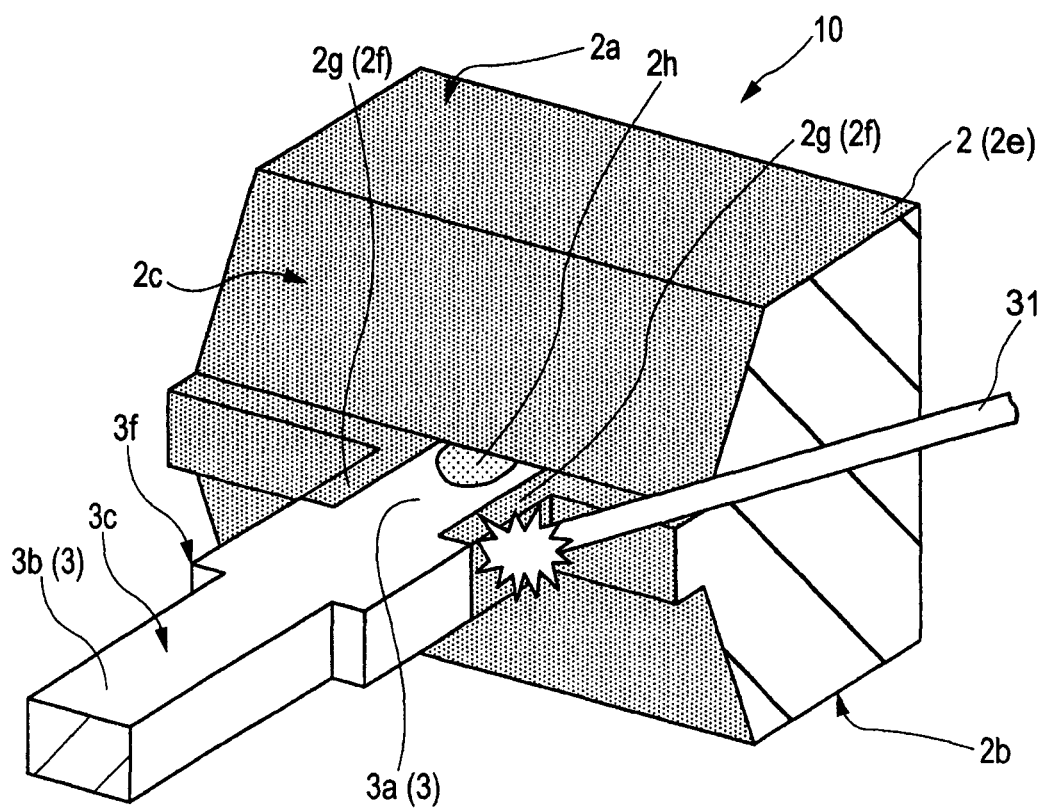
FIG. 24 is a perspective view showing a state where resin in a dam is irradiated with a laser beam.

Then, according to the present embodiment, as shown in FIG. 24, the residual resin 2g is removed by irradiating the laser beam 31 to the residual resin 2g. At this time, as compared to the state immediately after the sealing step S4 (or the baking step S5) is applied, the volume of the residual resin 2g has decreased. Therefore, it is possible to remove the sealing body (resin in the dam) 2f formed in the resin accumulation region in a short time. To be specific, according to the present embodiment, in the previous dam bar cutting step S6, most of the sealing body (resin in the dam) 2f formed in the resin accumulation region has been removed. Therefore, the amount (volume) of the sealing body (residual resin 2g) to be removed in the present step S7 is smaller than the amount (volume) of the part of the sealing body (residual resin 2g) to be removed in the dam bar cutting step. As a result, the present step can be performed in a short time.

Moreover, since the lead frame 10 is delivered to the present step with the small amount (volume) of the residual resin to be removed, the foreign matter (soot) generated in the present step can also be reduced.

The conditions of the laser 31 to be used in the present embodiment are, for example, that the value of electric current is 18 A, the scanning speed is 100 mm/s, the frequency is 50 kHz, and the output power is 32 W.

Figure 25:
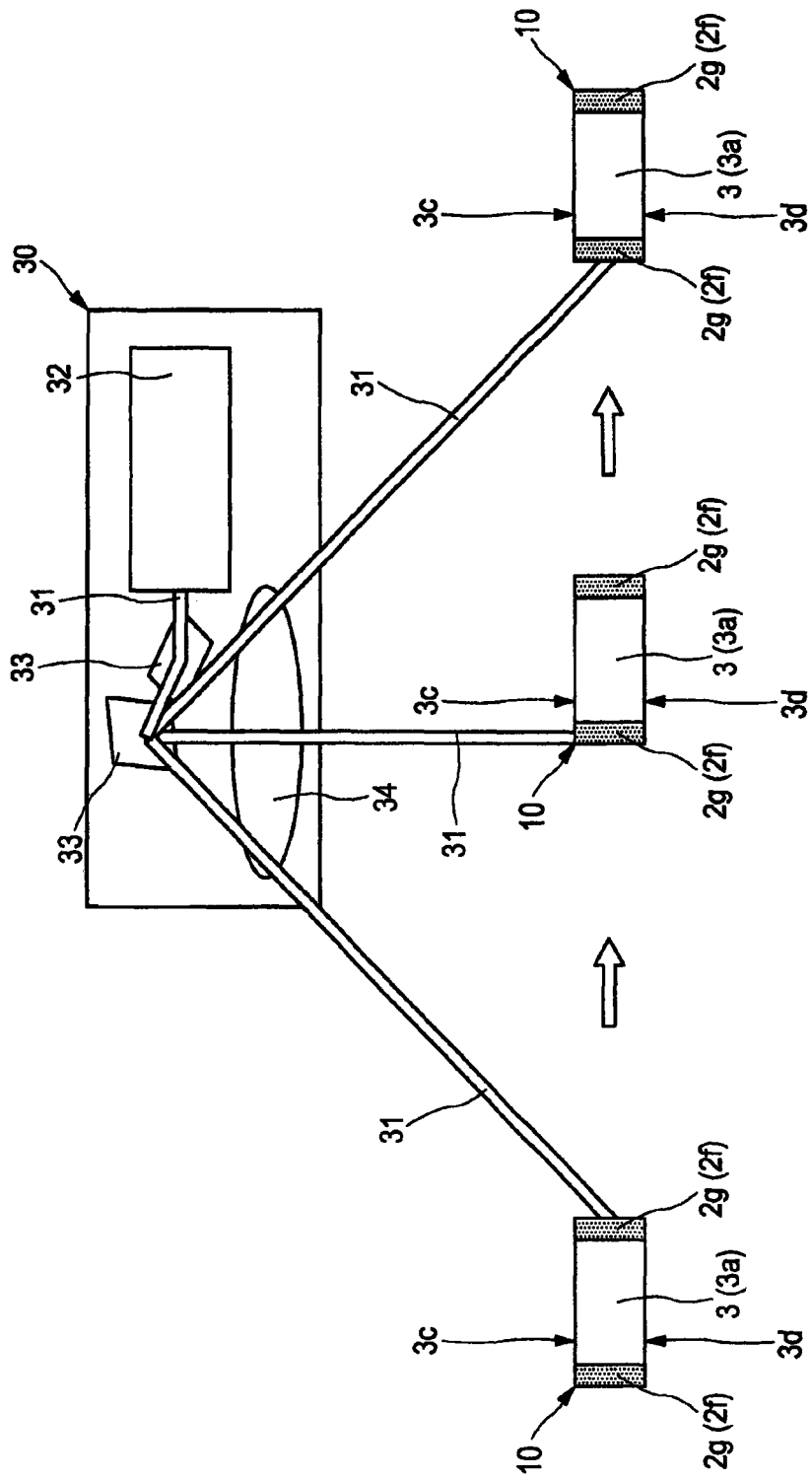
FIG. 25 is an explanatory view showing a state where the resin in the dam is irradiated with the laser beam.

Moreover, according to the present embodiment, as shown in FIG. 25, the laser beam 31 is irradiated such that it has a predetermined angle (a first angle) with respect to a surface of the sealing body (residual resin 2g). The reason why the laser beam 31 can be irradiated so as to have the predetermined angle with respect to the surface (over the side surface of the lead 3) of the residual resin 2g is as follows. That is, as shown in FIG. 23, the central part of the resin in the dam in a plane is already removed in the previous step. That is, a space is formed in this central part. Therefore, as shown in FIG. 25, the laser beam 31 can be irradiated to the surface (side surface of the lead 3) of the residual resin 2g such that it has the predetermined angle.

A specific method for irradiating the laser beam 31 with the predetermined angle (the first angle) is as follows. That is, as shown in FIG. 25, the laser beam 31 emitted from a laser source 32 is irradiated to the residual resin 2g through each of a galvanometer mirror 33 and a condensing lens 34 provided in the laser irradiation device 30.

The reason why the laser beam 31 is irradiated with the predetermined angle (the first angle) is as follows. That is, the irradiated laser beam 31 generally has its directivity and advances in a linear direction only. That is, as shown in FIG. 24, the residual resin 2g is adhered to the side surface of the lead 3. Therefore, when the laser 31 is irradiated in a direction perpendicular to an upper surface (surface, main surface) 3c of the lead 3, the residual resin 2g is destroyed from the upper surface side of the lead frame 10. For example, in FIG. 25, a spatial relationship of the laser beam 31 and the lead 3 shown in a center corresponds to that. When the lead frame 10 to be used is thick, the residual resin 2g becomes also thick. Therefore, with the method of only irradiating the laser beam 31 in a perpendicular direction, it takes time to remove all the residual resin 2g. Therefore, according to the present embodiment, as shown in FIG. 24, the laser beam 31 is irradiated at the acute angle to the surface of the sealing body 2. As described above, the thickness (the distance between the upper and lower surfaces of the lead 3) of the lead frame 10 according to the present embodiment is 125 µm. On the other hand, considering the width of the cutter 26 and the distance between the leads 3 described above, the thickness of the residual resin (the thickness in the width direction of the lead 3) is 30 µm. Therefore, it is easier to remove the residual resins 2g adhered to the side surface of the lead 3 when irradiating the laser beam 31 to the surface of the sealing body 2 from the direction of the acute angle. Moreover, since the laser beam 31 can be irradiated to a wider area of the residual resin 2g, it is possible to (execute) perform the present step in a short time.

Moreover, as shown in FIG. 24, the residual resins 2g are formed over both the side surfaces of the lead 3. Therefore, according to the present embodiment, as shown in FIG. 25, with respect to a single laser irradiation device 30, the position of the lead frame 10 is changed, and the laser 31 is irradiated. Thus, the residual resins 2g formed over both the side surfaces of the lead 3 can be easily removed with use of the single laser irradiation device 30. In addition, as in the present embodiment, when the laser beam 31 is irradiated while moving the lead frame 10, the angle of irradiation of the laser beam 31 changes according to the position of the lead frame 10. In this case, as shown in FIG. 25, a perpendicular direction may be included in the irradiation angles to be changed with respect to the upper surface 2a (see FIG. 24) of the sealing body 2.

Figure 26:
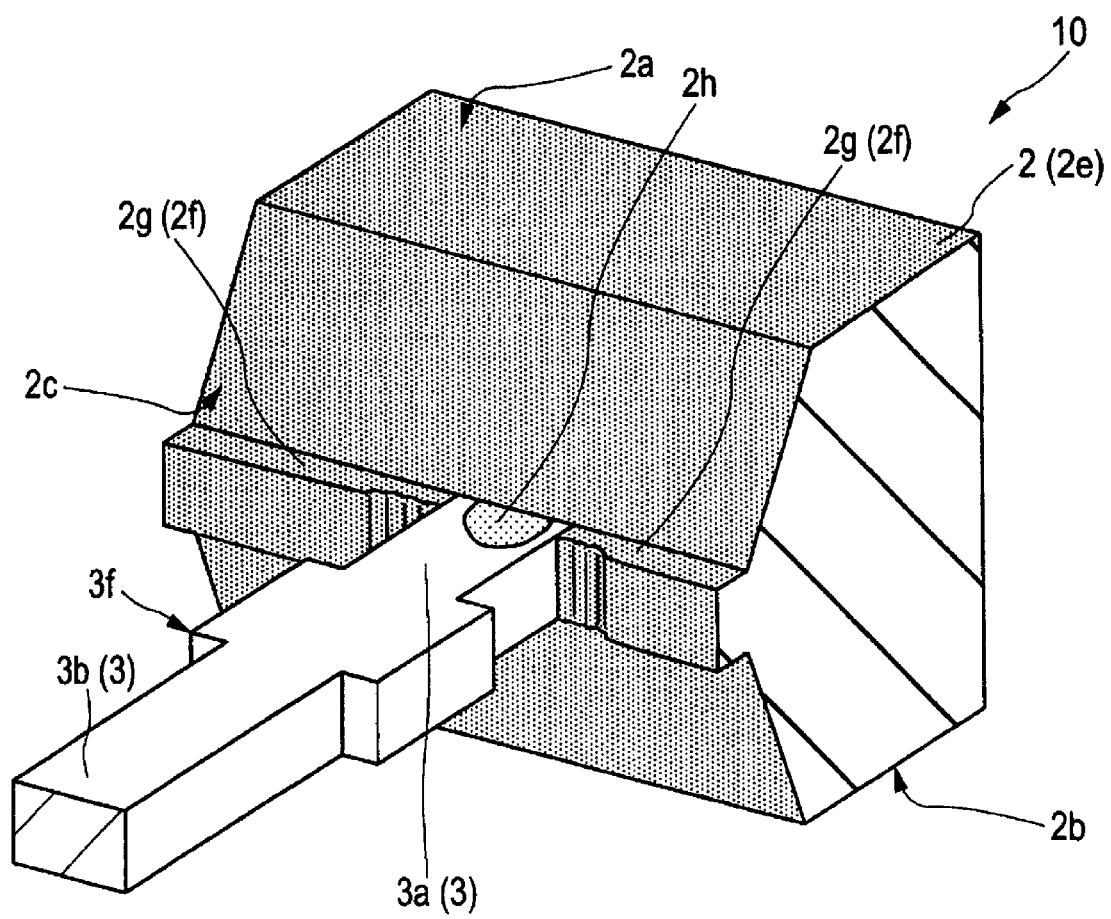
FIG. 26 is a perspective view of a semiconductor device after the resin in the dam has been removed.

Then, as shown in FIG. 26, the residual resin 2g adhered to the side surface of the lead 3 is removed. Though not shown, to the surface of the lead 3, there is adhered foreign matter (soot) which has been generated while removing the residual resin 2g. Moreover, since the laser beam 31 is irradiated so as not to damage the sealing body 2 (chip sealing resin), as shown in FIG. 26, there is a case where the residual resin 2g partially remains near an interface between the sealing body (chip sealing resin) 2e and the residual resin 2g.

8. Washing Step: Next, a washing step S8 shown in FIG. 7 will be explained.

In the washing step (deflashing step), the foreign matter (soot) adhered to the surface of the lead 3 exposed from the sealing body (chip sealing resin) 2e is removed.

Figure 27:
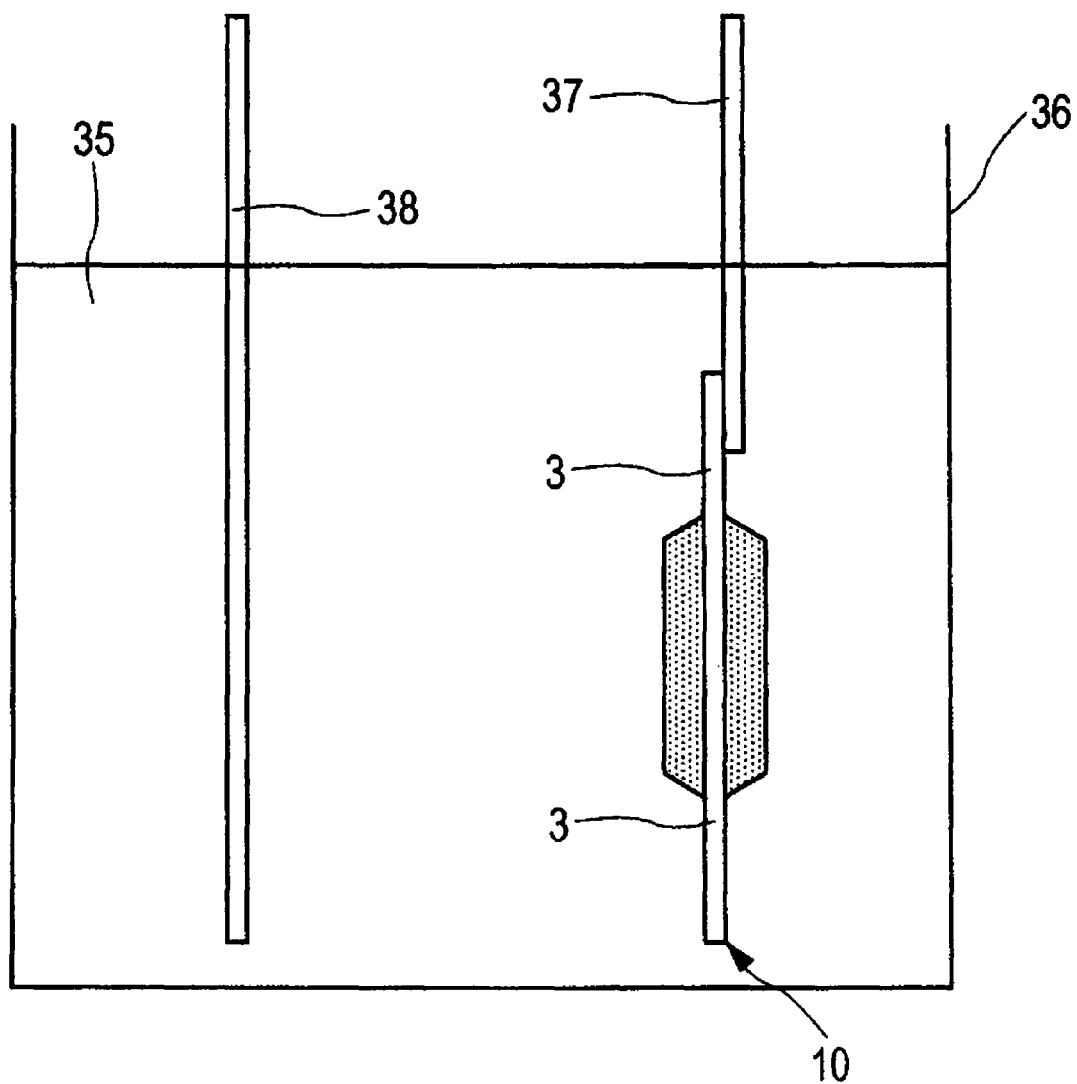
FIG. 27 is a cross-sectional view illustrating an electrolytic burr removing step of the present embodiment.

First, as shown in FIG. 27, a work piece (according to the present embodiment, the lead frame 10 shown in FIG. 26) is placed in a bathtub 36 containing an electrolytic solution 35. In this regard, the work piece is coupled to a positive pole 37 in the bathtub 36. Then, a DC voltage is applied between the positive pole 37 and a negative pole 38 similarly arranged in the bath tub 36. As a result, the coupling between the work piece and the foreign matter adhering to the surface (the surface of the lead 3, in this case) of the work piece is released. Thus, the foreign matter adhered to the surface of the lead 3 can be removed.

In addition, as described above, under the influence of the heat of the laser beam 31, some of the adhered foreign matter is strongly coupled to the surface of the lead 3. Therefore, there is a case where the foreign matter cannot be removed completely in the present step (electrolytic burr removing step). In such a case, it is preferable to perform what is called a water-pressure burr removing step, that is, to spray pressurized wash water (high-pressure water) to the work piece (surface of the lead 3).

Figure 28:
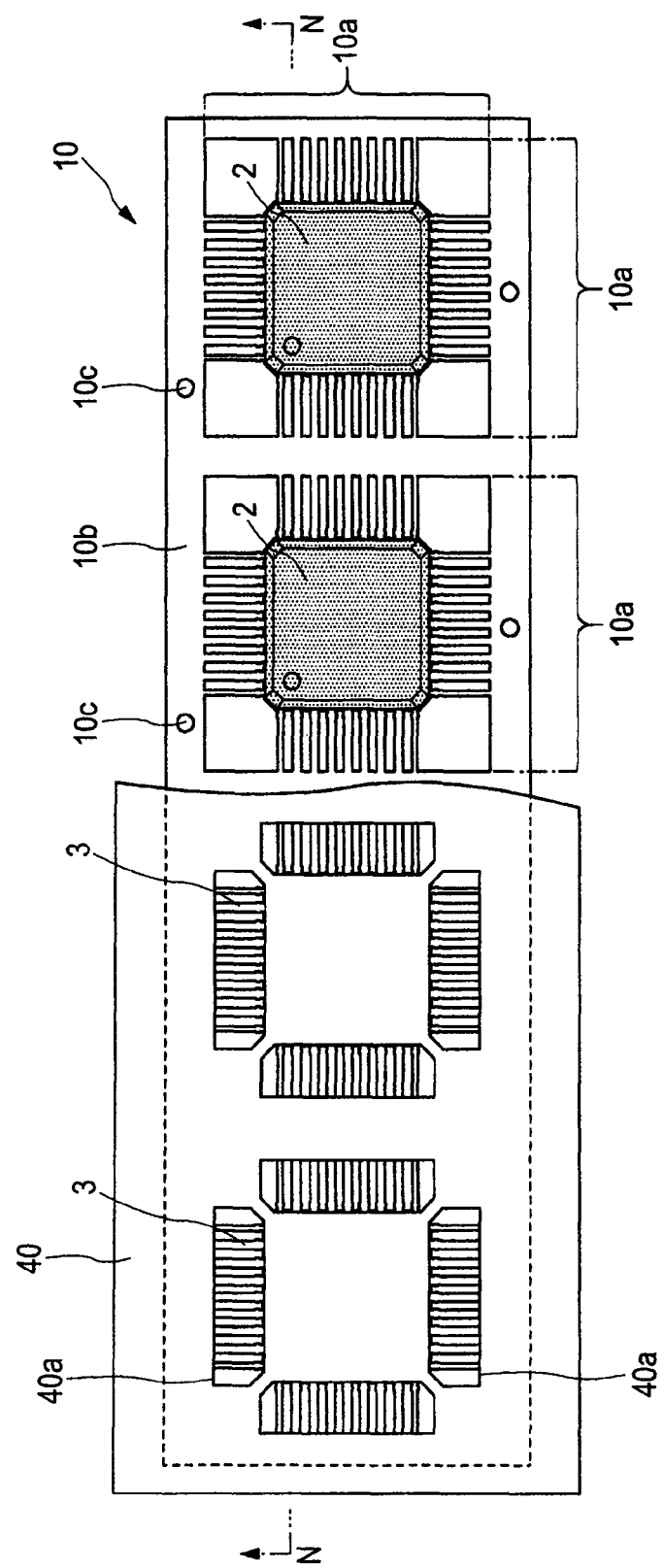
FIG. 28 is a plan view showing a state where a mask is arranged over the lead frame.
Figure 29:
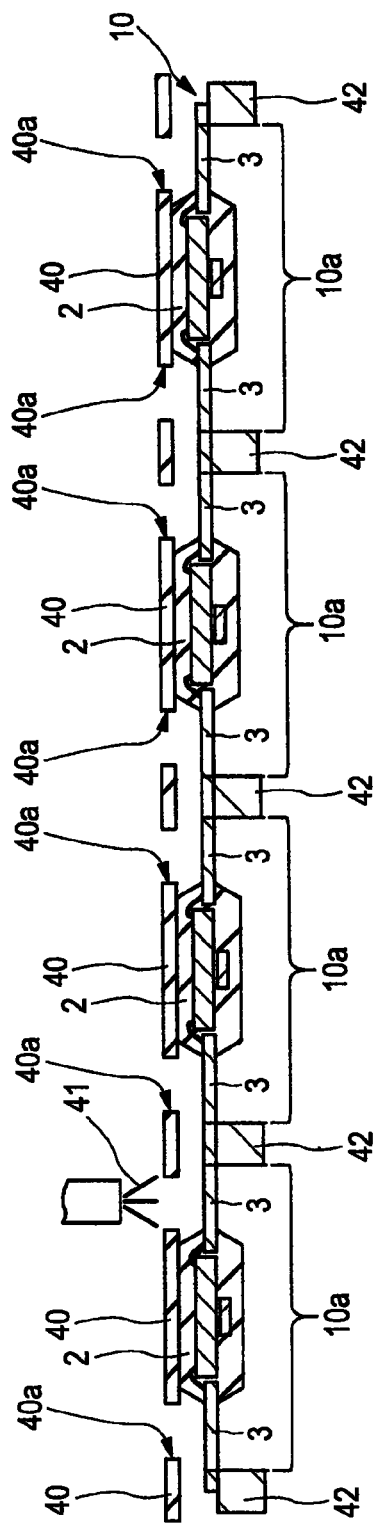
FIG. 29 is a cross-sectional view taken along line N-N in FIG. 28.

At this time, the wash water used in the present embodiment is, for example, common water. To be specific, it is tap water (city water). Also, the pressure (water pressure) is 50 to 150 kgf/cm$^2$. Moreover, according to the present embodiment, as shown in FIG. 28, a mask 40 which has an opening is prepared. With the lead 3 alone exposed from the opening 40a, namely, with the sealing body 2 being covered with the mask 40, the high-pressure water 41 shown in FIG. 29 is sprayed onto the lead 3. In this way, even if the high-pressure water 41 is sprayed onto the work piece, it does not easily damage the surface of the sealing body 2. In this regard, as shown in FIG. 29, in order not to deform the lead frame 10 by the water pressure, according to the present embodiment, the high-pressure water 41 is sprayed with a support member 42 being arranged on the side of the lower surface of the lead frame 10.

As described above, if the pressure used in the water-pressure burr removing step is made higher or wash water containing solid particles is used, the foreign matter may be removed with the water-pressure burr removing step alone. However, because of the influence of the semiconductor device being more compact, having multiple pins, or becoming thinner, the thickness or width of the lead 3 tends to be smaller. Therefore, when the lead 3 is provided with wash water having excessively high pressure or with high-pressure water 41 over a long time, the lead 3 may be deformed. If the lead 3 is deformed, when the finished semiconductor device is mounted over a mounting substrate, it may not be coupled with an electrode pad of the package substrate. Thus, packaging reliability of the semiconductor device is lowered.

On the other hand, according to the present embodiment, two kinds of washing steps (burr removing steps) are adopted. That is, the electrolytic burr removing step is performed in advance. Then, without applying stress to the lead 3, the foreign matter is removed (lifted) to some extent, and the water-pressure burr removing step is performed as the case may be. Therefore, the foreign matter adhering to the surface of the lead 3 can be removed without deforming the lead 3.

As shown in FIG. 24 or FIG. 26, a resin burr 2h may be formed over the surface of the lead 3 because of the sealing step described earlier. As described above, the resin used in the sealing step is one in which a filler is contained in a liquefied resin. The resin burr 2h is generated such that part of the liquefied resin which has oozed out from the gap between a metal mold surface and the surface of the lead 3 is hardened by heat and a filler is not contained. Therefore, as compared to the thickness of the sealing body 2, it is very thin. For example, its thickness is about 10 to 20 μm. Even when such a resin burr (foreign matter) 2h is formed over the surface of the lead 3, by performing the present washing step, the resin burr can be removed together with soot (foreign matter).

9. Plating Step: Next, a plating step S9 shown in FIG. 7 will be explained.

In the plating step, over the surface of the lead 3 exposed from the sealing body (chip sealing resin) 2e, a plating film (layer) 8 (see FIG. 31) is formed.

Figure 30:
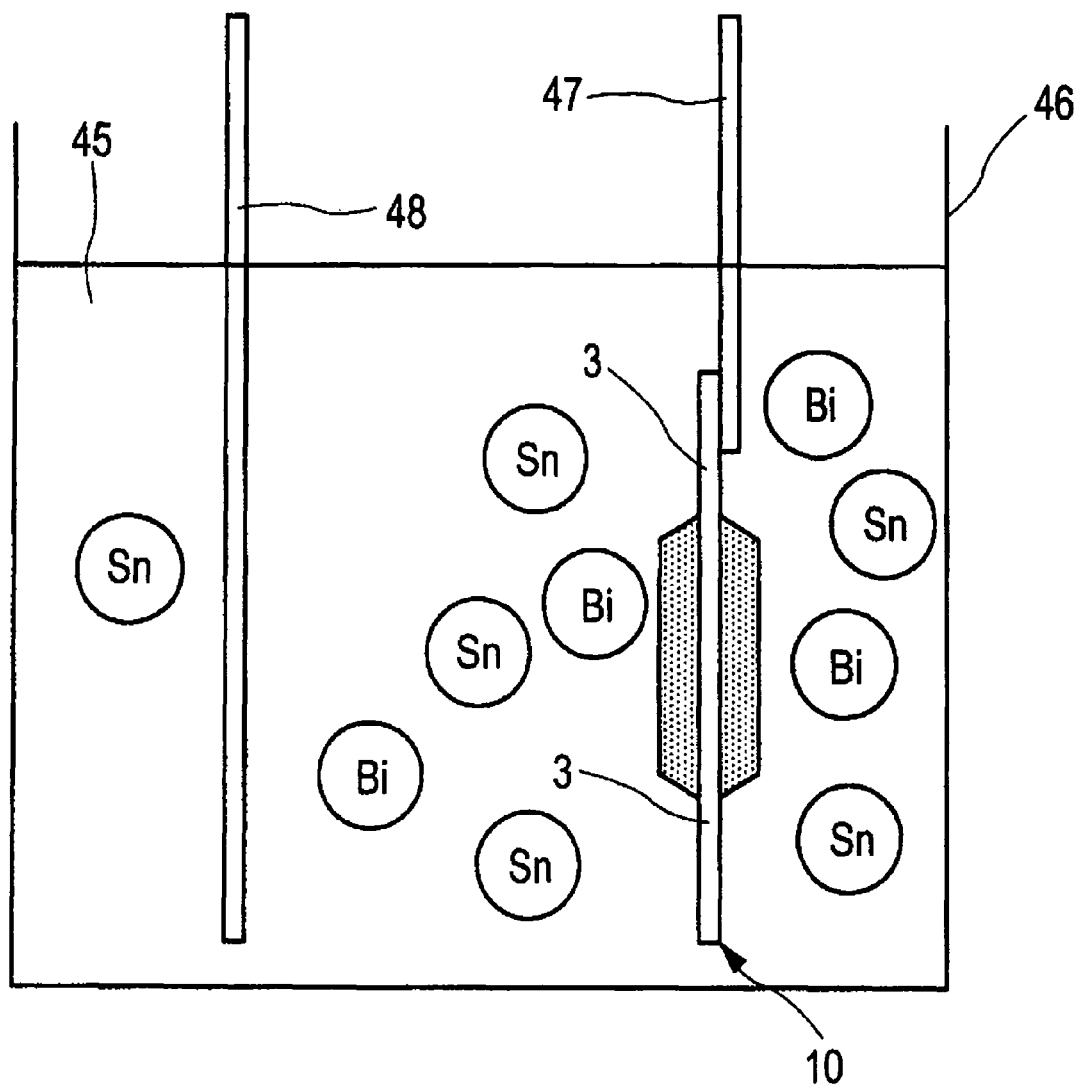
FIG. 30 is a cross-sectional view illustrating a plating step according to the present embodiment.

First, as shown in FIG. 30, a work piece (in the present embodiment, the lead frame 10 shown in FIG. 26) is placed in a plating tub 46 containing plating liquid 45. In this regard, the work piece is coupled to a negative pole 47 in the plating tub 46. The plating film 8 (see FIG. 31) is formed over the work piece (surface of the lead 3) by applying a DC voltage between the negative pole 47 and a positive pole 48 similarly arranged in the plating tub 46. That is, according to the present embodiment, the plating film 8 is formed by what is called the electrolytic plating method.

The plating film 8 of the present embodiment comprises what is called a Pb-free solder that does not substantially contain Pb (lead). For example, it may be Sn(tin) only, Sn(tin)-Bi(bismuth) or Sn(tin)-Ag(silver)-Cu(Cu), etc. In this regard, the Pb-free solder is one containing 0.1 wt % or less of lead (Pb). This content is defined as a standard of the RoHs (Restriction of Hazardous Substances) directive.

For this reason, the plating liquid 45 used in the present plating step contains, for example, metal salt, such as $Sn^{2+}$ or $Bi^{3+}$. In the present embodiment, as an example of the Pb-free solder plating, an alloying metal plating of Sn—Bi will be explained. However, Bi can be replaced with metals such as Cu and Ag.

When a voltage is applied between a positive pole 48 and a negative pole 47 shown in FIG. 30, electricity flows between the two electrodes (between the positive pole 48 and the negative pole 47). At a predetermined ratio, $Sn^{2+}$ and $Bi^{3+}$ in the plating liquid 45 are deposited over the surface of the lead 3, and the plating film 8 is formed.

In this regard, when forming the plating film 8 by the electrolytic plating method as in the present embodiment, the plating film 8 is formed such that the negative pole 47 is electrically coupled with a conductive member, and metal salt is deposited over the surface of the conductive member exposed to the plating liquid 45. According to the present embodiment, as shown in FIG. 26, the residual resin 2g has been removed before the present plating step performed over the side surface of the inner lead 3a. Moreover, as described above, by performing the washing step before the plating step, the foreign matter adhered to the surface of the lead 3 is removed. Therefore, according to the present plating step, the plating film 8 (see FIG. 31) is also formed tightly in contact with the surroundings (for example, opposing surfaces (cut surfaces) of the adjacent projections 3f) of the projection 3f shown in FIG. 26. To be specific, since the residual resin 2g around the projection 3f has been removed, the projection 3f is covered with the plating film 8.

The lead frame 10 of the present embodiment has, for example, a plating film containing Ni over a surface of a base sheet containing copper. In the above dam bar cutting step, when the dam bar is cut, at the cut surface, the base sheet is exposed. Thus, after the base sheet has been exposed, the corrosion of the lead 3 progresses from the exposed surface, degrading the reliability of the semiconductor device.

However, according to the present embodiment, as described above, the plating film 8 can reliably be formed over the cut surface of the dam bar. Therefore, the corrosion of the lead 3 is prevented and the reliability of the semiconductor device can be improved.

Further, according to the present embodiment, a portion around the projection 3f can be covered with the plating film 8 irrespective of the kind of material forming the lead frame 10. Therefore, the present embodiment is applicable to various modifications, other than the above materials, such as a material called 42 Alloy, which is an alloy of iron (Fe) and nickel (Ni), a copper frame over which a plating film of Ni is not formed, etc.

10. Mark Step: Next, a mark step S10 shown in FIG. 7 will be explained.

According to the mark step, for identifying a first lead 3 of the leads 3 over an upper surface 2a of the sealing body 2, a mark (alignment mark, position identifying mark) 2d (see FIG. 1) is formed.

Figure 31:
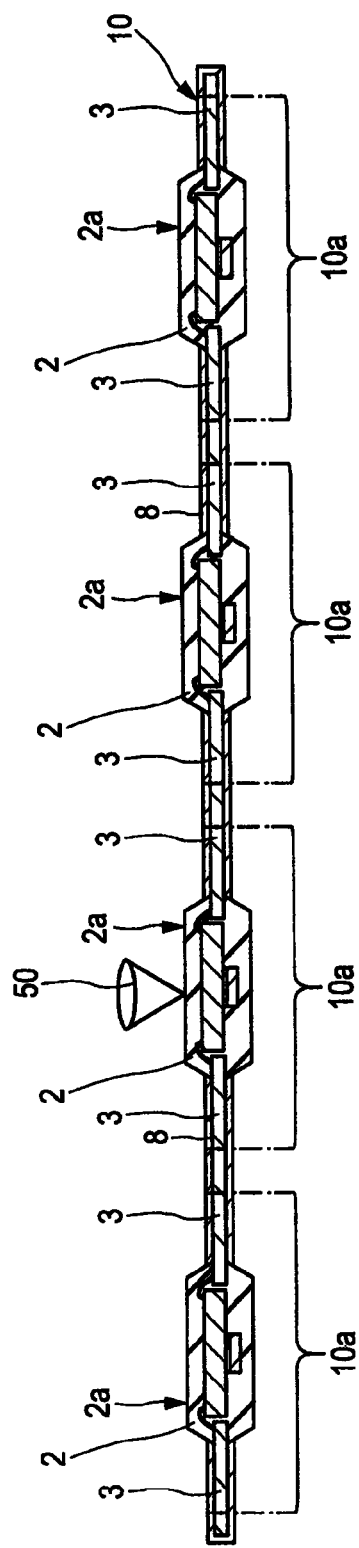
FIG. 31 is a cross-sectional view illustrating a mark step according to the present embodiment.

According to the present mark step, as shown in FIG. 31 for example, part of the sealing body 2 is removed by irradiating a laser beam 50 on the side of the upper surface 2a of the sealing body 2, and the mark 2d (see FIG. 1) is formed. The conditions of the laser beam 50 used in the present embodiment are the same as those of the laser beam 31 irradiated in the laser irradiation step described above. For example, the value of an electric current is 18 A, the scanning speed is 100 mm/s, the frequency is 50 kHz, and the output power is 32 W. Therefore, the mark 2d (see FIG. 1) can be formed by using, for example, the laser irradiation device 30 shown in FIG. 25.

As in the present embodiment, when the mark 2d (see FIG. 1) is formed by irradiating the laser beam 50, part of the removed sealing body 2 may become foreign matter and scatters around. However, according to the present embodiment, the mark step is performed after the plating step, which can prevent the degradation of the adhesion of the plating film 8 to the lead 3 and wettability thereof.

Moreover, according to the present mark step, an alignment mark is formed. In addition to this, however, it is possible to form an identification mark peculiar to a product, etc.

According to the present embodiment, an embodiment of performing the mark step after the plating step has been explained. However, it can be performed together with the above resin removing step in the dam (laser irradiation step). That is, in the resin removing step in the dam (laser irradiation step) S7, the sealing body (resin in the dam) 2f formed in the resin accumulation region of the lead frame 10 is removed and, at the same time, the mark (alignment mark, position identifying mark) 2d (see FIG. 1) is formed. As in the present embodiment, by allowing the conditions of the laser beam 31 and those of the laser beam 50 to be the same, processing can be carried out by a single laser irradiation device 30 (see FIG. 25), for example.

By performing the present mark step and the laser irradiation step together, the manufacturing process can be simplified. Further, when forming the mark 2d, even when the foreign matter is dispersed, the foreign matter can be removed in the subsequent washing step. Therefore, degradation of the adhesion to the lead 3 and wettability of the plating film 8 can be prevented. Moreover, in this case, the foreign matter is prevented from adhering to the surface of the plating film 8. Therefore, the above procedure is preferable from the aspect of being capable of preventing the degradation of reliability to be caused by the foreign matter adhered to the plating film 8.

11. Lead Forming Step: Next, a lead forming step S11 shown in FIG. 7 will be explained.

In the lead forming step, first, a joint of the leads 3 coupled to a frame body (frame part) 10b of the lead frame 10 is cut off. Then, the lead 3 is formed by applying bending processing.

Figure 32:
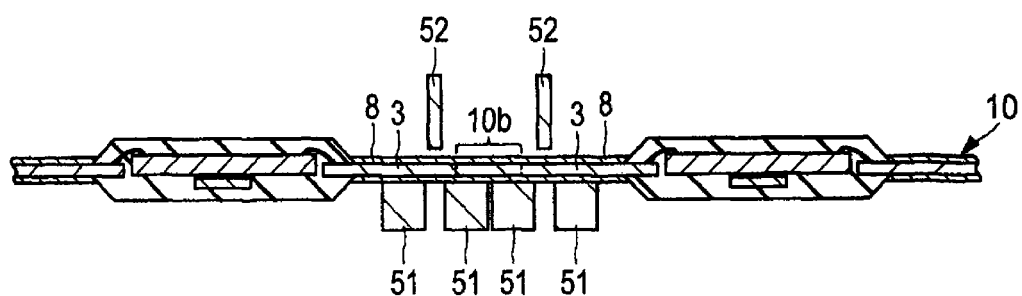
FIG. 32 is a cross-sectional view illustrating a lead cutting step according to the present embodiment.
Figure 33:
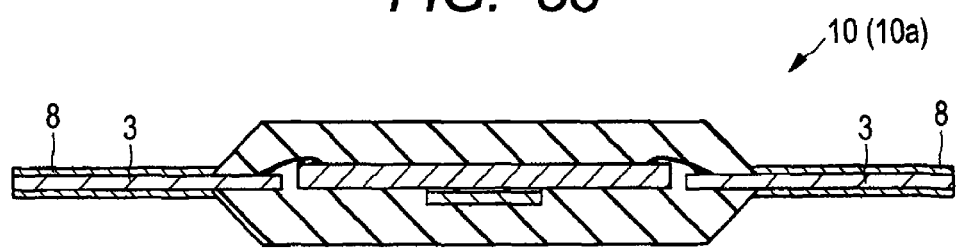
FIG. 33 is a cross-sectional view showing a state of the lead cut in the lead cutting step.
Figure 34:
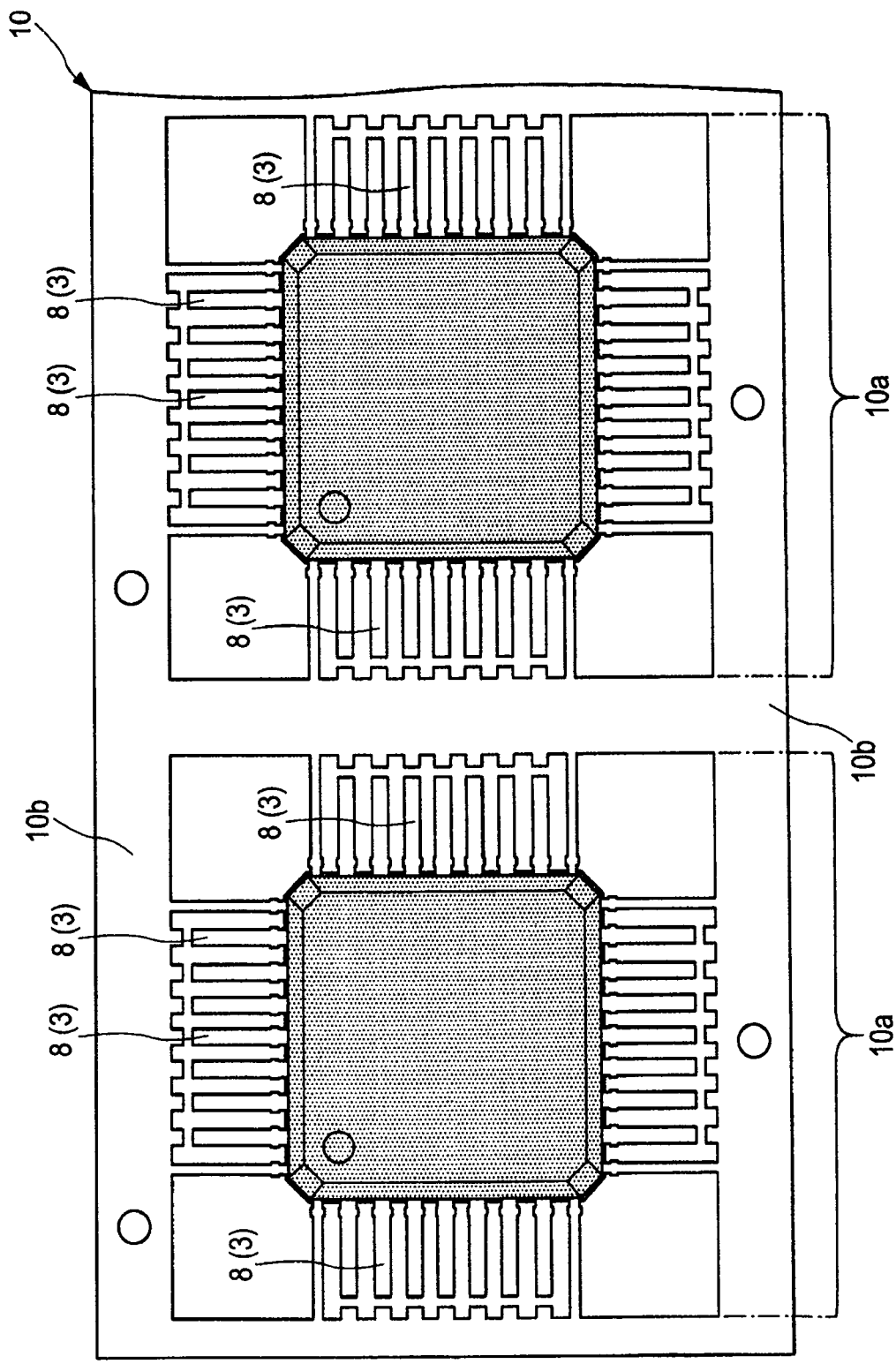
FIG. 34 is a plan view showing a state of the lead cut in the lead cutting step.

First, as shown in FIGS. 32 to 34, at the joint, the leads 3 being one piece and coupled to the frame body 10b, respectively, are cut and turned into independent members, respectively (lead cutting step). In the lead cutting step, for example, as shown in FIG. 32, the lead 3 is cut by arranging a die (support member) 51 on the lower surface side of the lead frame 10 and a punch (cutter) 52 on the upper surface side, respectively, and pressing them down. The punch 52 is arranged at a position which overlaps with a gap formed in the die 51. When the punch 52 is pressed down toward the gap of the die 51, the lead 3 is cut. Thus, as shown in FIG. 33, the end portion of the lead 3 cut by the press processing has a substantially flat cut surface. At the cut surface, the lead 3 is exposed from the plating film 8.

Figure 35:
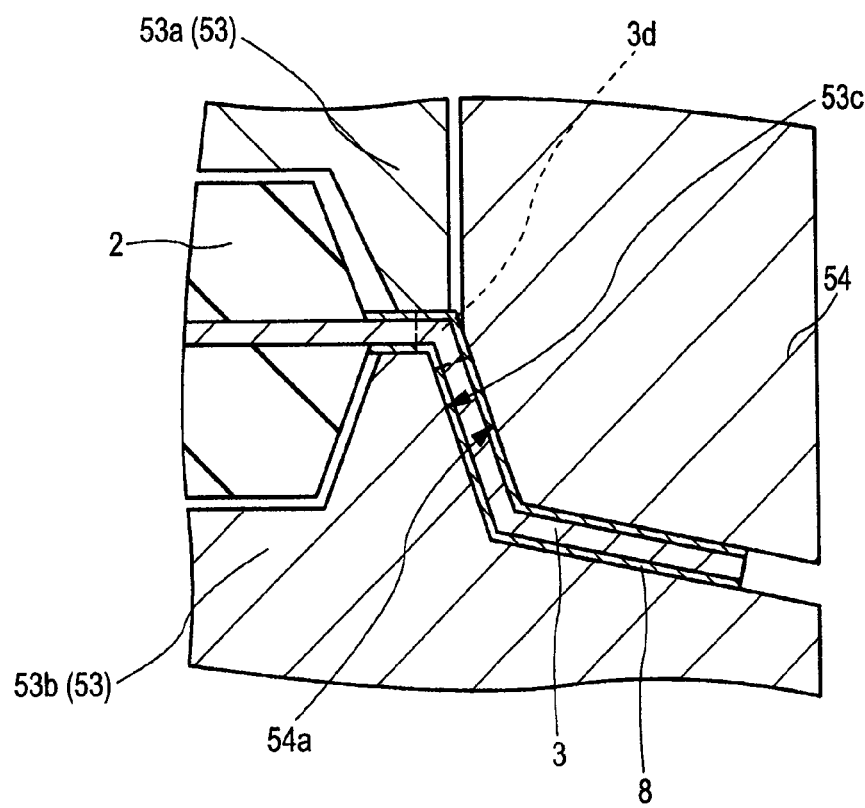
FIG. 35 is a cross-sectional view illustrating a bending step according to the present embodiment.
Figure 36:
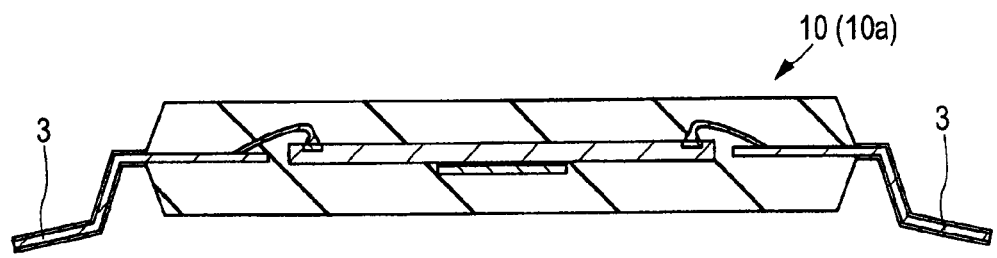
FIG. 36 is a cross-sectional view showing a state where the bending step is performed.
Figure 37:
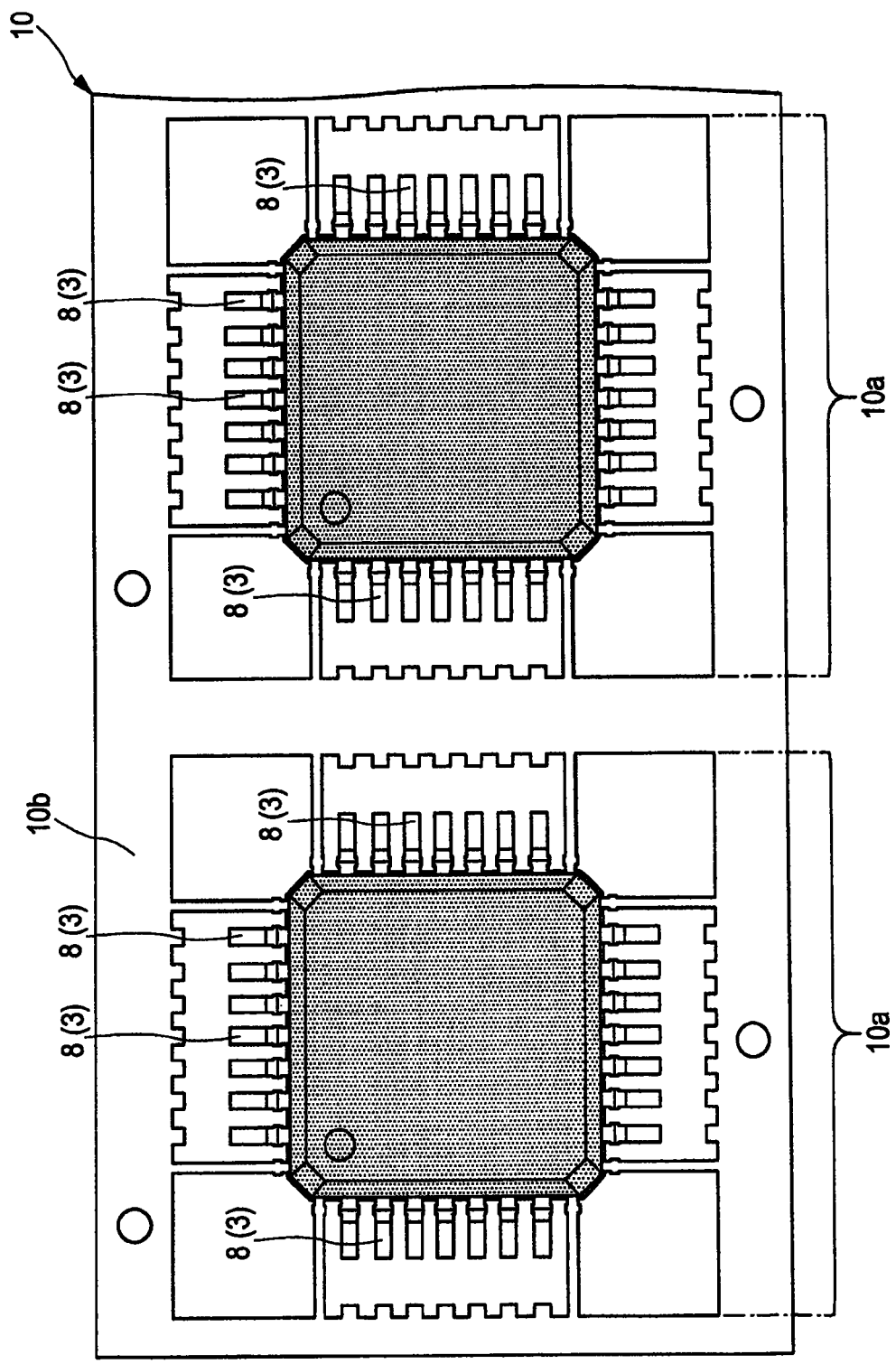
FIG. 37 is a plan view showing a state where the bending step is performed.

Next, as shown in FIGS. 35 to 37, the leads 3 which have been cut are bent and formed (bending step). According to the present embodiment, the lead is formed into the shape of a gull wing, for example.

In the bending step, for example, as shown in FIG. 35, the lead 3 is sandwiched and fixed by a die (support member for bending, support member) 53. The die 53 comprises: a die (a first support member)53a arranged on an upper surface side of the lead 3; and a die (a second support member) 53b arranged on a lower surface side of the lead 3. According to the present embodiment, as shown in FIG. 35, at a position which overlaps with the projection 3f of the lead 3, the lead is sandwiched by the dies 53a and 53b. Moreover, corresponding to the shape into which the lead 3 is processed, an opposing surface 53c of the die 53b to the lead 3 is formed (in the present embodiment, into the gull wing shape).

Thus, from the upper surface side of the lead 3 fixed by the die 53, pressing is applied by a punch (pressing member) 54 and bending is performed. The opposing surface 54a of the punch 54 to the lead is formed according to the shape of the opposing surface 53c of the die 53b to the lead 3. When the punch 54 is pressed down toward the die 53b, as shown in FIG. 35, the lead 3 is bent and is formed into a predetermined shape (a gull wing shape, in the present embodiment)

In this regard, according to the present embodiment, as shown in FIG. 3, the bending is performed using the projection 3f as a bending point. The reason is as follows. That is, as described above, at the lead 3 exposed from the sealing body 2, using the projection 3f having the largest width as the bending point, the lead 3 is bent. In this way, it is easier to stabilize (make uniform) the shape of the lead 3 to be formed. Further, from the aspect of reducing the mounting area of the semiconductor device, the point at which the lead 3 is bent is preferably as close as possible to the sealing body 2.

Thus, from the aspect of stabilizing the shape of the lead 3 and the aspect of reducing the mounting area of the semiconductor device, it is preferable to perform bending with the projection 3f as the bending point. However, for example, when the residual resin 2g as shown in FIG. 24 remains around the projection 3f, the following problems arise. That is, the stress during the bending reaches the residual resin 2g and destroys the residual resin 2g. When the residual resin 2g is destroyed, a piece of the destroyed residual resin 2g is likely to come off. When the piece of the residual resin 2g having come off falls, for example, on the die 53b, it may cause the lead 3 to be unfavorably shaped when forming a next lead. Further, when the come-off piece adheres to the lead 3, it is turned into foreign matter when the semiconductor device is mounted, and causes poor packaging of the semiconductor device.

However, according to the present embodiment, as described above, the residual resin 2g around the projection 3f can be reliably removed, not causing the poor shape of the lead 3 and the poor packaging of the semiconductor device.

In this bending step, from an aspect of stabilizing the bending, processing is applied with the length of the lead 3 being longer than the required length. That is, the length of the lead 3 shown in FIGS. 36 and 37 is longer than that of the lead 3 of the semiconductor device 1 (see FIG. 1) finally obtained.

Figure 38:
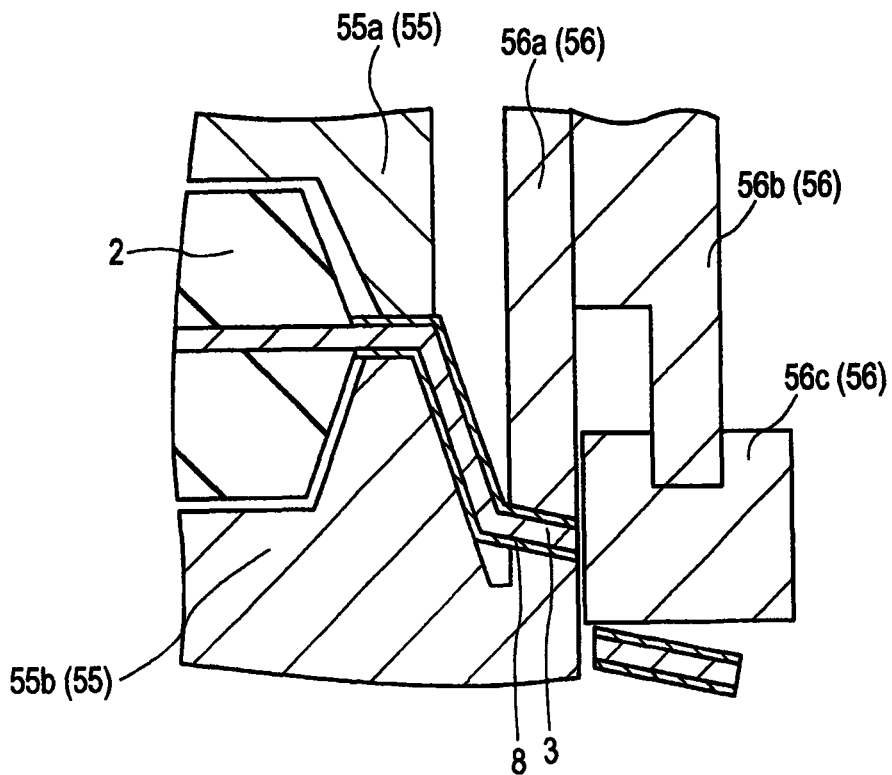
FIG. 38 is a cross-sectional view illustrating a lead-tip cutting step according to the present embodiment.
Figure 39:
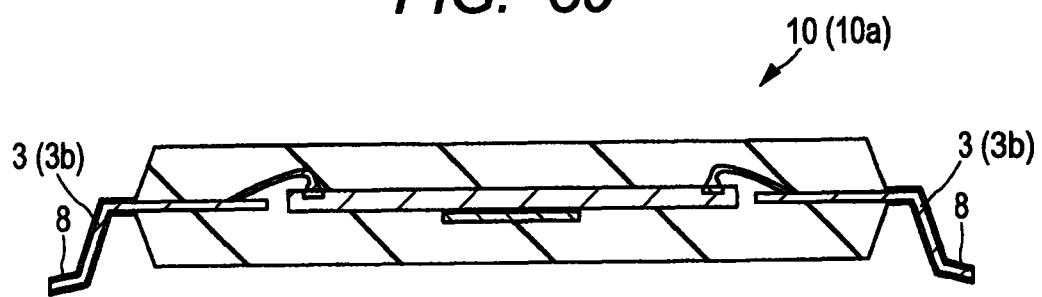
FIG. 39 is a cross-sectional view showing a state where the lead-tip cutting step is performed.
Figure 40:
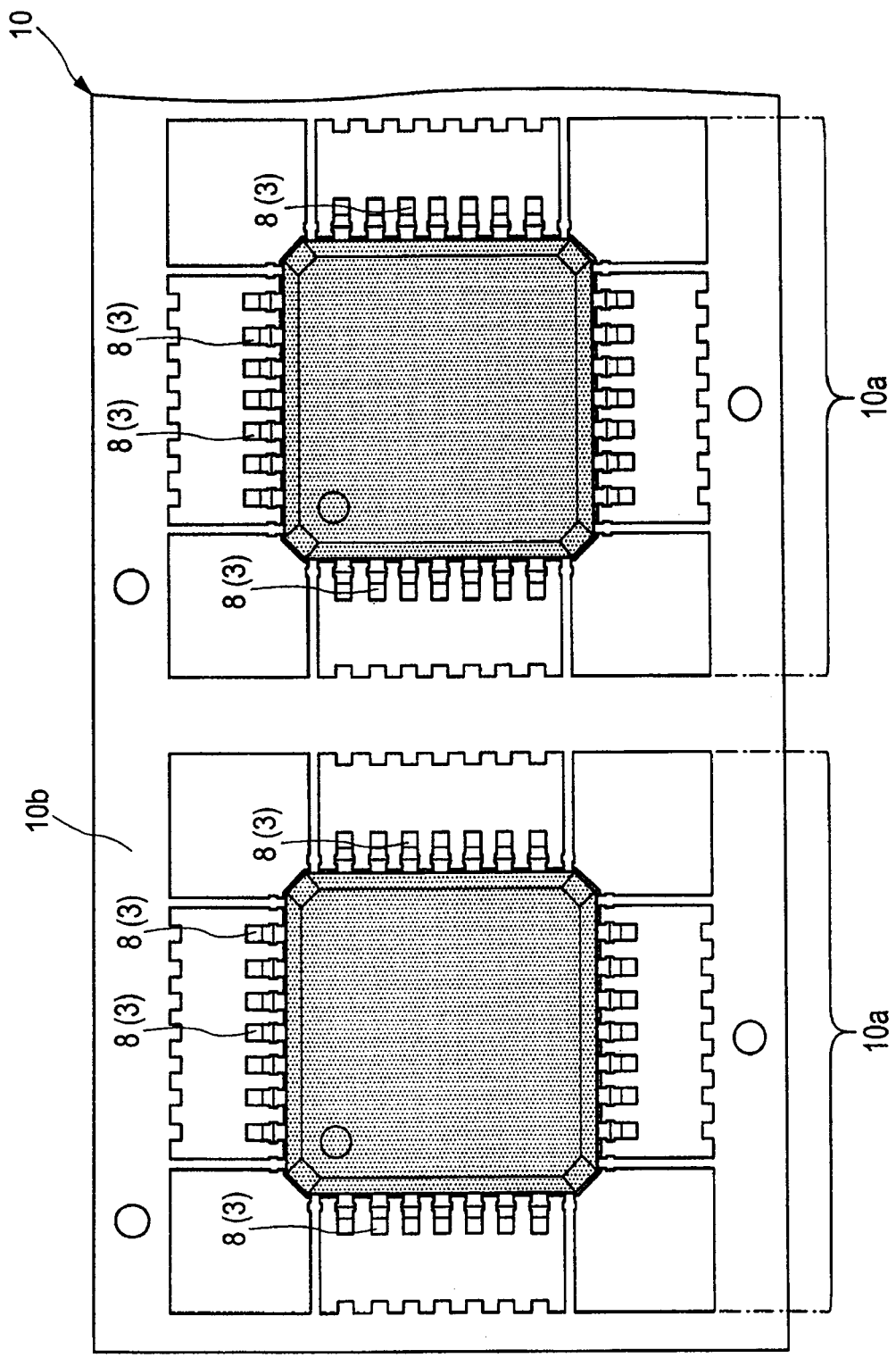
FIG. 40 is a plan view where the lead-tip cutting step is performed.

Therefore, as shown in FIGS. 38 to 40, a tip of the lead (outer lead 3b) is cut, and the length of the lead 3 is shortened (lead-tip cutting step).

In the lead-tip cutting step, for example, as shown in FIG. 38, the lead 3 is sandwiched and fixed by a die (support member for bending, support member) 55. The die 55 comprises: a die (first support member) 55a arranged over an upper surface side of the lead 3; and a die (second support member) 55b arranged on a lower surface side of the lead 3. Thus, from the upper surface side of the lead 3 fixed by the die 55, the tip of the lead 3 is pressed by a punch (cutter) 56 and cut. The punch 56 is arranged at a position overlapping with the die 55b. The punch 56 comprises: a pressing part 56a which sandwiches the lead 3 and fastens it, and a movable part 56b arranged outside of the pressing part 56a with respect to the sealing body 2. The cutter 56c is attached to the tip of the movable part.

Even in the lead-tip cutting step, the cutting is performed by the press processing. Therefore, as shown in FIG. 39, the end portion of the lead 3 having been cut has a substantially flat cut surface. The lead 3 is exposed from the plating film 8 at the cut surface.

12. Separating-lead-into-pieces step: Next, a separating-lead-into-pieces step S12 shown in FIG. 7 will be explained.

Figure 41:
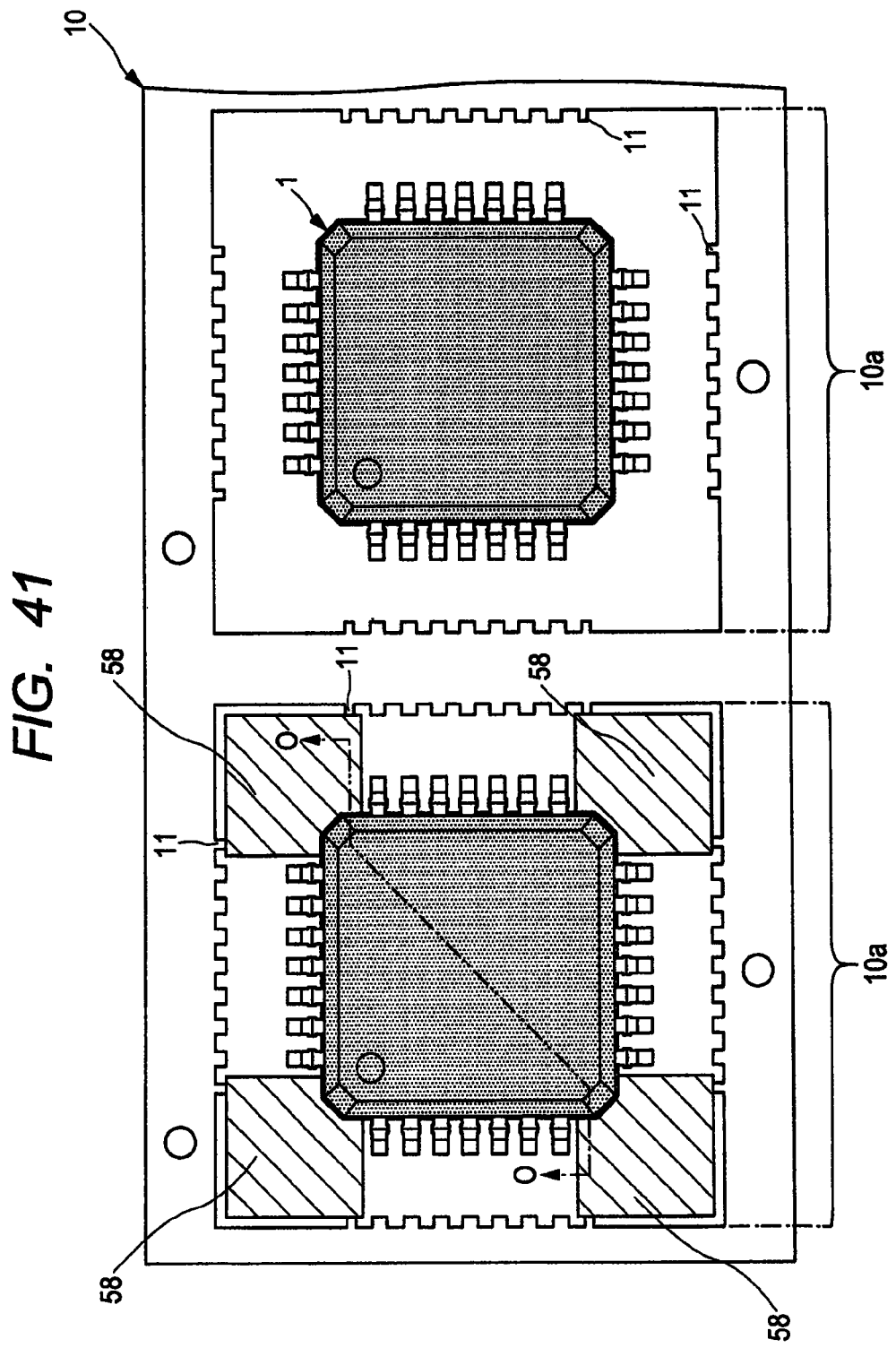
FIG. 41 is a plan view illustrating a step of separating the lead into pieces according to the present embodiment.
Figure 42:
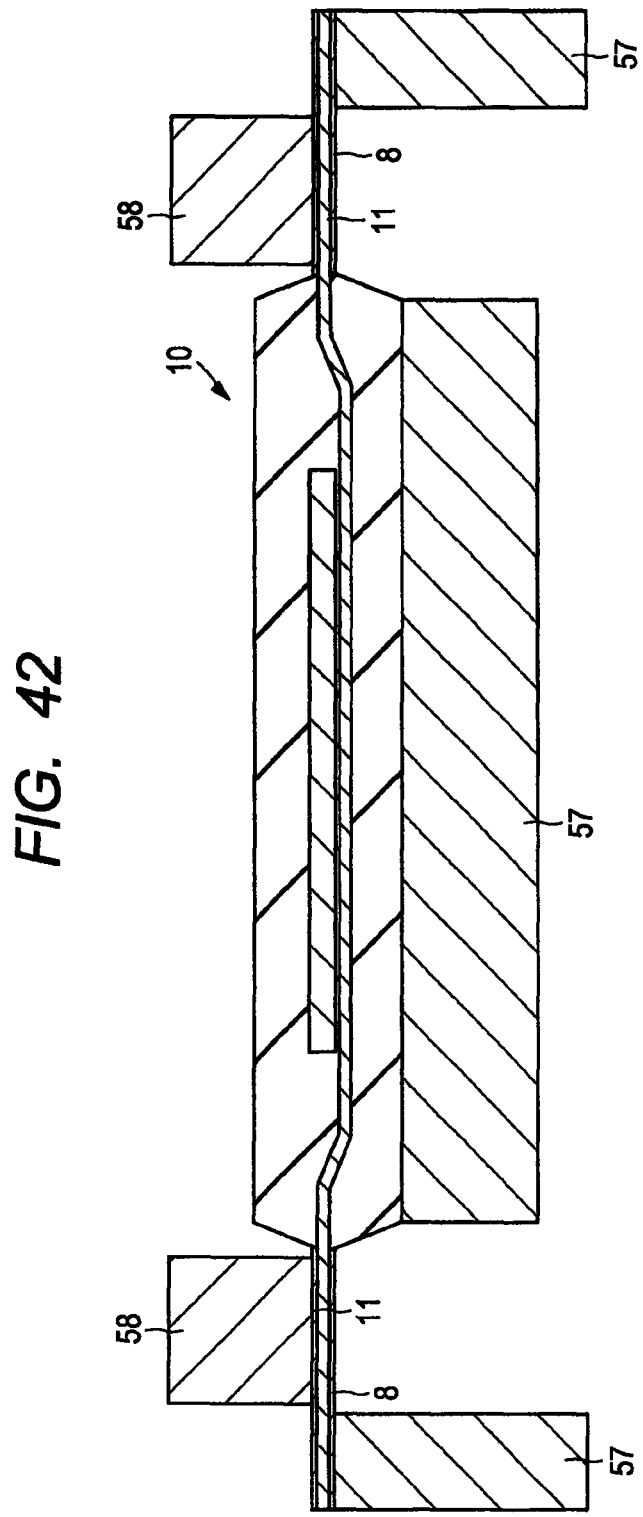
FIG. 42 is a cross-sectional view taken along line 0-0 in FIG. 41.

In the present step, a suspending lead 11 coupled to a frame body (frame part) 10b is cut, and is separated into pieces for each device region 10a and the semiconductor device 1 is obtained. As shown in FIGS. 41 and 42, for example, a means for cutting the suspending lead 11 cuts the suspending lead 11 by arranging a die (support member) 57 on the lower surface side and a punch (cutter) 58 on the upper surface side of the lead frame 10, respectively, and performing pressing. The punch 58 is arranged at the position which overlaps with the gap formed in the die 57. When the punch 58 is pressed down toward the gap in the die 57, the suspending lead 11 is cut.

According to the present embodiment, in the above dam bar cutting step, the sealing body (resin in the dam) 2f, as shown in FIGS. 21-23, formed between the adjacently disposed suspending leads 11 is removed. However, the timing with which the sealing body (resin in the dam) 2f formed between the suspending leads 11 is not limited to this, and it can be cut, in the separating-lead-into-pieces step, together with the suspending lead 11. In such a case, in each of the above laser irradiation step, washing step, plating step, mark step, and lead forming step, support strength by the suspending lead 11 can be improved.

The process of manufacturing the semiconductor device 1 is finished by performing each of the above steps.

<Electronic Device> Next, an electronic device (electronic unit) in which the semiconductor device 1 described in the present embodiment is mounted will be described.

Figure 43:
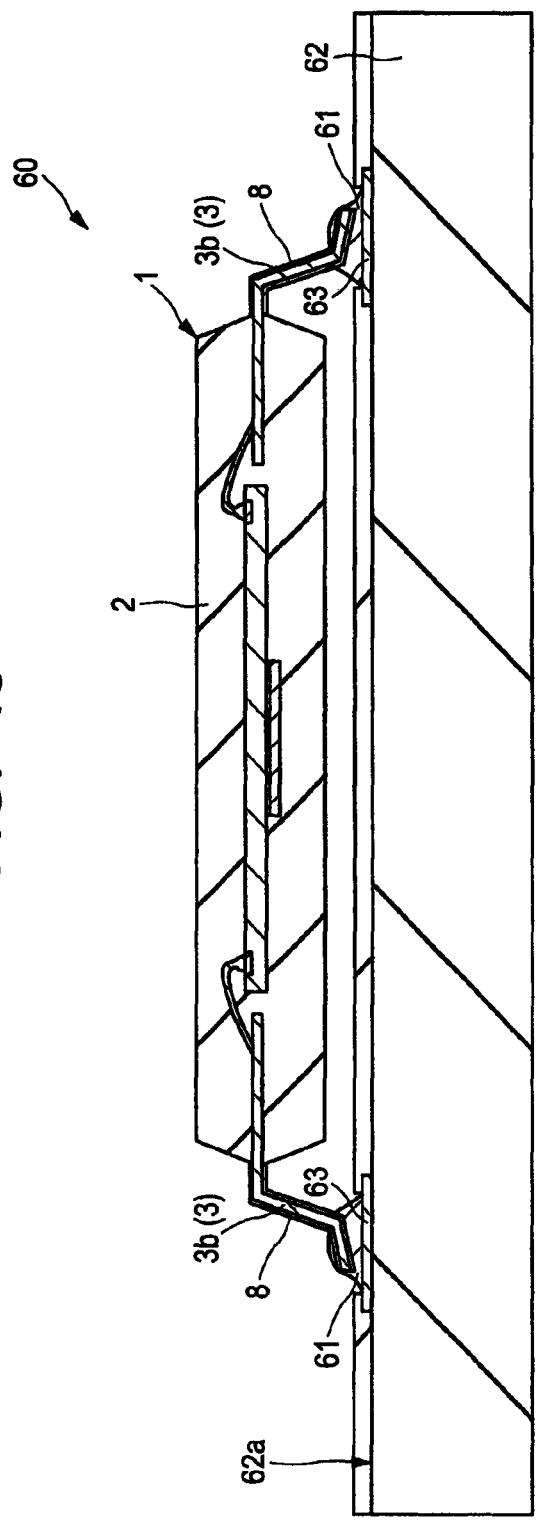
FIG. 43 is a cross-sectional view showing an electronic device on which the semiconductor device of FIG. 2 is mounted.

The electronic device 60 of the present embodiment can be obtained by mounting the completed semiconductor device 1 over a mounting substrate 62 through a bonding material 61. In this regard, over an upper surface (main surface, surface) 62a of the mounting substrate 62, as shown in FIG. 43, a plurality of electrode pads (lands) 63 are formed. Over the surfaces thereof, the bonding material 61 is formed (arranged) in advance (before mounting the semiconductor device 1). In this regard, the bonding material 61 to be used in the present embodiment comprises what is called a Pb-free solder which is an Sn metal excluding lead (Pb) (to be specific, the amount of lead contained is substantially 1% or less). In order that the lead 3 (outer lead 3b) of the semiconductor device 1 may come in contact with the bonding material 61, the semiconductor device 1 is arranged over the upper surface 62a of the mounting substrate 62, heat is applied, and the bonding material 61 is melted. As a result, the melted bonding material 61 becomes wet and moves up on the surface of the lead 3. When the bonding material 61 is solidified again, the lead 3 of the semiconductor device 1 becomes electrically coupled to the electrode pad 63 of the mounting substrate 62. Thus, the electronic device 60 is completed.

In this regard, according to the present embodiment, as described above, the plating film 8 is formed over the surface of the lead 3 (outer lead 3b) exposed from the sealing body (chip sealing resin) 2. Therefore, the solder wettability is good, and it is possible to improve the packaging strength of the semiconductor device 1. Moreover, according to the present embodiment, the resin in the dam is removed in advance. Therefore, after mounting the semiconductor device to the mounting substrate 62, the resin in the dam may not peel off the surface of the lead. Since the resin in the dam does not become foreign matter and scatter inside the electronic device, the reliability of the electronic device 60 can be improved. Furthermore, according to the present embodiment, by removing the resin in the dam, not only over the surface of the exposed lead 3 but also over the cut surface of the projection 3f (see FIG. 3) formed by cutting the dam bar 12 (see FIG. 9), the plating film 8 is formed. Therefore, corrosion of the lead 3 can be suppressed and the reliability of the semiconductor device 1 and the electronic device 60 can be improved.

The invention made by the present inventors has been concretely explained above on the basis of the embodiment but, needless to say, this invention is not limited to the above embodiment and it is possible to change it in the range that does not deviate from a gist of the invention.

For example, in the lead frame preparation step S1 according to the above embodiment, the lead frame 10 in which the plating film 13 of silver is formed over part of the inner lead 3a is prepared. Then, after the sealing step, the plating film (sheath plating film) 8 is formed over the outer lead 3b. However, it may be possible to use a lead frame (what is called a tip-attached plating article) over which a plating film containing palladium (Pd) is formed in advance all over each part (inner lead 3a, outer lead 3b, chip mounting part 5, etc.). If it is a tip-attached plating article, in a stage of preparing the lead frame, the plating film is also formed over the outer lead. Therefore, it is not necessary to perform the plating step after the washing step, simplifying the manufacturing process. However, in the case of the tip-attached article, the plating is not basically applied after the washing step. Therefore, a plating film is not formed over the cut surface of the projection (residual dam bar) 3f formed by cutting the dam bar 12. Therefore, as compared to the embodiment described earlier, corrosion tolerance of the outer lead may be deteriorated.

Moreover, in the lead frame preparation step S1 according to the above embodiment, preparation of the lead frame 10 formed by press processing has been explained. However, a lead frame formed by an etching method may be used.

Figure 44:
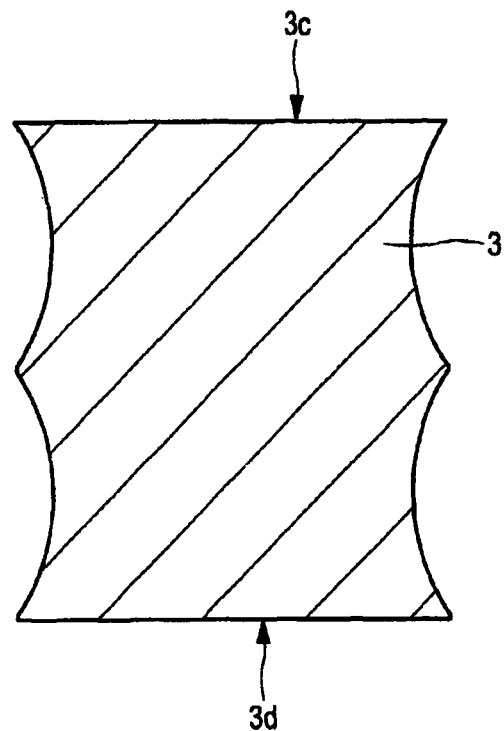
FIG. 44 is an enlarged cross-sectional view illustrating a lead formed by an etching method.

In addition, when forming a lead frame by the etching method, though not shown, masks are arranged above and below the lead frame and etching is applied to a portion exposed from an opening of the mask. Therefore, as shown in FIG. 44, the side surface of the lead 3 becomes curved. In other words, the flatness of the side surface is lower than that of the upper surface 3c or the lower surface 3d. Therefore, when the resin in the dam is formed in this portion, in the laser irradiation step S7, according to the method in which the laser beam is irradiated perpendicularly to the upper surface (or lower surface) of the lead frame, part of the lead frame may disturb the irradiation of the laser beam. Therefore, as shown in FIGS. 24 and 25, by irradiating the laser beam 31 such that it has a predetermined angle with respect to the surface (side surface) of the lead 3, the elimination can be easily performed even if the resin in the dam is adhered to the curved side surface.

Moreover, in the die bonding step S2 according to the embodiment described above, an explanation has been given to what is called a small tab configuration in which the size of an external outline of the chip mounting part 5 is smaller than that of an external outline of the semiconductor chip 4. However, a lead frame of what is called a large tab configuration in which the size of the external outline of the chip mounting part 5 is larger than that of the external outline of the semiconductor chip 4 may be used. At this time, the entire rear surface 4b of the semiconductor chip 4 is covered with the chip mounting part 5. Moreover, the adhesion between the lead frame of copper and the sealing body 2 is lower than the adhesion between the semiconductor chip 4 of silicon and the sealing body 2. Therefore, it is preferable that a hole is formed in the chip mounting part 5 allowing part of the sealing body 2 to be in contact with part of the rear surface 4b of the semiconductor chip.

Moreover, in the die bonding step S2 according to the embodiment described above, the semiconductor chip 4 is mounted over the chip mounting part 5 through a paste-like die bonding material 6. However, an adhesive layer may be applied to the rear surface 4b of the semiconductor chip 4 in advance, and the semiconductor chip 4 may be mounted over the chip mounting part 5 through the adhesive layer.

Moreover, in the wire bonding step S3 according to the embodiment described above, as the conductive member 7, a wire containing gold (Au) is used. However, a wire containing copper (Cu) or aluminum (Al) may be used.

Moreover, in the wire bonding step S3 according to the embodiment described above, the wire is used as the conductive member 7. However, the electrode pad 4d of the semiconductor chip 4 may be electrically coupled to the lead through a bump electrode. In this case, what is called flip-chip packaging is performed in which the semiconductor chip is arranged over the lead such that a main surface of the semiconductor chip faces the upper surface of the lead.

Moreover, in the wire bonding step S3 according to the embodiment described above, the wire is coupled by using the positive bonding method. However, the wire may be coupled by what is called a reverse bonding method in which the other part of the wire is coupled to the semiconductor chip 4 after coupling part of the wire to the lead 3. In this case, it is preferable that a bump electrode (projecting electrode, stud bump) is formed over the electrode pad of the semiconductor chip in advance, and the other part of the wire is coupled to the bump electrode.

Moreover, in the dam bar cutting step S6 according to the embodiment described above, part of the dam bar is removed by using the cutter (metal mold, punch) 26. However, a laser may be used instead. As one example, there is a means to remove not only the resin in the dam but also the dam bar 12 by using the laser 31 used during the resin removing step S7 in the dam in an assembly flow of FIG. 7. Thereby, one step (dam bar cutting step S6) can be eliminated. That is, since a manufacturing TAT (turnaround time) can be shorter, the manufacturing cost of a semiconductor device can be reduced. However, when removing the dam bar using a laser beam, compared with a means to remove the dam bar with use of the cutter 26, a width (volume) of the projection (residual dam bar) 3f tends to be uneven. Therefore, for example, in the case of the semiconductor device (QFP) 1 according to the embodiment described above, in the lead forming process S11, bending stress generated in the lead 3 (outer lead 3b) becomes uneven, causing the shape of the lead to be formed unstably. Because of the above reason, in the manufacturing method of the semiconductor device (QFP) 1 according to the embodiment described above, it is preferable to remove the dam bar 12 using the cutter 26.

Moreover, in the dam bar cutting step S6 according to the embodiment described above, the cutter 26 is brought into contact with the dam bar 12 such that part of the cutter 26 comes into contact with the sealing body (resin in the dam) 2f, and the dam bar is removed. However, a means to cut two members (the resin in the dam and the dam bar 12) by one cutting process does not have to be used. An alternative process may be such that a cutter for the dam bar and a cutter for the resin in the dam are prepared in advance, and each member may be removed in two steps. Thus, as compared to the means for cutting the member containing different materials with one cutter, it becomes easier to suppress wearing of the cutter or to control the progress of the wearing.

Moreover, according to the resin removing step S7 in the dam of the embodiment described above, the means for changing the direction of the laser beam 31 through the condensing lens has been explained. However, such a means may be adopted that the lead frame is placed right below the laser irradiation device 30, the side surface of the lead frame (lead) 10 is leaned to the direction of radiation of the laser beam, and the laser 31 is irradiated in this status. In this case, since there is no need to provide the condensing lens 34 in the laser irradiation device 30, an economical laser irradiation device 30 can be used and the cost of the semiconductor device can be reduced.

Moreover, in the washing step S8 of the embodiment described above, application of the two kinds of washing steps (burr removing steps) are described. However, when the amount of the foreign matter (soot) adhered to the surface of the lead 3 is small or when an associative strength between the foreign matter and the lead 3 is weak, the water-pressure burr removing step alone may be applied to remove the foreign matter. Thereby, the present washing step can be simplified. Moreover, as shown in FIG. 24, when the resin burr 2h is formed over the surface of the lead, in the washing step S8 of the above embodiment, removal of the resin burr 2h has been explained. However, the resin burr 2h may be removed in the previous laser irradiation step S7. In this case, as described above, since the thickness of the resin burr 2h is smaller than that of the resin in the dam, the adhesion of the resin burr 2h and the lead 3 is also lower than that of the residual resin 2g and the lead 3. Therefore, it is preferable that the conditions of the laser beam to be used when removing the resin burr 2h are different from the conditions of the laser beam used when removing the residual resin. For example, it is preferable that the output power of the laser beam used when removing the resin burr is set to be lower than the output power of the laser beam to be used for removing the residual resin. Accordingly, since a rise in surface temperature of the lead can be suppressed, the foreign matter (soot) which is adhered to (deposited over) the surface of the lead is prevented from being fixed there. In addition, the conditions of the laser beam to be used for removing the resin burr are, for example, that the value of electric current is 18 A, the scanning speed is 100 mm/s, the frequency is 50 kHz, and the output power is 12 to 15 W.

Moreover, instead of allowing the output power of the laser beam used when removing the resin burr 2h to be lower than the output power of the laser beam to be used for removing the residual resin 2g, a laser beam whose irradiation range (focus) is set to be wider than that of the laser for removing the residual resin 2g may be used. Thereby, the heat concentrated on one portion can be dispersed. As another means, the scanning speed may be faster than that of the laser beam to be used when removing the residual resin 2g. However, in the case of such means, part of the laser beam 31 may be irradiated to the sealing body (chip sealing resin) 2e. Therefore, the means to change the output power is preferred.

In the above embodiment, the description has been given of the QFP type semiconductor device in which the leads are exposed (projected) from respective sides (four sides) of the sealing body whose plane shape is quadrangular. However, it may be applied to an SOP (Small Outline Package) type semiconductor device in which leads are exposed (projected) from two sides of the sealing body, to a QFN (Quad Flat Non-Leaded Package) type semiconductor device in which leads are exposed (projected) from a lower (rear surface, mounting surface) and a side surface of the sealing body, and to an SON (Small Outline Non-Leaded Package) type semiconductor device.

Further, the method for manufacturing the QFN (or SON) type semiconductor device differs from that of the QFP type semiconductor device in the following points.

Figure 45:
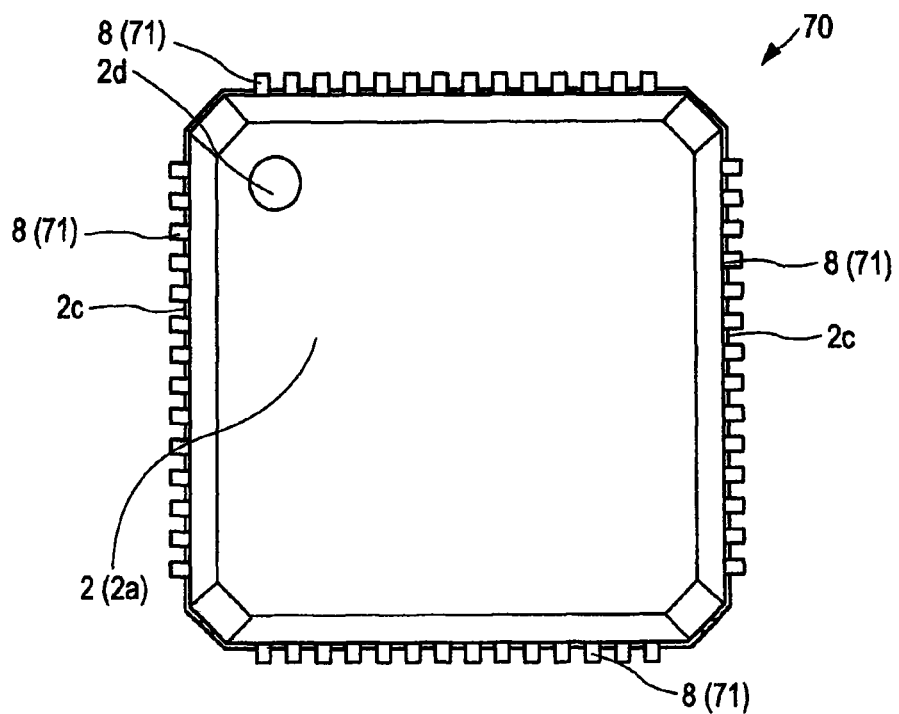
FIG. 45 is a top view of a semiconductor device which is a modification of the present embodiment.
Figure 46:
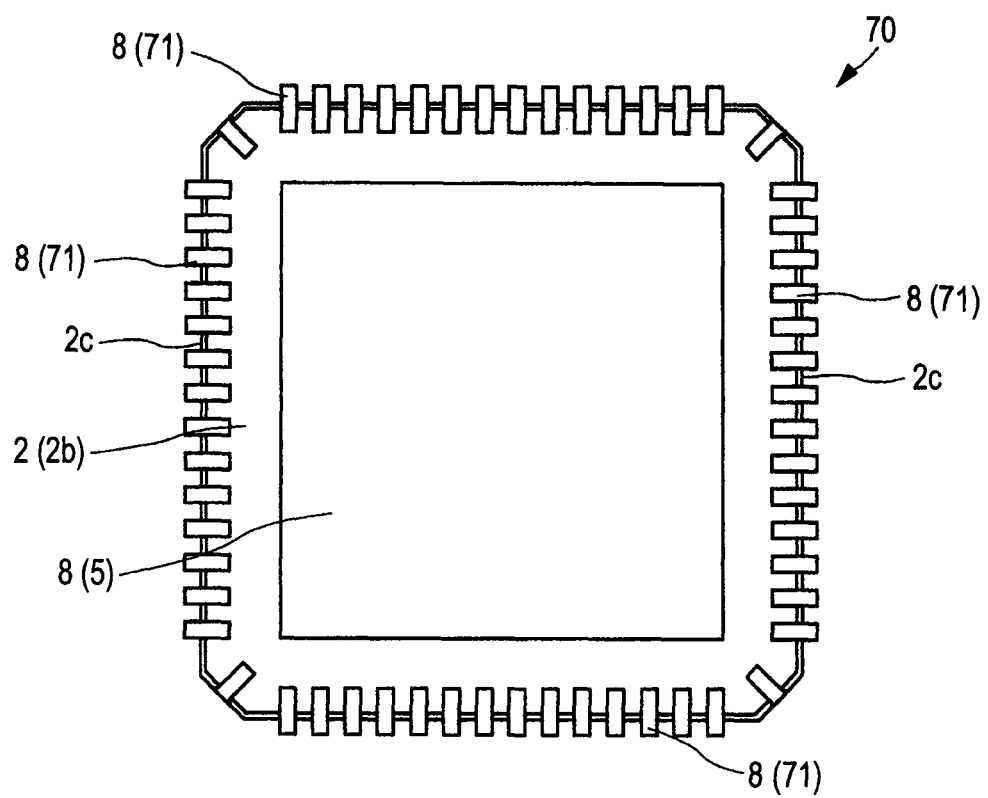
FIG. 46 is a bottom view of the semiconductor device shown in FIG. 45.
Figure 47:
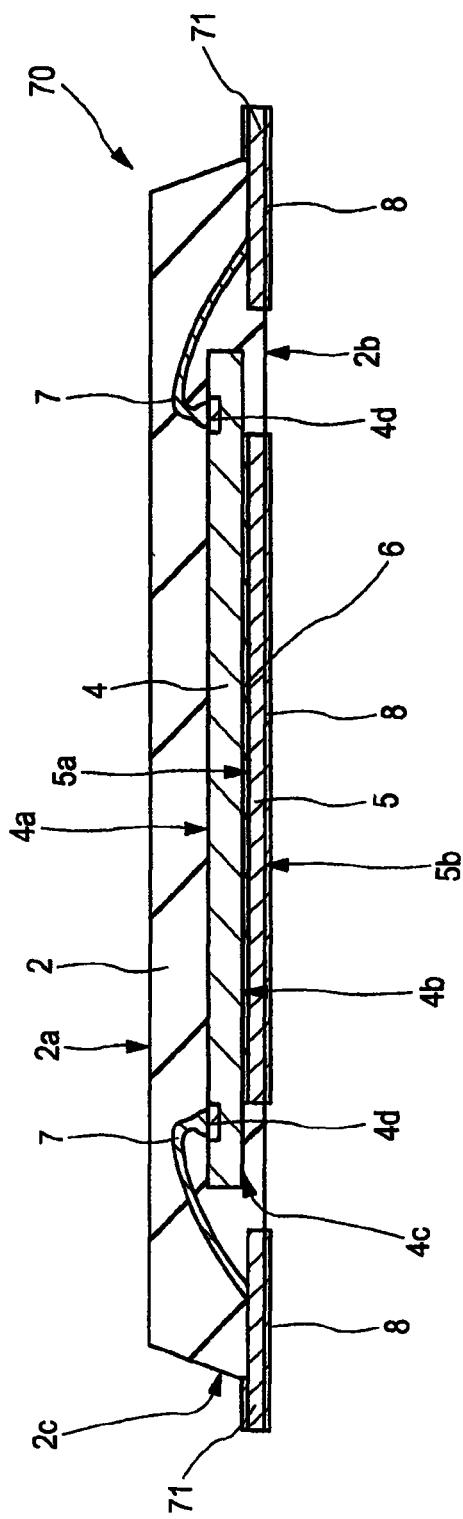
FIG. 47 is a cross-sectional view of the semiconductor device shown in FIGS. 45 and 46.

The semiconductor device (QFN) 70 shown in FIGS. 45 to 47 differs from the semiconductor devices (QFP) 1 shown in FIGS. 1 and 2 in the points below. First, a plurality of leads 71, of the semiconductor device 70, being external terminals are exposed from the lower surface 2b of the sealing body 2. Moreover, the leads 71 are also exposed from the side surface 2c of the sealing body 2. However, as compared with the lead 3, the length of the lead extending from the side surface 2c of the sealing body 2 is shorter. Moreover, the lower surface 5b of the chip mounting part 5 of the semiconductor device 70 is exposed from the lower surface 2b of the sealing body 2. Further, the plating film 8 is formed over a surface exposed from the lead 71 and the sealing body 2 of the chip mounting part 5.

There are differences in configuration as described above between the semiconductor device 70 being QFN and the semiconductor device 1 being QFP. There are also the following differences in terms of manufacturing methods thereof.

Figure 48:
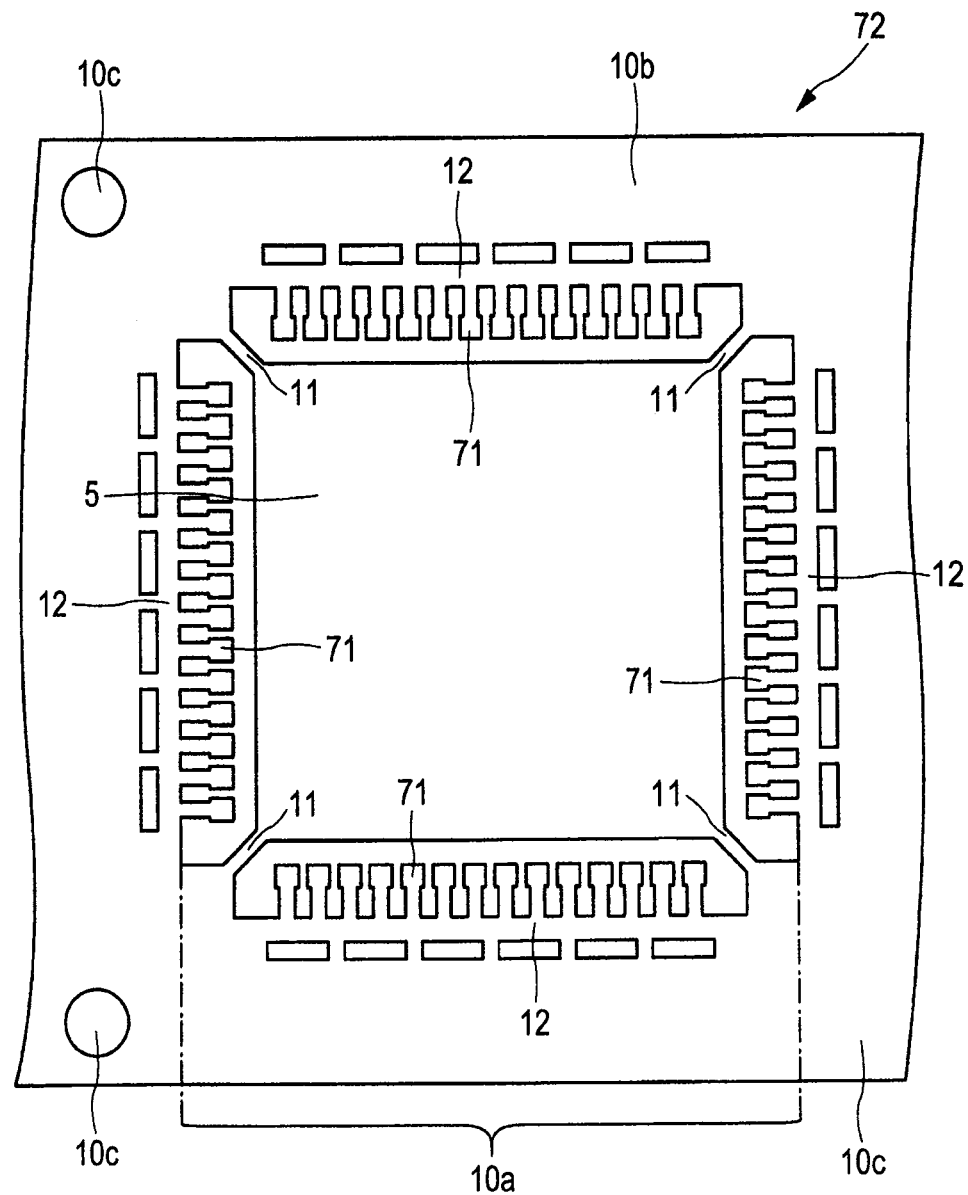
FIG. 48 is a plan view of a lead frame to be used for manufacturing the semiconductor device shown in FIGS. 45 to 47.

First, in the step of preparing lead frames, shapes of the lead frames to be prepared differ. As shown in FIG. 48, concerning a lead frame 72 to be used when manufacturing the semiconductor device 70, an outer lead is not formed outside the dam bar 12. For this reason, the device region 10a of the lead frame 72 can be defined as a region surrounded by the dam bars 12.

Moreover, in the mold step explained in the above embodiment, the lead frame 10 is clamped with the upper mold 21 and the lower mold 22 in which cavities 21b and 22b are formed, respectively. Further, resins for sealing are supplied to the upper and lower surface sides of the lead frame 10. However, in the mold step when manufacturing the semiconductor device 70, the lead frame 72 is clamped by a metal mold comprising an upper mold (metal mold) in which a cavity is formed and a lower mold (metal mold) in which a cavity is not formed. However, the die bonding step and the wire bonding step are performed before the mold step as in the embodiment described above. Also, the resin for sealing is supplied to the cavity of the upper mold to seal the upper surface side of the lead frame 72.

Figure 49:
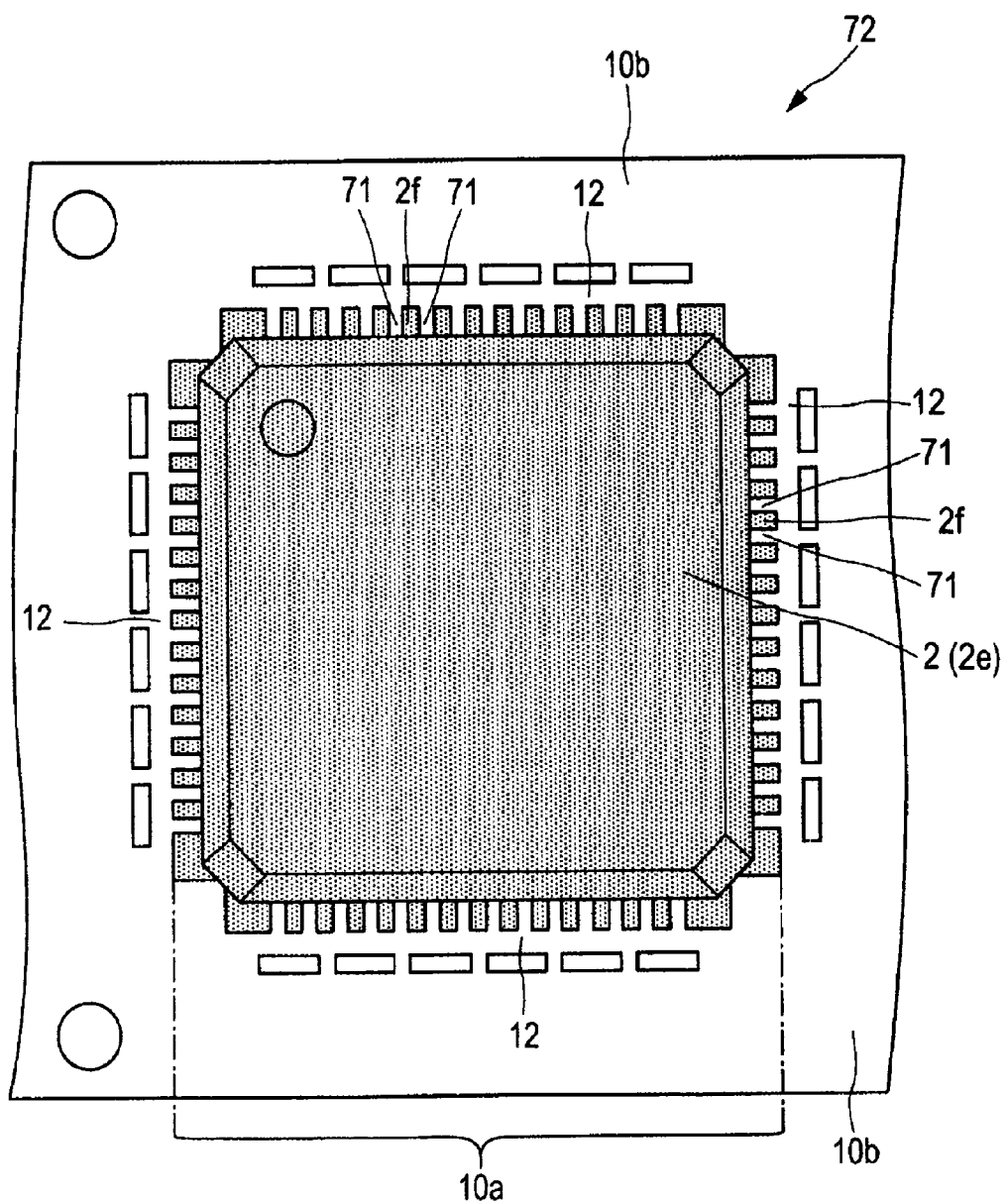
FIG. 49 is a plan view showing a state where a sealing body is formed over the lead frame shown in FIG. 48.

In this way, according to the manufacturing method of the semiconductor device 70, the upper surface side of the lead frame 72 is sealed. However, even in this case, as in the above embodiment, the sealing body (resin in the dam, resin between the leads) 2f is formed. To be specific, as shown in FIG. 49, the sealing body (resin in the dam, resin between the leads) 2f is also formed in a region (resin accumulation region) surrounded by the sealing body (chip sealing resin) 2e for sealing the semiconductor chip 4, part (portion to be clamped by the metal mold) of each of the leads 71, and the dam bar 12. Therefore, as in the embodiment described above, the foreign matter adhered to the surface of the lead 71 can be reliably removed by applying the laser irradiation step and the washing step.

In addition, concerning the lead frame 72, as described above, the outer lead is not formed on the outside of the dam bar 12. Therefore, the dam bar cutting step described in the above embodiment can be omitted.

However, as described in the above embodiment, after the dam bar cutting step S6, by removing the sealing body (resin in the dam) 2f formed in the resin accumulation region, most of the sealing body (resin in the dam) 2f formed in the resin accumulation region can be removed. Because of this, the sealing body (resin in the dam) 2f formed in the resin accumulation region can be removed in a short time.

Moreover, by performing the laser irradiation step in a state where there is little amount (volume) of residual resin to be removed, the amount of foreign matter (soot) to be generated during the laser irradiation step can also be reduced.

Moreover, by performing the dam bar cutting step, the central part, in a plan view, of the sealing body (resin in the dam) 2f can be removed. For this reason, as shown in FIG. 25 according to the above embodiment, the laser beam 31 can be irradiated to a surface of the residual resin 2g (over the side surface of the lead 71) so as to have a predetermined angle.

From these aspects, also in the manufacturing method of the semiconductor device 70, it is preferable to perform the dam bar cutting step.

Moreover, according to the manufacturing method of the semiconductor device 70, in the lead forming step explained in the above embodiment, the bending step and the lead-tip cutting step can be omitted.

The present invention can be applied to a semiconductor device in which a lead being an external terminal is exposed from a sealing body for sealing a semiconductor chip.

What is claimed is:

1. A method of manufacturing a semiconductor device, comprising the steps of:
    (a) providing a semiconductor package including a first sealing body for sealing a semiconductor chip, a plurality of leads exposed from the first sealing body, a dam bar formed integrally with the leads, and a second sealing body formed in a region surrounded by the first sealing body, the leads, and the dam bar;
    (b) removing part of the dam bar and part of the second sealing body with a mechanical cutter;
    (c) after the step (b), irradiating the other part of the second sealing body with a laser beam to remove the other part of the second sealing body;
    (d) after the step (c), washing a surface of each of the leads; and
    (e) after the step (d), forming a plating film on the surface of each of the leads.

2. The method of manufacturing a semiconductor device according to claim 1,
    wherein, over each surface of the leads of the semiconductor package prepared in the step (a), a third sealing body is formed whose volume is smaller than each volume of the first sealing body and the second sealing body; and
    wherein, before the step (d), the third sealing body is irradiated with a laser beam having an output value set to be lower than that of the laser beam used in the step (c) to remove the third sealing body.

3. The method of manufacturing a semiconductor device according to claim 1,
    wherein the amount of the part of the second sealing body to be removed in the step (b) is greater than the amount of the other part of the second sealing body to be removed in the step (c).

4. The method of manufacturing a semiconductor device according to claim 3,
    wherein a width of the mechanical cutter to be used in the step (b) is smaller than a distance between the leads.

5. The method of manufacturing a semiconductor device according to claim 4,
    wherein washing water whose water pressure is set to 50 to 150 kgf/cm$^2$ is injected to the surface of the leads in the step (d).

6. The method of manufacturing a semiconductor device according to claim 5,
    wherein the laser beam is irradiated at a first angle with respect to the surface of the second sealing body in the step (c).

7. The method of manufacturing a semiconductor device according to claim 6,
    wherein each surface of the leads has an upper surface, a lower surface on the opposite side of the upper surface, and a side surface between the upper surface and the lower surface; and
    wherein the degree of flatness of the side surface is smaller than that of the upper surface or the lower surface.

8. The method of manufacturing a semiconductor device according to claim 7,
    wherein the step (c) is performed while the side surface of each of the leads is being inclined with respect to an irradiation direction of the laser beam.

9. The method of manufacturing a semiconductor device according to claim 6,
    wherein the laser beam is irradiated through a condensing lens in the step (c).

10. The method of manufacturing a semiconductor device according to claim 1,
    wherein a width of the mechanical cutter used in the step (b) is smaller than a distance between adjacent leads of the leads;
    wherein a projection is formed over each surface of the leads in the step (b); and
    wherein the other part of the second sealing body is formed in a region surrounded by the first sealing body, the leads, and the projection.

11. The method of manufacturing a semiconductor device according to claim 10,
    wherein after the step (e), bending each of the leads; and
    wherein each of the leads is bent with the projection as a bending point.

12. A method of manufacturing a semiconductor device, comprising the steps of:
    (a) providing a lead frame including a die pad, a plurality of suspending leads formed integrally with the die pad, a plurality of inner leads arranged between the suspending leads and arranged around the die pad, a dam bar formed integrally with each of the inner leads, a plurality of outer leads formed integrally with the dam bars and formed at positions further from the inner leads than the dam bars, and a frame body formed integrally with each of the outer leads;
    (b) mounting a semiconductor chip including a main surface, a plurality of electrode pads formed over the main surface, and a rear surface opposed to the main surface on the die pad via a die bonding material;
    (c) electrically coupling the electrode pads of the semiconductor chip with the inner leads via a plurality of conductive members, respectively,
    (d) sealing, with resin, the semiconductor chip, the conductive members, and each of other parts of the inner leads in a state where part of each of the inner leads, the dam bar, and part of each of the outer leads are clamped by first and second metal molds such that a first metal mold surface of a first metal mold comes into contact with an upper surface of the lead frame and a second metal mold surface of a second metal mold comes into contact with a lower surface of the lead frame, and forming a first sealing body sealing the semiconductor chip, the conductive members, and the other part of each of the inner leads and a second sealing body sealing a region surrounded by the first sealing body, the part of each of the inner leads, and the dam bar;
    (e) removing part of the dam bar and part of the second sealing body with a mechanical cutter;
    (f) after the step (e), irradiating the other part of the second sealing body with a laser beam to remove the other part of the second sealing body;
    (g) after the step (f), washing a portion of the lead frame exposed from the first sealing body;
    (h) after the step (g), forming a plating film on a portion of the lead frame exposed from the first sealing body; and
    wherein a width of the mechanical cutter used in the step (e) is smaller than a distance between adjacent outer leads of the outer leads;
    wherein a projection is formed in the step (e); and wherein the other part of the second sealing body is formed in a region surrounded by the first sealing body, the part of each of the inner leads, and the projection.

13. The method of manufacturing a semiconductor device according to claim 12,
wherein the amount of the part of the second sealing body to be removed in the step (b) is greater the amount of the other part of the second sealing body to be removed in the step (c).

14. The method of manufacturing a semiconductor device according to claim 13,
wherein a width of the mechanical cutter in the step (e) is smaller than a distance between the leads.

15. The method of manufacturing a semiconductor device according to claim 14,
wherein each of the leads is bent with the projection as a bending point in the step (d).

16. The method of manufacturing a semiconductor device according to claim 15,
wherein washing water whose water pressure is set to 50 to 150 kgf/cm$^2$ is injected to the surface of the leads in the step (d).

17. The method of manufacturing a semiconductor device according to claim 16,
wherein the laser beam is irradiated at a first angle with respect to the surface of the second sealing body in the step (c).

18. The method of manufacturing a semiconductor device according to claim 17,
wherein each surface of the leads has an upper surface, a lower surface on the opposite side of the upper surface, and a side surface between the upper surface and the lower surface; and
wherein the degree of flatness of the side surface is smaller than that of the upper surface or the lower surface.

19. The method of manufacturing a semiconductor device according to claim 18,
wherein the step (c) is performed while the side surface of each of the leads is being inclined with respect to an irradiation direction of the laser beam.

20. The method of manufacturing a semiconductor device according to claim 17,
wherein the laser beam is irradiated through a condensing lens in the step (c).

\* \* \* \* \*